US008730111B2

(12) United States Patent
Sakata et al.

(10) Patent No.: US 8,730,111 B2
(45) Date of Patent: May 20, 2014

(54) ANTENNA EVALUATION APPARATUS FOR EVALUATING MULTIPLE WAVE OF RADIO WAVES TRANSMITTED FROM SCATTERER ANTENNAS WITH FUNCTION OF CALIBRATION FOR THE SAME APPARATUS

(75) Inventors: Tsutomu Sakata, Osaka (JP); Atsushi Yamamoto, Kyoto (JP); Satoru Amari, Osaka (JP)

(73) Assignee: Panasonic Corporation, Osaka (JP)

( * ) Notice: Subject to any disclaimer, the term of this patent is extended or adjusted under 35 U.S.C. 154(b) by 566 days.

(21) Appl. No.: 13/055,557

(22) PCT Filed: Mar. 29, 2010

(86) PCT No.: PCT/JP2010/002244
§ 371 (c)(1),
(2), (4) Date: Jan. 24, 2011

(87) PCT Pub. No.: WO2010/131409
PCT Pub. Date: Nov. 18, 2010

(65) Prior Publication Data
US 2011/0134001 A1 Jun. 9, 2011

(30) Foreign Application Priority Data
May 11, 2009 (JP) ................................. 2009-114263

(51) Int. Cl.
*G01R 29/10* (2006.01)
(52) U.S. Cl.
USPC ......................................................... 343/703
(58) Field of Classification Search
USPC .......................................................... 343/703
See application file for complete search history.

(56) References Cited

U.S. PATENT DOCUMENTS

2006/0028388 A1* 2/2006 Schantz ......................... 343/770
2008/0272968 A1* 11/2008 Muller .......................... 343/703

FOREIGN PATENT DOCUMENTS

| JP | 2-261233 | 10/1990 | |
|----|----------|---------|---|
| JP | 6-222124 | 8/1994 | |
| JP | 10-22889 | 1/1998 | |
| JP | 2003-255002 | 9/2003 | |
| JP | 2005-227213 | 8/2005 | |
| JP | 2005227213 A * | 8/2005 | ............ G01R 29/10 |
| JP | 2005-257298 | 9/2005 | |
| JP | 3816499 | 6/2006 | |

OTHER PUBLICATIONS

International Preliminary Report on Patentability issued Dec. 22, 2011 in International (PCT) Application No. PCT/JP2010/002244.

(Continued)

*Primary Examiner* — Dameon Levi
*Assistant Examiner* — Collin Dawkins
(74) *Attorney, Agent, or Firm* — Wenderoth, Lind & Ponack, L.L.P.

(57) ABSTRACT

A computer measures amplitudes and phases respective received signals $S60a$ relative to a transmitting signal when radio waves are radiated solely from each of the scatterer antennas and received by using a calibration receiving antenna, determines a target amplitude based on measured amplitudes, and determines a target phase based on measured phases. Reference attenuation amount control voltages for respective attenuators are set to attenuation amount control voltages for making the measured amplitudes coincidence with an identical target amplitude, and a reference phase shift amount control voltage for each phase shifter is set to phase shift amount control voltages for making the measured phases coincidence with an identical target phase.

24 Claims, 30 Drawing Sheets

(56) References Cited

OTHER PUBLICATIONS

International Search Report issued Jun. 29, 2010 in International (PCT) Application No. PCT/JP2010/002244.
Tsutomu Sakata, et al., "Evaluation of Mobile Terminal Antennas Using Spatial Fading Emulator", Matsushita Technical Journal, vol. 52, No. 5, pp. 70-75, Oct. 2006 (along with English Abstract).
Tsutomu Sakata et al., "Channel Capacity Measurements of a MIMO Antenna under a Rayleigh-fading Channel by a Spatial Fading Emulator", Proceedings of the Institute of Electronics, Information and Communication Engineers 2007 Society Conference, B-1-9, Sep. 2007 (along with partial English translation).
Tsutomu Sakata et al., "A Multipath Measurement System with a Variable Power Angular Spectrum for Handset MIMO Antennas", Technical Report of the Institute of Electronics, Information and Communication Engineers, vol. 108, No. 5, pp. 13-18, Apr. 2008 (along with English Abstract).
Tsutomu Sakata et al., "An Evaluation of the MIMO Transmission Characteristics in a Cluster Propagation Environment Using a Spatial Fading Emulator", Technical Report of the Institute of Electronics, Information and Communication Engineers, vol. 108, No. 429, pp. 121-126, Apr. 2009 (along with English Abstract).

* cited by examiner

Fig.4

CALIBRATION TABLE

| SCATTERER ANTENNA | 50a−1 | 50a−2 | 50a−3 | 50a−4 | 50a−5 |
|---|---|---|---|---|---|
| MEASURED AMPLITUDE (dB) | −10 | −12 | −11 | −9 | −11 |
| MEASURED PHASE (DEGREE) | 10 | 20 | 14 | 15 | 5 |

DIRECTIONAL PATTERN OF RECEIVING ANTENNA 60a1

ANTENNA EVALUATION APPARATUS FOR EVALUATING MULTIPLE WAVE OF RADIO WAVES TRANSMITTED FROM SCATTERER ANTENNAS WITH FUNCTION OF CALIBRATION FOR THE SAME APPARATUS

TECHNICAL FIELD

The present invention relates to an antenna evaluation apparatus for evaluating a performance of an antenna of a wireless communication apparatus, and to an antenna evaluation method using the antenna evaluation apparatus.

BACKGROUND ART

Conventionally, there has been proposed an antenna evaluation apparatus which has a plurality of transmitting antennas (referred to as scatterer antennas hereinafter) for modeling scatterers. The transmitting antennas are provided on the circumference of a circle at equal spaces, where the circle has a predetermined radius, and the antenna evaluation apparatus generates a spatial multiple wave in the vicinity of the center of installation positions of the scatterer antennas (See Patent Document 1 and the Non-Patent Documents 1 to 4, for example). In such an antenna evaluation apparatus, a transmitting signal generated by a signal generator is divided into transmitting signals of the same number as that of the scatterer antennas, and is further divided transmitting signals are radiated from corresponding scatterer antennas via respective phase shifters and attenuators. In this case, by adjusting phase shift amounts for the respective phase shifters and the attenuation amounts for the respective attenuators, a desired fading environment such as a Rayleigh fading environment can be generated at the center of the installation positions the respective scatterer antennas. Therefore, by placing a receiving antenna to be evaluated at the center of the installation position of the respective scatterer antennas, the performance of the receiving antenna under the fading environment can be evaluated based on a received signal received by the receiving antenna.

CITATION LIST

Patent Document

Patent Document 1: Japanese patent laid-open publication No. JP-2005-227213 A.
Patent Document 2: Japanese patent No. 3816499.

Non-Patent Document

Non-Patent Document 1: Tsutomu Sakata, et al., "Evaluation of Mobile Terminal Antennas Using Spatial Fading Emulator", Matsushita Technical Journal, Vol. 52, No. 5, pp. 70-75, October, 2006.
Non-Patent Document 2: Tsutomu Sakata, et al., "Channel Capacity Measurements of a MIMO Antenna under a Rayleigh-fading Channel by a Spatial Fading Emulator", Proceedings of the Institute of Electronics, Information and Communication Engineers 2007 Society Conference, B-1-9, September, 2007.
Non-Patent Document 3: Tsutomu Sakata et al., "A Multipath Measurement System with a Variable Power Angular Spectrum for Handset MIMO Antennas", Technical Report of the Institute of Electronics, Information and Communication Engineers, Vol. 108, No. 5, pp. 13-18, April, 2008.
Non-Patent Document 4: Tsutomu Sakata et al., "An Evaluation of the MIMO Transmission Characteristics in a Cluster Propagation Environment Using a Spatial Fading Emulator", Technical Report of the Institute of Electronics, Information and Communication Engineers, Vol. 108, No. 429, pp. 121-126, April, 2009.

SUMMARY OF INVENTION

Technical Problem

FIG. 32 is a block diagram for explaining a near field calibration method according to a prior art. Referring to FIG. 32, a signal source 901 generates a transmitting signal, and transmits the same signal from a transmitting antenna 902 toward a receiving antenna 903. A receiver 904 receives a transmitted transmitting signal by using the receiving antenna 903. During calibration by the near field calibration method, a measurement apparatus 907 for calibration measures the electromagnetic field in the vicinity of the transmitting antenna 902 by using a probe 905, which is a calibration element placed in proximity to the transmitting antenna 902, and calculates a radiation power from the transmitting antenna 902. The signal source 901 is adjusted to radiate radio waves of a predetermined radiation power based on a calculated radiation power.

There have been the following problems when the near field calibration method according to the prior art is applied to the antenna evaluation apparatus described above. In the antenna evaluation apparatus described above, the phases and the amplitudes of the respective divided transmitting signals are changed so as to generate a predetermined multiple wave propagation state in the vicinity of the center of the installation positions of the scatterer antennas. Therefore, in order to generate a fading environment with higher accuracy, it is required to preliminarily execute calibration of the amplitude and the phase of the received signal in the whole system from the signal source for generating the transmitting signal to the receiver to which the receiving antenna is connected. However, only the radiation power from each of the scatterer antennas can be calibrated when the near field calibration method is used, and it has been required to separately execute calibration on the receiver side. Further, it is required to successively place the probe 905 in the vicinity of the plurality of scatterer antennas or to place probes 905 as many as the scatterer antennas in the vicinities of the scatterer antennas, respectively, and this leads to comparatively long time or many probes for the calibration. Further, it is required to accurately control the phases of the respective divided transmitting signals so that the predetermined multiple wave propagation state is generated in the vicinity of the center of the installation positions of the scatterer antennas in the antenna evaluation apparatus described above. However, since the near field calibration method according to the prior art uses only the power of the radio waves received by the probe 905, it has been impossible to calibrate the respective phases of the radio waves radiated from the scatterer antennas.

It is an object of the present invention is to provide an antenna evaluation apparatus and an antenna evaluation method using the antenna evaluation apparatus, each capable of solving the above-described problems and capable of improving the antenna evaluation accuracy by executing calibration more easily with accuracy higher than that of the prior art.

Solution to Problem

An antenna evaluation apparatus according to the first invention includes a scatterer antenna group, signal generator means, transmitter means, receiver means, and controller means. The scatterer antenna group includes a plurality of N scatterer antennas provided at predetermined positions different from each other, respectively. The signal generator means generated a predetermined transmitting signal. The transmitter means divides the transmitting signal into a plurality of N transmitting signals, changing a phase and an amplitude of each of divided transmitting signals by a predetermined amplitude change amount and a predetermined phase shift amount, respectively, and radiates changed transmitting signals as radio waves from the scatterer antennas corresponding to the changed transmitting signals, respectively. The receiver means for receives a multiple wave of radiated radio waves as a received signal by using a receiving antenna under evaluation and placed substantially at a center of the respective positions, and measures an amplitude and a phase of the received signal relative to the transmitting signal. The controller means evaluates a performance of the receiving antenna under evaluation based on measured amplitude and measured phase of the received signal. The controller means controls the transmitter means to radiate the radio waves solely from the respective scatterer antennas. Based on the radio waves radiated solely from the respective scatterer antennas, the controller means controls executes calibration to control the transmitter means so that the amplitudes of the received signals each measured by using a calibration receiving antenna instead of the receiving antenna under evaluation coincides with an identical target amplitude and the phases of the received signals each measured coincides with an identical target phase, and stores amplitude change amounts and phase shift amounts for use in the transmitter means for the respective scatterer antennas into a storage unit. Based on inputted amplitude difference values from the target amplitude and inputted phase difference values from the target phase, the controller means controls calculates amplitude change amounts and phase shift amounts for the respective scatterer antennas that are to be set in the transmitter means, by adding the amplitude difference values and the phase difference values to stored amplitude change amounts and stored phase shift amounts for use in the transmitter means for the respective scatterer antennas, the inputted amplitude difference values and the inputted phase difference values corresponding to amplitudes and phases of the transmitting signals from the respective scatterer antennas for achieving a predetermined multiple wave propagation state. The controller means controls sets calculated amplitude change amounts and calculated phase shift amounts for the respective scatterer antennas in the transmitter means. The controller means evaluates the performance of the receiving antenna under evaluation by receiving and measuring the amplitude and the phase of the received signal by the receiver means by using the receiving antenna under evaluation, when the transmitting signals are simultaneously transmitted from the scatterer antennas.

The above-described antenna evaluation apparatus includes the controller means for evaluating a performance of first and second receiving antennas under evaluation, using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration, the first receiving antenna under evaluation being provided instead of the first calibration receiving antenna during evaluation, the second receiving antenna under evaluation being provided instead of the second calibration receiving antenna during the evaluation. The antenna evaluation apparatus further includes amplitude adjusting, amplitude and phase adjustment means, and further receiver means. The amplitude adjustment means is inserted between one of the first receiving antenna under evaluation and the first calibration receiving antenna, and the receiver means, and the amplitude adjustment means changes the amplitude of the received signal and outputting a resulting signal to the receiver means. The amplitude and phase adjustment means receives a further received signal by using one of the second receiving antenna under evaluation and the second calibration receiving antenna, changes an amplitude and a phase of the further received signal, and outputs a resulting signal. The further receiver means receives the further received signal from the amplitude and phase adjustment means, and measures the amplitude and the phase of the further received signal relative to the transmitting signal. The controller means controls the transmitter means to radiate the radio waves solely from the respective scatterer antennas. Based on the radio waves radiated solely from the respective scatterer antennas, the controller means controls the receiver means and the further receiver means to measure the amplitudes of the received signals each measured by using the first calibration receiving antenna and an amplitude average value of the amplitudes of the further received signals each measured by using the second calibration receiving antenna, respectively. The controller means controls the amplitude adjustment means and the amplitude and phase adjustment means so that the amplitudes of the received signals each measured by using the first calibration receiving antenna and the amplitude average value of the further received signals each measured by using the second calibration receiving antenna coincide with each other. Thereafter, the controller means controls the receiver means and the further receiver means to measure the phases of the received signals each measured by using the first calibration receiving antenna and a phase average value of the phases of the further received signals each measured by using the second calibration receiving antenna, respectively. The controller means controls the amplitude and phase adjustment means so that the phases of the received signals each measured by using the first calibration receiving antenna and the phase average value of the phases of the further received signals each measured by using the second calibration receiving antenna coincide with each other.

In addition, in the above-described antenna evaluation apparatus, the calibration receiving antenna has a omni-directional directional pattern.

Further, the above-described antenna evaluation apparatus further includes a rotating table on which the calibration receiving antenna is placed, and the controller means rotates the rotating table so as to direct a main beam of the calibration receiving antenna substantially toward each of the scatterer antennas when the controller means receives the radio waves radiated solely from the respective scatterer antennas by using the calibration receiving antenna.

Still further, the above-described antenna evaluation apparatus further includes a rotating table on which the calibration receiving antenna is placed, and the controller means rotates the rotating table so that an cross-polarization discrimination of the calibration receiving antenna becomes maximum when the controller means receives the radio waves radiated solely from the respective scatterer antennas by using the calibration receiving antenna.

In addition, the above-described antenna evaluation apparatus further includes a rotating table on which the calibration receiving antenna is placed. When the controller means receives the radio waves radiated solely from the respective scatterer antennas by using the calibration receiving antenna, the controller means rotates the calibration receiving antenna by one turn by repetitively rotating the rotating table by a predetermined angle, measures an amplitude average value and a phase average value of received signals for the respective angles, and uses the amplitude average value and the phase average value as the measured amplitude and the measured phase.

Further, the above-described antenna evaluation apparatus includes the two scatterer antenna groups each radiating vertically polarized radio waves and horizontally polarized radio waves, and the two transmitter means each provided for the corresponding scatterer antenna group. Instead of the calibration receiving antenna, the controller means executes the calibration for each of the transmitter means by using a calibration receiving antenna for receiving the vertically polarized radio waves and a calibration receiving antenna for receiving the horizontally polarized radio waves.

Still further, the above-described antenna evaluation apparatus further includes switch means for selectively connecting one of the calibration receiving antenna for receiving the vertically polarized radio waves and the calibration receiving antenna for receiving the horizontally polarized radio waves to the receiver means.

In addition, in the above-described antenna evaluation apparatus, the receiver means uses a calibration receiving antenna for receiving the radio waves of the vertically polarized waves and horizontally polarized waves, instead of the calibration receiving antenna for receiving the vertically polarized radio waves and the calibration receiving antenna for receiving the horizontally polarized radio waves.

Further, the above-described antenna evaluation apparatus further includes delay means for delaying the transmitting signal generated by the signal generator means by a predetermined delay time, and the controller means sets the delay time to a predetermined value when the controller means executes the calibration.

Still further, the above-described antenna evaluation apparatus further includes fading means for adding a predetermined delay time and a phase adjustment amount to the transmitting signal generated by the signal generator means by using a plurality of predetermined parameters, and the controller means sets the parameters to predetermined values, respectively, when the controller means executes the calibration.

An antenna evaluation method according to the second invention uses an antenna evaluation apparatus, and the antenna evaluation apparatus includes a scatterer antenna group, signal generator means, transmitter means, receiver means, and controller means. The scatterer antenna group includes a plurality of N scatterer antennas provided at predetermined positions different from each other, respectively. The signal generator means generated a predetermined transmitting signal. The transmitter means divides the transmitting signal into a plurality of N transmitting signals, changes a phase and an amplitude of each of divided transmitting signals by a predetermined amplitude change amount and a predetermined phase shift amount, respectively, and radiates changed transmitting signals as radio waves from the scatterer antennas corresponding to the changed transmitting signals, respectively. The receiver means receives a multiple wave of radiated radio waves as a received signal by using a receiving antenna under evaluation and placed substantially at a center of the respective positions, and measures an amplitude and a phase of the received signal relative to the transmitting signal. The controller means evaluates a performance of the receiving antenna under evaluation based on measured amplitude and measured phase of the received signal. The antenna evaluation method includes a control step which is executed by the controller means, the control step including the following steps. A step of controlling the transmitter means to radiate the radio waves solely from the respective scatterer antennas. A step of, based on the radio waves radiated solely from the respective scatterer antennas, executing calibration to control the transmitter means so that the amplitudes of the received signals each measured by using a calibration receiving antenna instead of the receiving antenna under evaluation coincides with an identical target amplitude and the phases of the received signals each measured coincides with an identical target phase, and storing amplitude change amounts and phase shift amounts for use in the transmitter means for the respective scatterer antennas into a storage unit. A step of, based on inputted amplitude difference values from the target amplitude and inputted phase difference values from the target phase, calculating amplitude change amounts and phase shift amounts for the respective scatterer antennas that are to be set in the transmitter means, by adding the amplitude difference values and the phase difference values to stored amplitude change amounts and stored phase shift amounts for use in the transmitter means for the respective scatterer antennas, the inputted amplitude difference values and the inputted phase difference values corresponding to amplitudes and phases of the transmitting signals from the respective scatterer antennas for achieving a predetermined multiple wave propagation state. A step of setting calculated amplitude change amounts and calculated phase shift amounts for the respective scatterer antennas in the transmitter means. A step of evaluating the performance of the receiving antenna under evaluation by receiving and measuring the amplitude and the phase of the received signal by the receiver means by using the receiving antenna under evaluation, when the transmitting signals are simultaneously transmitted from the scatterer antennas.

In the above-described antenna evaluation method, the control step further includes a step of evaluating a performance of first and second receiving antennas under evaluation, using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration, the first receiving antenna under evaluation being provided instead of the first calibration receiving antenna during evaluation, the second receiving antenna under evaluation being provided instead of the second calibration receiving antenna during the evaluation. The antenna evaluation apparatus further includes amplitude adjustment means, amplitude and phase adjustment means, and further receiver means. The amplitude adjustment means is inserted between one of the first receiving antenna under evaluation and the first calibration receiving antenna, and the receiver means, the amplitude adjustment means changes the amplitude of the received signal and outputting a resulting signal to the receiver means. The amplitude and phase adjustment means receives a further received signal by using one of the second receiving antenna under evaluation and the second calibration receiving antenna, changes an amplitude and a phase of the further received signal, and outputs a resulting signal. The further receiver means receives the further received signal from the amplitude and phase adjustment means, and measuring the amplitude and the phase of the further received signal relative to the transmitting signal. The control step further includes the following steps. A step of controlling the transmitter means to radiate the radio waves solely from the respective scatterer antennas. A step of, based on the radio waves radiated solely from the respective scatterer antennas, controlling the receiver means and the further receiver means to measure the amplitudes of the received signals each measured by using the first calibration receiving antenna and an amplitude average value of the amplitudes of the further received signals each measured by using the second calibration receiving antenna, respectively. A step of controlling the amplitude adjustment means and the amplitude and phase adjustment means so that the amplitudes of the received signals each measured by using the first calibration receiving antenna and the amplitude average value of the further received signals each measured by using the second calibration receiving antenna coincide with each other. A step of, thereafter, controlling the receiver means and the further receiver means to measure the phases of the received signals each measured by using the first calibration receiving antenna and a phase average value of the phases of the further received signals each measured by using the second calibration receiving antenna, respectively. A step of controlling the amplitude and phase adjustment means so that the phases of the received signals each measured by using the first calibration receiving antenna and the phase average value of the phases of the further received signals each measured by using the second calibration receiving antenna coincide with each other.

Further, in the above-described antenna evaluation method, the antenna evaluation apparatus includes the two scatterer antenna groups each radiating vertically polarized radio waves and horizontally polarized radio waves, and the two transmitter means each provided for the corresponding scatterer antenna group. The control step further includes a step of, instead of the calibration receiving antenna, the executing the calibration for each of the transmitter means by using a calibration receiving antenna for receiving the vertically polarized radio waves and a calibration receiving antenna for receiving the horizontally polarized radio waves.

Still further, in the above-described antenna evaluation method, the antenna evaluation apparatus further includes delay means for delaying the transmitting signal generated by the signal generator means by a predetermined delay time, and the control step includes a step of setting the delay time to a predetermined value when executing the calibration.

In addition, in the above-described antenna evaluation method, the antenna evaluation apparatus further includes fading means for adding a predetermined delay time and a phase adjustment amount to the transmitting signal generated by the signal generator means by using a plurality of predetermined parameters, and the control step further includes a step of setting the parameters to predetermined values when executing the calibration.

Advantageous Effects of Invention

According to the antenna evaluation apparatus and the antenna evaluation method of the present invention, the transmitter means is controlled to radiate the radio waves solely from the respective scatterer antennas. Then, based on the radio waves radiated solely from the respective scatterer antennas, calibration is executed to control the transmitter means so that the amplitudes of the received signals each measured by using a calibration receiving antenna instead of the receiving antenna under evaluation coincides with an identical target amplitude and the phases of the received signals each measured coincides with an identical target phase, and to store amplitude change amounts and phase shift amounts for use in the transmitter means for the respective scatterer antennas into a storage unit. Therefore, it is possible to remove the influences of the passing loss, which is caused in the entire path between the transmitter means and the receiver means, on the amplitude and the phase of the received signal, and it is possible to execute the calibration more easily with accuracy higher than that of the prior art. This leads to improved evaluation accuracy of the receiving antenna under evaluation.

BRIEF DESCRIPTION OF DRAWINGS

FIG. 4 is a table showing one example of a calibration table made at step S8 of FIG. 3;

DESCRIPTION OF EMBODIMENTS

Figure 1:
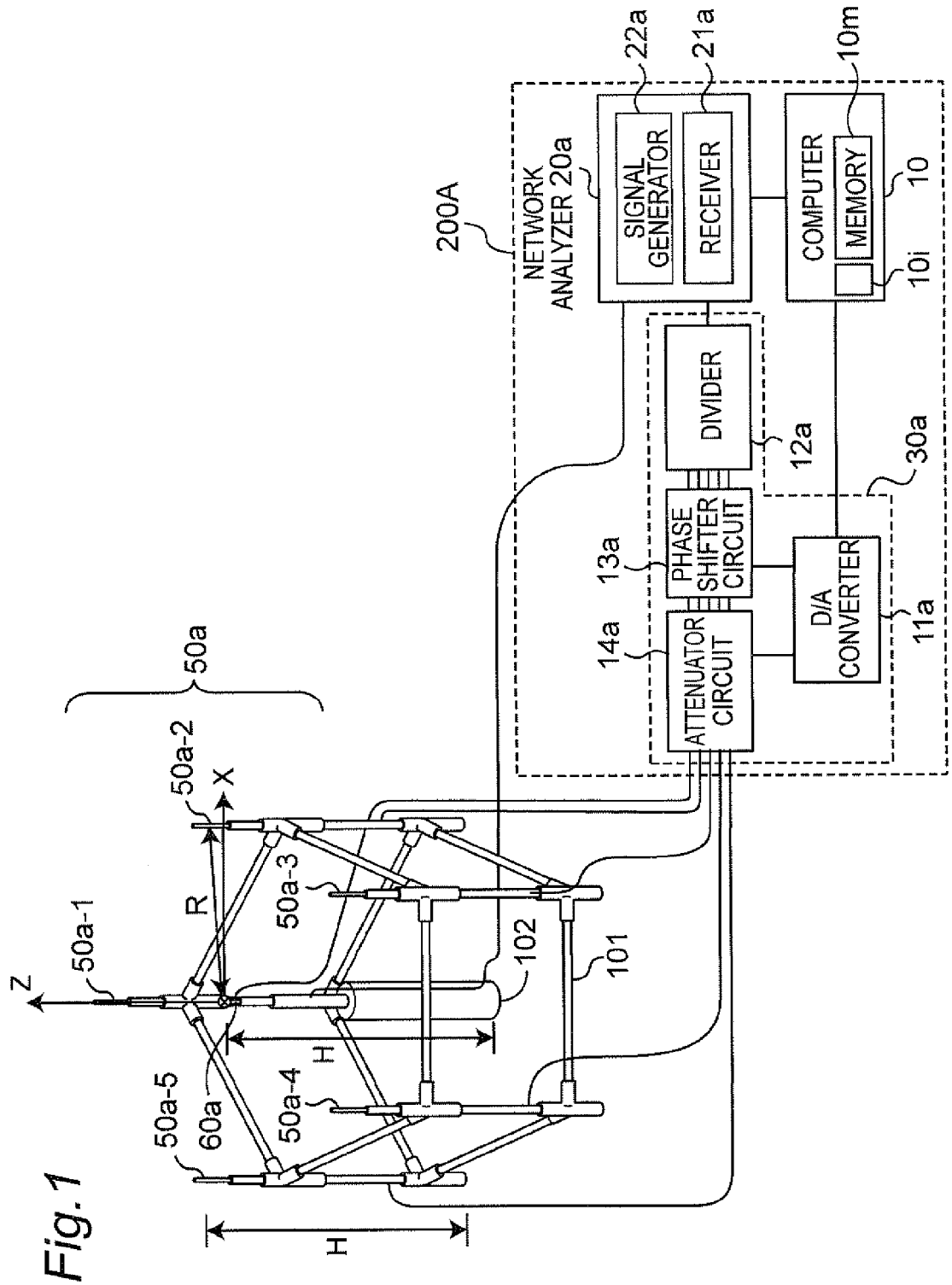
FIG. 1 is a perspective view showing an essential part of a configuration of an antenna evaluation apparatus according to a first preferred embodiment of the present invention.

Preferred embodiments according to the present invention will be described below with reference to the attached drawings. Components similar to each other are denoted by the same reference numerals and will not be described herein in detail.

First Preferred Embodiment

Figure 2:
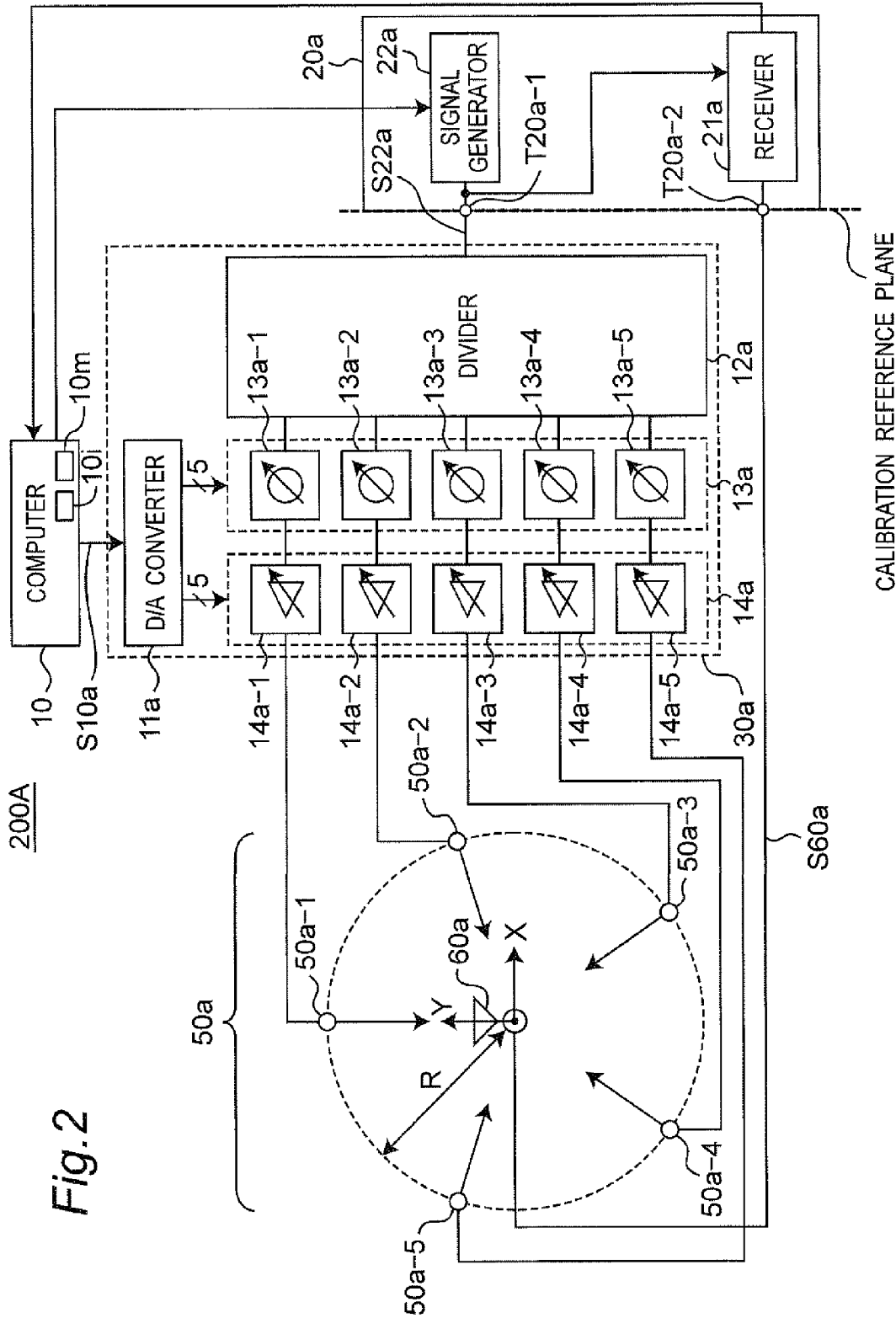
FIG. 2 is a block diagram showing a configuration of a multiple wave controlling and measuring apparatus 200A of FIG. 1.

FIG. 1 is a perspective view showing an essential part of a configuration of an antenna evaluation apparatus (also called a spatial multiple wave generating apparatus or a fading emulator) according to the first preferred embodiment of the present invention, and FIG. 2 is a block diagram showing a configuration of a multiple wave controlling and measuring apparatus 200A of FIG. 1.

As described in detail later, the antenna evaluation apparatus of the present preferred embodiment is characterized in that a computer 10 controls a transmitter circuit 30a to radiate radio waves solely from respective scatterer antennas 50a-n (n=1, 2, . . . , N, and N is five in the present preferred embodiment). Then, based on the radio waves radiated solely from the respective scatterer antennas 50a-n, the computer 10 executes calibration to control the transmitter circuit 30a so that the amplitudes of received signals S60a each measured by using a calibration receiving antenna 60a coincides with an identical target amplitude and the phases of the received signals each measured coincides with an identical target phase, and to store reference attenuation amount control voltages VAa-n and reference phase shift amount control voltages VPa-n for use in the transmitter circuit 30a for the respective scatterer antennas 50a-n into a memory 10m. Further, the computer 10 is characterized in that, on the basis of inputted amplitude difference values from the target amplitude and inputted phase difference values from the target phase, the computer 10 calculates attenuation amount control voltages and phase shift amount control voltages for the respective scatterer antennas 50a-n that are to be set in the transmitter circuit 30a, by adding attenuation amount control voltages corresponding to the amplitude difference values and phase shift amount control voltages corresponding to the phase difference values to stored reference attenuation amount control voltages VAa-n and stored reference phase shift amount control voltages VPa-n for use in the transmitter circuit 30a for the respective scatterer antenna 50a-n. In this case, the inputted amplitude difference values and inputted phase difference values are inputted from an input device 10i, and correspond to the amplitudes and the phases of the transmitting signal from the respective scatterer antennas 50a-n for achieving a predetermined multiple wave propagation state. The computer 10 generates a multiple wave control signal S10a, and outputs the same signal to the D/A converter 11a. The computer 10 evaluates a performance of a transmitting antenna under evaluation by receiving and measuring the amplitude and the phase of the received signal S60a by the receiver 21a by using the transmitting antenna under evaluation, when the transmitting signals are simultaneously transmitted from the scatterer antennas 50a-n.

Referring to FIG. 1, the antenna evaluation apparatus of the present preferred embodiment is configured by including a scatterer antenna group 50a including the scatterer antennas 50a-1 to 50a-5 each of which is a half-wave dipole antenna, and a multiple wave controlling and measuring apparatus 200A. The scatterer antennas 50a-1 to 50a-5 are vertically installed at positions at vertex portions of a scatterer antenna support base 101 assembled in a frame having a shape of a regular pentagon pillar, so that heights of feeding points of the scatterer antennas 50a-1 to 50a-5 are denoted by "H" from the floor surface and vertically polarized radio waves are radiated from the scatterer antennas 50a-1 to 50a-5. With this arrangement, the scatterer antennas 50a-1 to 50a-5 are provided on the circumference of a circle of a radius "R" at equal spaces. In this case, the origin of a right-handed XYZ coordinate system is defined to the center of the positions of the feeding points of the respective scatterer, the positive direction of the Z-axis is defined to an upward direction with respect to the origin, and the positive direction of the Y-axis is defined to a direction directed from the origin toward the scatterer antenna 50a-1.

The calibration receiving antenna (also referred to as a receiving antenna hereinafter) 60a is installed to a receiving antenna support base 102 during the calibration of the antenna evaluation apparatus of FIG. 1, and the calibration receiving antenna 60a or a further receiving antenna to be evaluated (not shown, and referred to as a receiving antenna under evaluation hereinafter) is installed during evaluation. In the present preferred embodiment, the calibration receiving antenna 60a is a half-wave dipole antenna, which is vertically installed at a vertex portion of the receiving antenna support base 102 of a pole, so that the feeding point of the receiving antenna 60a is positioned at the origin and the vertically polarized radio waves are received by the receiving antenna 60a. In the present preferred embodiment, the scatterer antenna support base 101 and the receiving antenna support base 102 are made of a resin material such as polypropylene or vinyl chloride. In addition, the height "H" of each of the feeding points of the scatterer antennas 50a-1 to 50a-5 and the receiving antenna 60a measured from the floor surface is set to 1.5 m, and a distance "R" of each of the feeding points measured from the origin is set to 1.5 m.

Referring to FIG. 2, the multiple wave controlling and measuring apparatus 200A is configured by including the computer 10 having the memory 10m and the input device 10i such as a keyboard, a network analyzer 20a having the receiver 21a and a signal generator 22a, and the transmitter circuit 30a. Further, the transmitter circuit 30a is configured by including the D/A converter 11a, a divider 12a, a phase shifter circuit 13a having phase shifters 13a-1 to 13a-5 provided for the scatterer antennas 50a-1 to 50a-5, respectively, and an attenuator circuit 14a having attenuators 14a-1 to 14a-5 provided for the scatterer antennas 50a-1 to 50a-5, respectively. The network analyzer 20a is set to a single frequency mode in which the signal generator 22a generates a transmitting signal S22a of an unmodulated continuous wave signal having a frequency of 2.14 GHz, a number of measurement points is set to 1601 points, a sweep time is set to 16 seconds, a transmission output level is set to +5 dBm, and a screen display is set to a polar coordinate display of a scattering parameter "S21". In this case, an output terminal T20a-1 of the network analyzer 20a is a port 1, and an input terminal T20a-2 of the network analyzer 20a is a port 2.

The signal generator 22a generates the transmitting signal S22a, and outputs the same signal to the divider 12a and the receiver 21a. The transmitting signal S22a is divided into five transmitting signals in the divider 12a, and divided transmitting signals are outputted to the phase shifters 13a-1 to 13a-5, respectively. The phase shifters 13a-1 to 13a-5 shift the phases of inputted transmitting signals by predetermined phase shift amounts Pa-1 to Pa-5, respectively, and output phase-shifted transmitting signals to corresponding attenuators 14a-1 to 14a-5, respectively. In this case, the phase shift amounts Pa-1 to Pa-5 correspond to phase shift amount control voltages from the D/A converter 11a. The attenuators 14a-1 to 14a-5 attenuate inputted phase-shifted transmitting signals by predetermined attenuation amounts Aa-1 to Aa-5, respectively, and radiate resulting signals from corresponding scatterer antennas 50a-1 to 50a-5 as vertically polarized radio waves. In this case, the attenuation amounts Aa-1 to Aa-5 correspond to attenuation amount control voltages from the D/A converter 11a. In this case, in the antenna evaluation apparatus of FIG. 1, since the scatterer antennas 50a-1 to 50a-5, the scatterer antenna support base 101, the receiving antenna 60a or the receiving antenna under evaluation, and the receiving antenna support base 102 are installed in an anechoic chamber, influences of reflected waves reflected on the ceiling, floor surface, wall surfaces and so on are sufficiently smaller than those of direct waves, and a multiple wave composed of the direct waves radiated from the scatterer antennas 50a-1 to 50a-5 are generated at the origin of the XYZ coordinate system. It is noted that the multiple wave controlling and measuring apparatus 200A is made of metal and reflects the radio waves, and therefore, the multiple wave controlling and measuring apparatus 200A is installed outside the anechoic chamber.

On the other hand, as described in detail later, the computer 10 sets the phase shift amounts Pa-1 to Pa-5 for the phase shifters 13a-1 to 13a-5 and the attenuation amounts Aa-1 to Aa-5 for the attenuators 14a-1 to 14a-5 to predetermined values, respectively, during the calibration of the antenna evaluation apparatus and the evaluation of the receiving antenna under evaluation. The computer 10 stores phase shifter characteristic tables for the respective phase shifter 13a-n into the memory 10m, and stores attenuator characteristic tables for the respective attenuators 14a-n into the memory 10m. Each of the phase shifter characteristic tables represents a relation between an applied phase shift amount control voltage and the phase shift amount Pa-n, and each of the attenuator characteristic table represents a relation between an applied attenuation amount control voltage and the attenuation amount Aa-n. Referring to the respective phase shifter characteristic tables and the respective attenuator characteristic tables, the computer 10 generate the digital multiple wave control signal S10a including the phase shift amount control voltages corresponding set phase shift amounts Pa-1 to Pa-5 and the attenuation amount control voltages corresponding to set attenuation amounts Aa-1 to Aa-5, and outputs the same signal to the D/A converter 11a.

Further, the D/A converter 11a converts inputted multiple wave control signal S10a into analog phase shift amount control voltages corresponding to the respective phase shift amounts Pa-1 to Pa-5 for the phase shifters 13a-1 to 13a-5 and analog attenuation amount control voltages corresponding to the respective attenuation amounts Aa-1 to Aa-5 for the attenuators 14a-1 to 14a-5, applies the analog phase shift amount control voltages to the phase shifters 13a-1 to 13a-5, and applies analog attenuation amount control voltages to the attenuators 14a-1 to 14a-5.

In addition, the receiver 21a receives the multiple wave of the radio waves radiated by the scatterer antennas 50a-1 to 50a-5 as the received signal S60a by using the receiving antenna 60a or the receiving antenna under evaluation, measures the amplitude (received power) and the phase of the received signal S60a relative to the transmitting signal S22a, and outputs received data including data of measured amplitude and measured phase to the computer 10. The computer 10 executes the calibration of the antenna evaluation apparatus by a calibration process described in detail later with reference to FIG. 3, or evaluates the performance of the receiving antenna under evaluation by using the received data from the receiver 21a.

Figure 3:
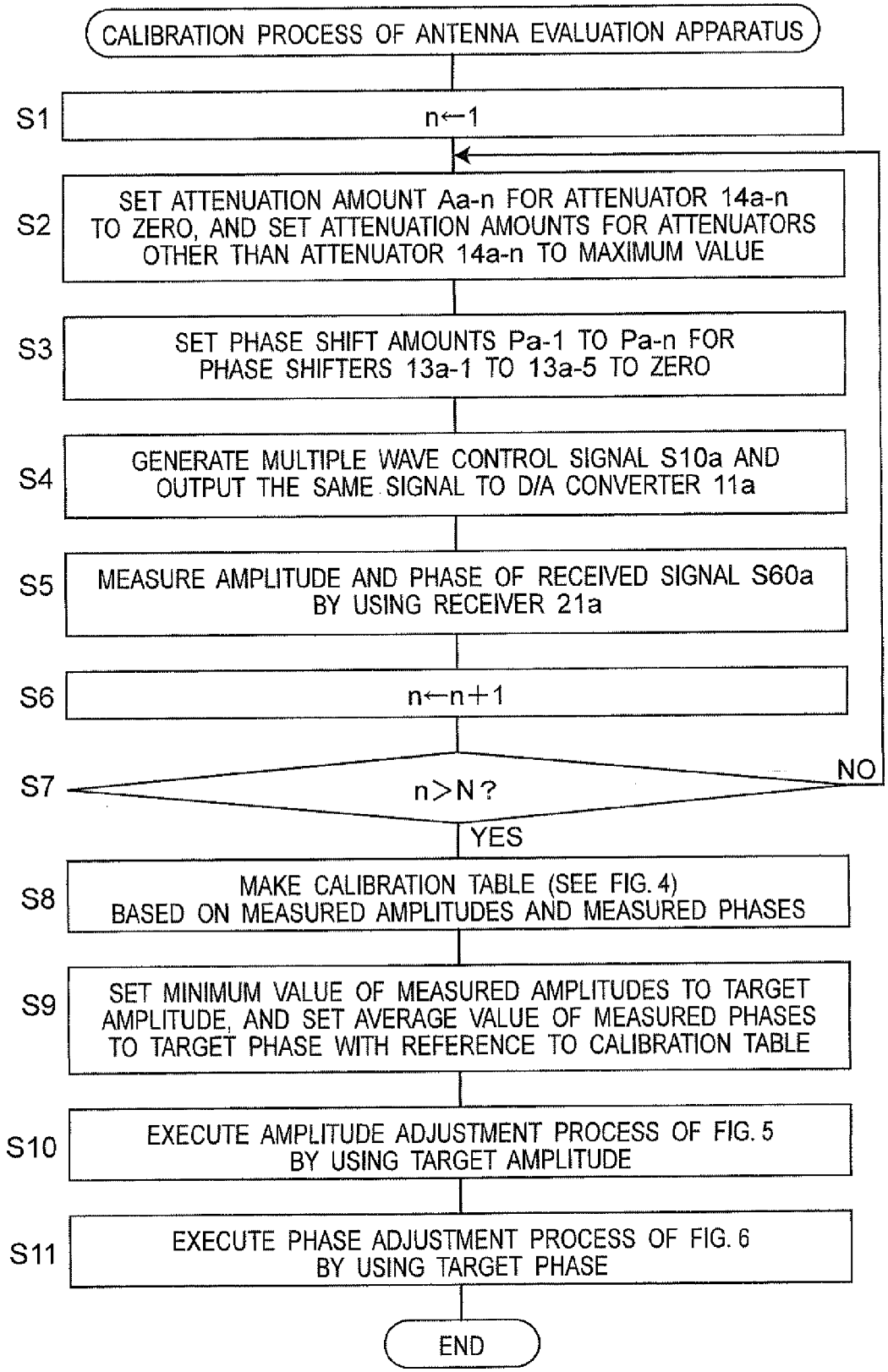
FIG. 3 is a flow chart showing a calibration process of the antenna evaluation apparatus executed by a computer 10 of FIG. 2.
Figure 5:
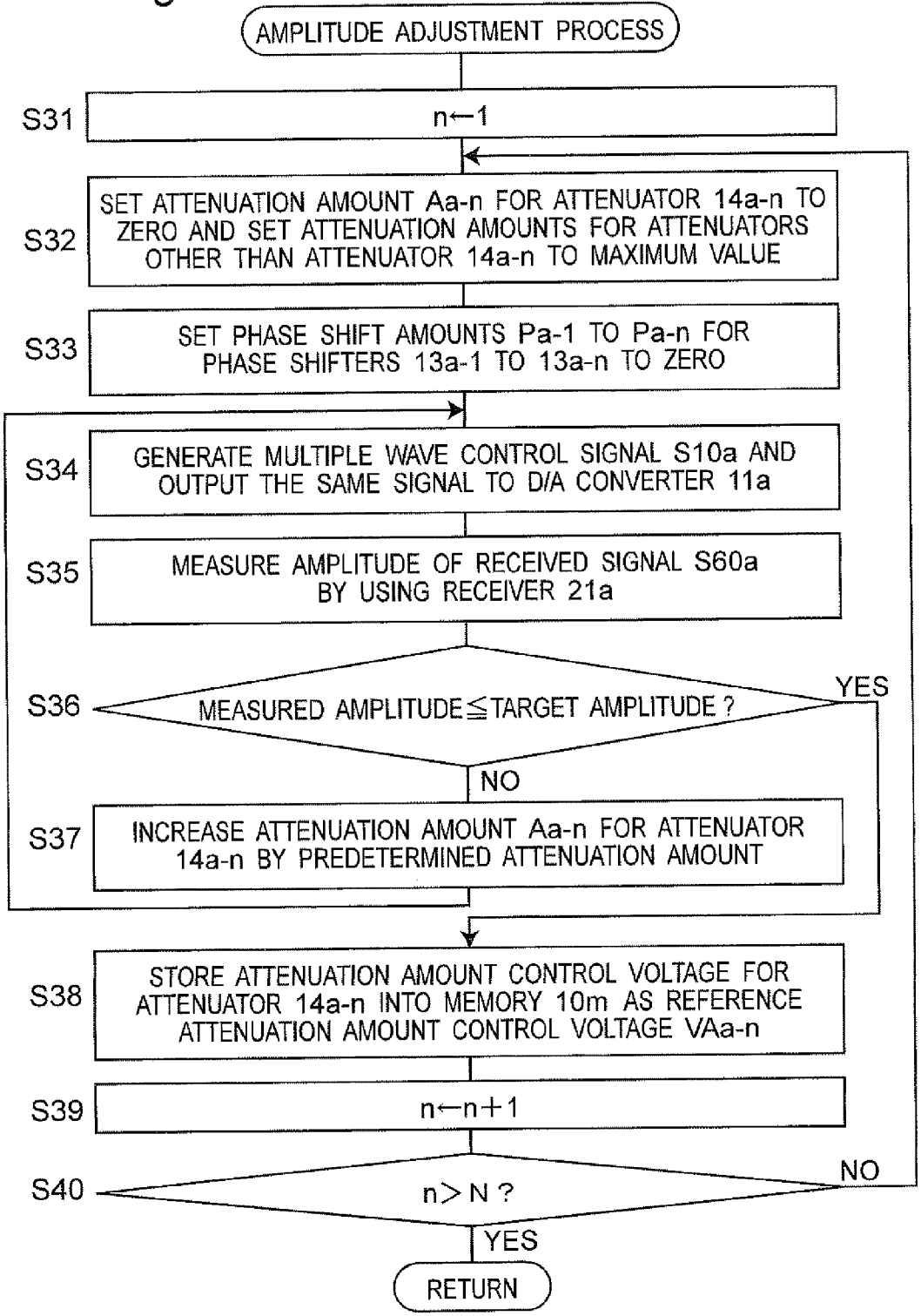
FIG. 5 is a flow chart showing an amplitude adjustment process which is executed at step S10 of FIG. 3.
Figure 6:
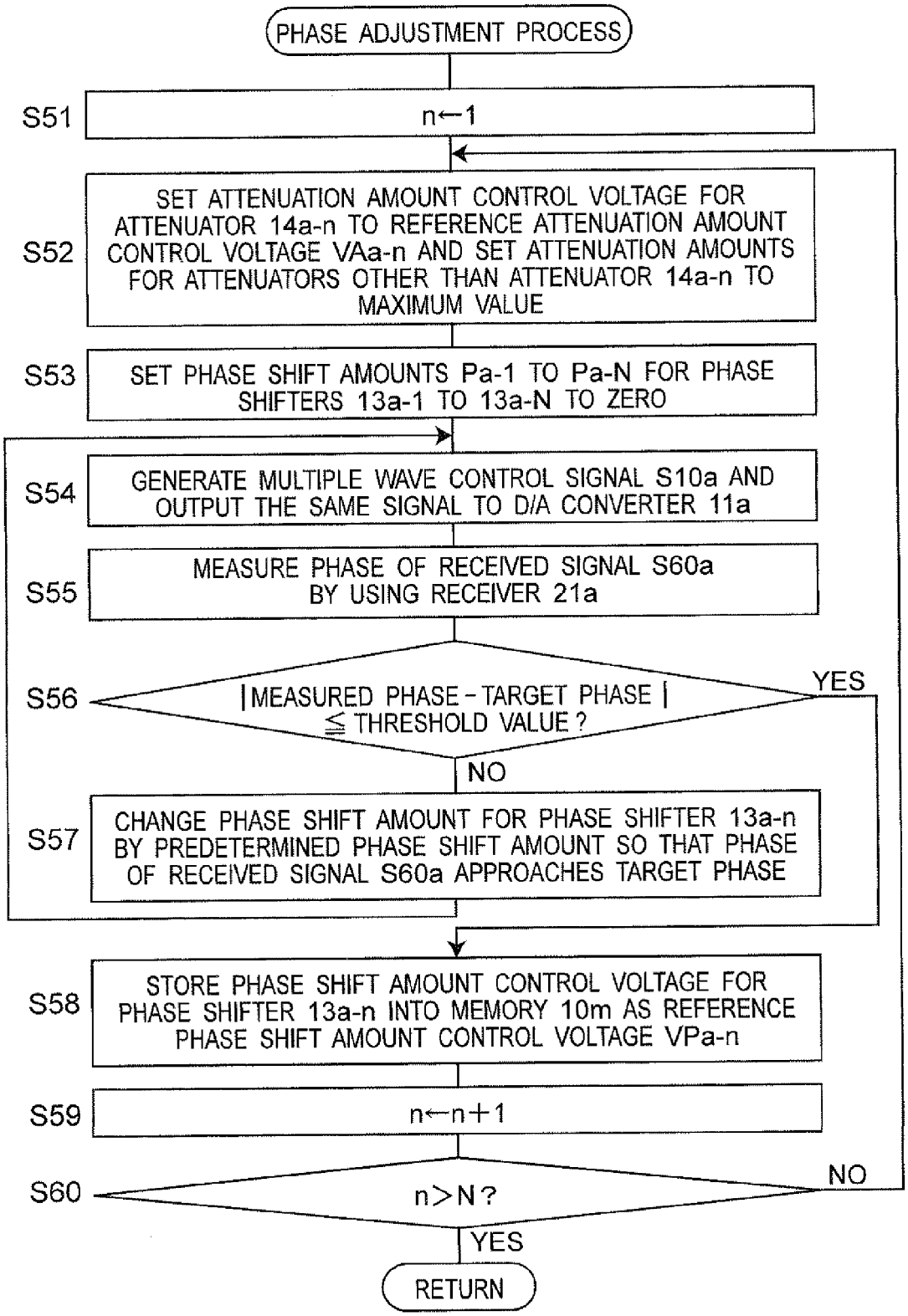
FIG. 6 is a flow chart showing a phase adjustment process which is executed at step S11 of FIG. 3.

Next, the calibration process of the antenna evaluation apparatus executed by the computer 10 of FIG. 2 is described. FIG. 3 is a flow chart showing the calibration process of the antenna evaluation apparatus executed by the computer 10 of FIG. 2, and FIG. 4 is a table showing one example of a calibration table made at step S8 of FIG. 3. FIG. 5 is a flow chart showing an amplitude adjustment process which is executed at step S10 of FIG. 3, and FIG. 6 is a flow chart showing a phase adjustment process which is executed at step S11 of FIG. 3. It is noted that the calibration receiving antenna 60a is installed to the receiving antenna support base 102 as shown in FIG. 1 during the calibration of the antenna evaluation apparatus.

At step S1 of FIG. 3, a parameter "n" is set to an initial value of one. Then, at step S2, the computer 10 sets the attenuation amount Aa-n for the attenuator 14a-n to zero and sets the attenuation amounts for the attenuators other than the attenuator 14a-n to a maximum value, and thereafter, at step S3, the computer 10 sets the phase shift amounts Pa-1 to Pa-N for the phase shifters 13a-1 to 13a-N to zero. Next, at step S4, the computer 10 generates the multiple wave control signal S10a including the phase shift amount control voltages corresponding to the set phase shift amounts Pa-1 to Pa-N and the attenuation amount control voltages corresponding to the set attenuation amounts Aa-1 to Aa-N, and outputs the multiple wave control signal S10a to the D/A converter 11a. By this operation, radio waves are radiated substantially only from the scatterer antenna 50a-n. Further, at step S5, the computer 10 measures the amplitude and the phase of the received signal S60a relative to the transmitting signal S22a by using the receiver 21a. Next, one is added to the parameter "n" at step S6. Then, at step S7, it is judged whether or not the parameter "n" is larger than the total number N of the scatterer antennas 50a-1 t to 50-N. If YES at step S7, the control flow goes to step S8. On the other hand, if NO at step S7, the control flow returns to step S2.

Next, at step S8, the computer 10 makes the calibration table based on the amplitudes and the phases for all of the scatterer antennas 50a-1 to 50a-5 measured at step S5. As shown in FIG. 4, the calibration table represents the relation between the scatterer antenna 50a-n and the amplitude and the phase of the received signal S60a when the radio waves are radiated solely only from the scatterer antenna 50a-n. Subsequent to step S8, at step S9, with reference to the calibration table, the computer 10 sets a minimum value of the measured amplitudes to the target amplitude, and sets an average value of the measured phases to the target phase. Then, at step S10, the amplitude adjustment process of FIG. 5 is executed by using the target amplitude, the phase adjustment process of FIG. 6 is executed by using the target phase at step S11, and the calibration process of the antenna evaluation apparatus is ended.

Next, the amplitude adjustment process at step S10 of FIG. 3 is described with reference to FIG. 5. At step S31, the parameter "n" is set to the initial value of one. Then, at step S32, the computer 10 sets the attenuation amount Aa-n for the attenuator 14a-n to zero, and sets the attenuation amounts for the attenuators other than the attenuator 14a-n to the maximum value, and thereafter, at step S33, the computer 10 sets the phase shift amounts Pa-1 to Pa-N for the phase shifters 13a-1 to 13a-N to zero. Then, at step S34, the computer 10 generates the multiple wave control signal S10a including the phase shift amount control voltages corresponding to the set phase shift amounts Pa-1 to Pa-N and the attenuation amount control voltages corresponding to the set attenuation amounts Aa-1 to Aa-N, and outputs the same signal to the D/A converter 11a. By this operation, the radio waves are radiated substantially solely only from the scatterer antenna 50a-n. Further, at step S35, the computer 10 measures the amplitude of the received signal S60a relative to the transmitting signal S22a by using the receiver 21a.

Then, at step S36, it is judged whether or not the measured amplitude is equal to or smaller than the target amplitude. If YES at step S36, the control flow goes to step S38. On the other hand, if NO at step S36, the control flow goes to step S37. At step S37, the attenuation amount Aa-n for the attenuator 14a-n is increased by a predetermined attenuation amount, and the control flow returns step S34. On the other hand, at step S38, the attenuation amount control voltage for the attenuator 14a-n is stored into the memory 10m as the reference attenuation amount control voltage VAa-n. Then, one is added to the parameter "n" at step S39. Next, at step S40, it is judged whether or not the parameter "n" is larger than the total number N of the scatterer antennas 50a-1 to 50-N. If YES at step S40, the amplitude adjustment process is ended. On the other hand, if NO at step S40, the control flow returns to step S32.

Next, the phase adjustment process at step S11 of FIG. 3 is described with reference to FIG. 6. At step S51, the parameter "n" is set to the initial value of one. Then, at step S52, the computer 10 sets the attenuation amount control voltage for the attenuator 14a-n to the reference attenuation amount control voltage VAa-n, and sets the attenuation amounts for the attenuators other than the attenuator 14a-n to the maximum value. Further, at step S53, the phase shift amounts Pa-1 to Pa-N for the phase shifters 13a-1 to 13a-N are set to zero. Next, at step S54, the computer 10 generates the multiple wave control signal S10a including the phase shift amount control voltages corresponding to the set phase shift amounts Pa-1 to Pa-N, the reference attenuation amount control voltage VAa-n, and the attenuation amount control voltages corresponding to the set attenuation amounts for the attenuators other than the attenuator 14a-n, and outputs the same signal to the D/A converter 11a. By this operation, the radios waves are radiated substantially solely only from the scatterer antenna 50a-n. Further, at step S55, the computer 10 measures the phase of the received signal S60a relative to the transmitting signal S22a by using the receiver 21a.

Next, at step S56, it is judged whether or not a magnitude of a difference between the measured phase and the target phase is equal to or smaller than a predetermined threshold value. If YES at step S56, the control flow goes to step S58. On the other hand, if NO at step S56, the control flow goes to step S57. At step S57, the computer 10 changes the phase shift amount for the phase shifter 13a-n by a predetermined phase shift amount so that the phase of the received signal S60a approaches the target phase, and the control flow returns to step S54. On the other hand, at step S58, the phase shift amount control voltage for the phase shifter 13a-n is stored into the memory 10m as the reference phase shift amount control voltage VPa-n. Subsequently, at step S59, one is added to the parameter "n". Next, at step S60, it is judged whether or not the parameter "n" is larger than the total number N of the scatterer antennas 50a-1 to 50a-N. If YES at step S60, the phase adjustment process is ended. On the other hand, if NO at step S60, the control flow returns to step S52.

Figure 7:
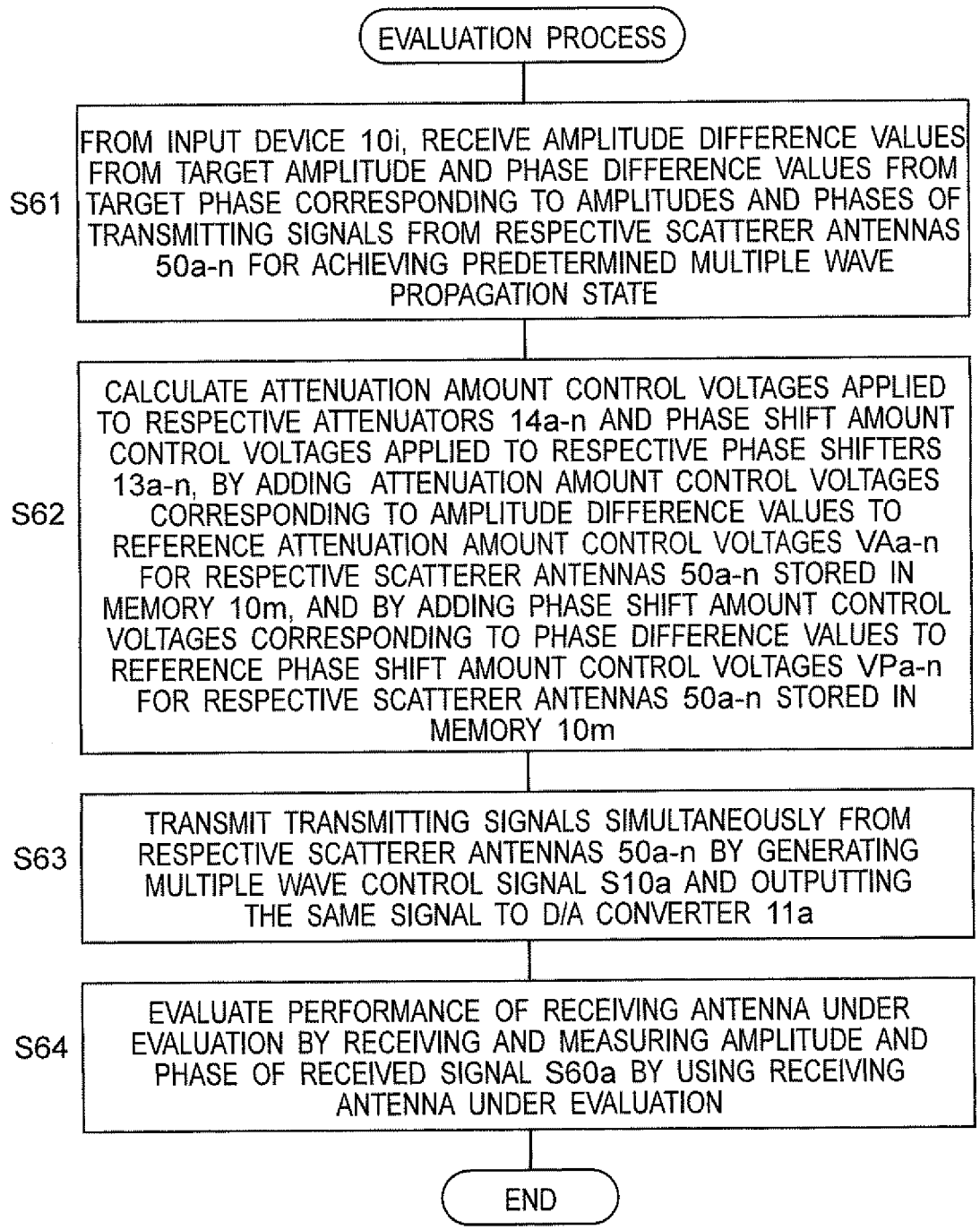
FIG. 7 is a flow chart showing an evaluation process which is executed by the computer 10 of FIG. 2.

Next, the evaluation process which is executed by the computer 10 of FIG. 2 is described with reference to FIG. 7. FIG. 7 is a flow chart showing the evaluation process which is executed by the computer 10 of FIG. 2. The computer 10 evaluates the performance of the receiving antenna under evaluation (not shown) installed to the receiving antenna support base 102 after executing the calibration process of FIG. 3. First of all, at step S61, from the input device 10i, the computer 10 receives amplitude difference values from the target amplitude and phase difference values from the target phase corresponding to the amplitudes and the phases of the transmitting signals from the respective scatterer antenna 50a-n for achieving a predetermined multiple wave propagation state such as Rayleigh fading or Nakagami-Rice fading at the origin of the XYZ coordinate system. In this case, the amplitude difference values and the phase difference values are inputted from the input device 10i by the user of the antenna evaluation apparatus, however, the present invention is not limited to this, and it may be received from another computer via an input device such as an interface circuit.

Next, at step S62, the computer 10 adds the attenuation amount control voltages corresponding to the amplitude difference values to the reference attenuation amount control voltages VAa-n for the respective scatterer antennas 50a-n stored in the memory 10m and adding the phase shift amount control voltages corresponding to the phase difference values to the reference phase shift amount control voltages VPa-n for the respective scatterer antennas 50a-n stored in the memory 10m, with reference to the respective attenuator characteristic tables and the respective phase shifter characteristic tables. By this operation, the computer 10 calculates the attenuation amount control voltages applied to the respective attenuators 14a-n and the phase shift amount control voltages applied to the respective phase shifters 13a-n at step S2. Further, at step S63, the computer 10 transmits the transmitting signals simultaneously from the respective scatterer antennas 50a-n, by generating the multiple wave control signal S10a including respective calculated attenuation amount control voltages and respective calculated phase shift amount control voltages and outputting the same signal to the D/A converter 11a. Then, at step S64, by receiving and measuring the amplitude and the phase of the received signal S60a relative to the transmitting signal S22a by the receiver 21a by using the receiving antenna under evaluation, the performance of the receiving antenna under evaluation is evaluated.

According to the calibration process of the antenna evaluation apparatus of the present preferred embodiment, the reference phase shift amount control voltages VPa-n for the respective phase shifters 13a-n and the reference attenuation amount control voltages VAa-n for the respective attenuator 14a-n are set so that the received signal S60a having the identical target phase and the identical target amplitude can be received from each of the scatterer antennas 50a-1 to 50a-5 in the receiver 21a. In this case, according to the calibration process described above, by measuring the amplitude and the phase of the received signal S60a relative to the transmitting signal S22a, the plane including the output terminal T20a-1 and the input terminal T20a-2 of the network analyzer 20a is defined as a calibration reference plane. Therefore, it is possible to remove the influences of the passing loss, which is caused in the entire path between the signal generator 22a and the receiver 21a including the connecting cables between the receiving antenna 60a and the receiver 21a and the connecting cables between the signal generator 22a and the respective scatterer antennas 50a-1 to 50a-5, on the amplitude and the phase of the received signal S60a. In addition, it is not required to successively place the calibration receiving antenna in the vicinity of each of the scatterer antennas 50a-1 to 50a-5 or to place calibration receiving antennas as many as the scatterer antennas 50a-1 to 50a-5 in the vicinity of the respective scatterer antennas 50a-1 to 50a-5. Therefore, according to the present preferred embodiment, the calibration can be executed more easily with accuracy higher than that of the prior art. Further, the operation of the transmitter circuit S30a is controlled based on the amplitude differences value from the target amplitude and the phase difference values from the target phase corresponding to the amplitudes and the phases of the transmitting signals from the respective scatterer antenna 50a-n for achieving the predetermined multiple wave propagation state during the evaluation of the receiving antenna under evaluation, and therefore, the evaluation accuracy of the receiving antenna under evaluation can be improved.

In the present preferred embodiment, the half-wave dipole antenna having the omni-directional directional pattern on the XY plane is used as the calibration receiving antenna 60a, however, the present invention is not limited to this. Another calibration receiving antenna having a known directional pattern may be used. In this case, the amplitudes and the phases of the received signals S60a when the radio waves radiated solely from the respective scatterer antenna 50a-n are received by using the calibration receiving antenna are corrected to the amplitudes and the phases of the received signals S60a received by the omni-directional receiving antenna, by using the directional patterns of the amplitude and the phase of the calibration receiving antenna in the azimuths of the scatterer antennas 50a-n. Then, it is acceptable to use corrected amplitudes and corrected phases as the measured values of the amplitude and/or phase at step S5 of FIG. 3, step S35 of FIG. 5 and step S55 of FIG. 6. It is noted that a receiving antenna having a directional pattern having a null on the XY plane cannot be used for the calibration process. Since it is not required to correct the amplitude and the phase of the received signal S60a by using the directional pattern of the receiving antenna 60a, it is preferred to use the receiving antenna 60a having the omni-directional directional pattern for the calibration process.

In addition, in the present preferred embodiment, instead of the divider 12a, it is acceptable to provide a switch for switching the transmitting signal S22a from the signal generator 22a to one of the phase shifters 13a-1 to 13a-5 and outputting the same signal. With this arrangement, no dividing loss occurs in the divider 12a, and therefore, the radio waves of a received power having a wider dynamic range can be radiated from the scatterer antennas 50a-1 to 50a-5.

In addition, at step S9 of the calibration process of the antenna evaluation apparatus of FIG. 3, the average value of the measured phases is set to the target phase, however, the present invention is not limited to this. For example, another value such as the minimum value or the maximum value of the measured phase may be set to the target phase. It is preferred to set the average value of the measured phases to the target phase. With this arrangement, it is possible to minimize a sum (a multiple of the predetermined phase shift amount at step S57) of change amounts when the phase shift amount of each phase shifter 13a-n is changed in the phase adjustment process of FIG. 6. Therefore, the calibration can be executed with high accuracy by minimizing the influence of the change in the attenuation amount caused by the phase shifting operation in each phase shifter 13a-n.

In addition, instead of the amplitude adjustment process of FIG. 5, it is acceptable to determine the attenuation amount control voltages for receiving the received signal S60a having the target amplitude with reference to the respective attenuator characteristic tables for the attenuator 14a-n, and to store determined voltages into the memory 10m as the reference attenuation amount control voltages VAa-n. Further, instead of the phase shifting adjustment process of FIG. 6, it is acceptable to determine the phase shift amount control voltages for receiving the received signal S60a having the target phase with reference to the respective phase shifter characteristic tables for the phase shifters 13a-n, and to store determined voltages into the memory 10m as the reference phase shift amount control voltages VPa-n.

Second Preferred Embodiment

Figure 8:
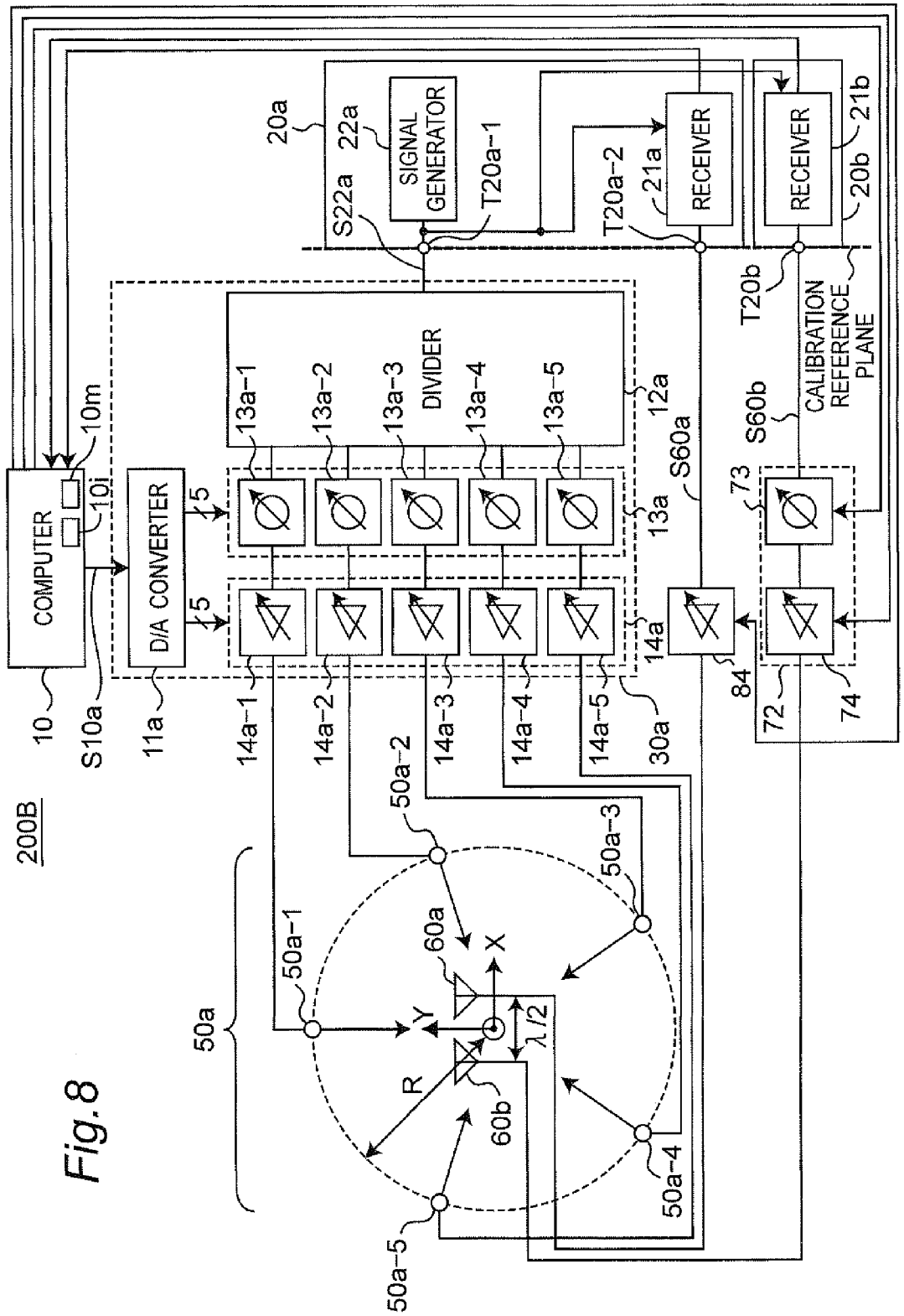
FIG. 8 is a block diagram showing a configuration of a multiple wave controlling and measuring apparatus 200B according to a second preferred embodiment of the present invention.
Figure 9:
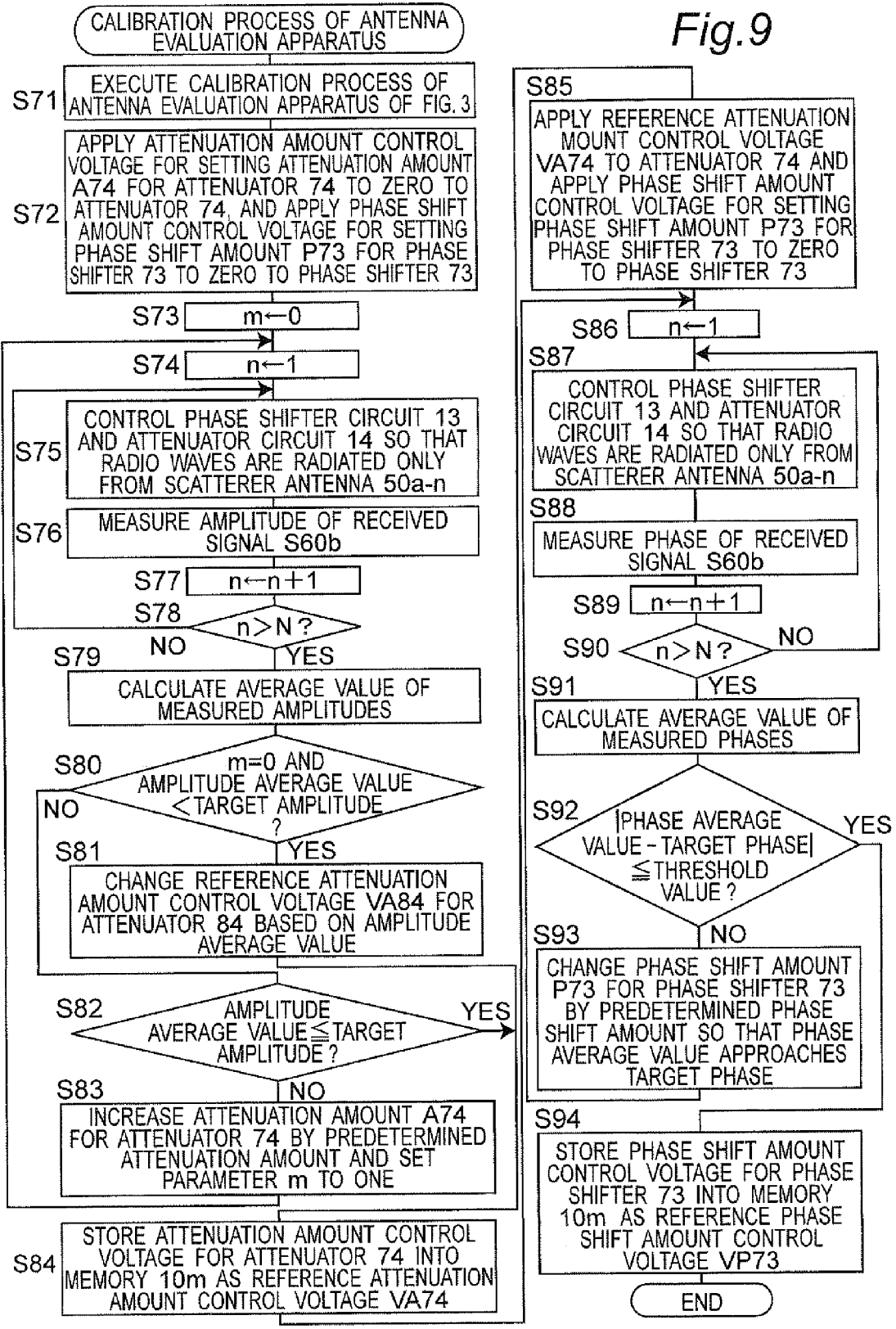
FIG. 9 is a flow chart showing a calibration process of the antenna evaluation apparatus executed by the computer 10 of FIG. 8.

FIG. 8 is a block diagram showing a configuration of a multiple wave controlling and measuring apparatus 200B according to the second preferred embodiment of the present invention, and FIG. 9 is a flow chart showing a calibration process of the antenna evaluation apparatus executed by the computer 10 of FIG. 8. The multiple wave controlling and measuring apparatus 200B of the present preferred embodiment is characterized by further including a network analyzer 20b having a receiver 21b, an amplitude and phase adjustment circuit 72 including a phase shifter 73 and an attenuator 74, and an attenuator 84, and by execution the calibration process of FIG. 9 by using an array antenna including receiving antennas 60a and 60b provided to be away from each other by a half-wavelength, as compared with the multiple wave controlling and measuring apparatus 200A of the first preferred embodiment.

Each of the receiving antennas 60a and 60b is a half-wave dipole antenna for receiving a vertically polarized radio wave. In addition, the receiving antennas 60a and 60b are vertically installed at the vertex portion of the receiving antenna support base 102, so that the feeding points of the receiving antennas 60a and 60b are positioned at a coordinate position $(0, \lambda/4, 0)$ and a coordinate position $(0, -\lambda/4, 0)$, respectively, in the XYZ coordinate system and so that the vertically polarized radio waves are received by the receiving antennas 60a and 60b. It is noted that $\lambda$ is the wavelength of radio waves radiated from the scatterer antennas 50a-1 to 50a-5. The receiver 21a receives the multiple wave of the radio waves radiated by the scatterer antennas 50a-1 to 50a-5 as the received signal S60a via the receiving antenna 60a or a first receiving antenna under evaluation (not shown) provided instead of the receiving antenna 60a and the attenuator 84. The attenuator 84 is inserted between the receiving antenna 60a or the first receiving antenna under evaluation and the receiver 21a, attenuates the received signal S60a, and outputs a resulting signal to the receiver 21a. On the other hand, the amplitude and phase adjustment circuit 72 receives the multiple wave of the radio waves radiated by the scatterer antennas 50a-1 to 50a-5 as a further received signal by using the receiving antenna 60b or a second receiving antenna under evaluation (not shown) provided instead of the receiving antenna 60b, changes a phase and an amplitude of the further received signal by the phase shifter 73 and attenuator 74, and outputs a resulting signal to the receiver 21b as a received signal S60b. Further, the receiver 20b measures the amplitude (received power) and the phase of the received signal S60b relative to the transmitting signal S22a, and outputs received data including the data of a measured amplitude and a measured phase to the computer 10. It is noted that the transmitting signal S22a generated by the signal generator 22a is outputted to the divider 12a and the receivers 21a and 21b.

As described in detail later, the computer 10 sets the attenuation amount A84 for the attenuator 84, the phase shift amount P73 for the phase shifter 73, and the attenuation amount A74 for the attenuator 74 to predetermined values, respectively, during calibration of the antenna evaluation apparatus and during evaluation of the receiving antenna under evaluation. The computer 10 stores an attenuator characteristic table representing a relation between the attenuation amount control voltage applied to the attenuator 84 and the attenuation amount A84, a phase shifter characteristic table representing a relation between the phase shift amount control voltage applied to the phase shifter 73 and the phase shift amount P73, and an attenuator characteristic table representing a relation between the attenuation amount control voltage applied to the attenuator 74 and the attenuation amount A74 in the memory 10m. Then, with reference to the phase shifter characteristic table and the respective attenuator characteristic tables, the computer 10 generates an attenuation amount control voltage corresponding to the set attenuation amount A84, the phase shift amount control voltage corresponding to the set phase shift amount P73, and an attenuation amount control voltage corresponding to the set attenuation amount A74, and apply generated voltages to the attenuator 84, the phase shifter 73 and the attenuator 74, respectively. In addition, the computer 10 executes calibration of the antenna evaluation apparatus by the calibration process described in detail later with reference to FIG. 9 by using the received data from the receivers 21a and 21b, or evaluates the performances of the first and second receiving antennas under evaluation.

Next, the calibration process of the antenna evaluation apparatus executed by the computer 10 of FIG. 8 is described with reference to FIG. 9. First of all, at step S71, the computer 10 sets the attenuation amount A84 for the attenuator 84 to zero, and executes the calibration process of the antenna evaluation apparatus of FIG. 3. It is noted that a reference attenuation amount control voltage VA84 is set to an attenuation amount control voltage when the attenuation amount A84 is zero. Then, at step S72, an attenuation amount control voltage for setting the attenuation amount A74 for the attenuator 74 to zero is applied to the attenuator 74, and a phase shift amount control voltage for setting the phase shift amount P73 for the phase shifter 73 to zero is applied to the phase shifter 73. Then, a parameter "m" is set to an initial value of zero at step S73, and a parameter "n" is set to an initial value of one at step S74. Then, at step S75, the phase shifter circuit 13 and the attenuator circuit 14 are controlled so that the radio waves are radiated solely only from the scatterer antenna 50a-n. Concretely speaking, the reference phase shift amount control voltage VPa-n is applied to the phase shifter 13a-n, and the respective phase shift amount control voltages are applied to the other phase shifters so that the phase shift amounts for the other phase shifters become zero. Further, the reference attenuation amount control voltage VAa-n is applied to the attenuator 14-n, and the respective attenuation amount control voltages are applied to the other attenuators so that the attenuation amounts for the other attenuators become maximum values thereof. By this operation, the radio wave having the target amplitude and the target phase are radiated from the scatterer antenna 50a-n. Then, at step S76, the computer 10 measures the amplitude of the received signal S60b relative to the transmitting signal S22a by using the receiver 21b.

Subsequently, one is added to the parameter "n" at step S77, and it is judged at step S78 whether or not the parameter "n" is larger than the total number N of the scatterer antennas 50a-1 to 50-N. If YES at step S78, the control flow goes to step S79, and if NO at step S79, the control flow returns to step S75. At step S79, an average value of measured amplitudes is calculated. Then, at step S80, it is judged whether or not the parameter "m" is zero and the amplitude average value is smaller than the target amplitude. If YES at step S80, the control flow goes to step S81, and if NO at step S80, the control flow goes to step S82. Then, at step S81, the reference attenuation amount control voltage VA84 for the attenuator 84 is changed to an attenuation amount control voltage required for attenuating the target amplitude to the amplitude average value based on the amplitude average value, and the control flow goes to step S84.

On the other hand, at step S82, it is judged whether or not the amplitude average value is equal to or smaller than the target amplitude. If YES at step S82, the control flow goes to step S84, and if NO at step S82, the control flow goes to step S83. At step S83, the attenuation amount A74 of the attenuator 74 is increased by a predetermined attenuation amount, and the control flow returns to step S74. On the other hand, at step S84, the attenuation amount control voltage for the attenuator 74 is stored into the memory 10m as the reference attenuation amount control voltage VA74, and the control flow goes to step S85.

At step S85, the reference attenuation amount control voltage VA74 is applied to the attenuator 74, and the phase shift amount control voltage for setting the phase shift amount P73 for the phase shifter 73 to zero is applied to the phase shifter 73. Next, at step S86, the parameter "n" is set to an initial value of one at step S86, and thereafter, at step S87, the phase shifter circuit 13 and the attenuator circuit 14 are controlled so that the radio waves are radiated solely only from the scatterer antenna 50a-n in a manner similar to that of step S75. Then, at step S88, the computer 10 measures the phase of the received signal S60b relative to the transmitting signal S22a by using the receiver 21b.

Subsequently, one is added to the parameter "n" at step S89, and it is judged at step S90 whether or not the parameter "n" is larger than the total number N of the scatterer antennas 50a-1 to 50-N. If YES at step S90, the control flow goes to step S91, and if NO at step S90, the control flow returns to step S87. At step S91, an average value of measured phases is calculated. Then, at step S92, it is judged whether or not a magnitude of a difference between the phase average value and the target phase is equal to or smaller than a predetermined threshold value. If YES at step S92, the control flow goes to step S94, and if NO at step S92, the control flow goes to step S93. At step S93, the phase shift amount P73 for the phase shifter 73 is changed by a predetermined phase shift amount so that the phase average value approaches the target phase, and the control flow returns to step S86. On the other hand, at step S94, the phase shift amount control voltage for the phase shifter 73 is stored into the memory 10m as a reference phase shift amount control voltage VP73, and the calibration process is ended.

After executing the calibration process described above, the computer 10 evaluates the performance of the array antenna (not shown) under evaluation having the first and second receiving antennas under evaluation installed to the receiving antenna support base 102 instead of the calibration receiving antennas 60a and 60b. The evaluation process of the present preferred embodiment is different from the evaluation process (See FIG. 7) of the first preferred embodiment in the point that the reference attenuation amount control voltage VA74, the reference attenuation amount control voltage VA84 and the reference phase shift amount control voltage VP73 are applied to the attenuator 74, the attenuator 84 and the phase shifter 73, respectively, before the process of step S61.

According to the calibration process of the antenna evaluation apparatus of the present preferred embodiment, based on the radio waves radiated solely from the respective scatterer antennas 50a-n, the receivers 21a and 21b are controlled to measure the amplitudes of the received signals S60a each measured by using the calibration receiving antenna 60a and the amplitude average value of the amplitudes of the received signals S60b each measured by using calibration receiving antenna 60b, respectively. The attenuator 84 and the amplitude and phase adjustment circuit 72 are controlled so that the amplitudes of the received signals S60a each measured by using the calibration receiving antenna 60a and the amplitude average value of the received signals S60b each measured by using the calibration receiving antenna 60b coincide with each other. Then, the receiver means 21a and 21b are controlled to measure the phases of the received signals S40a each measured by using the calibration receiving antenna 60a and the phase average value of the phases of the received signals S60b each measured by using the calibration receiving antenna 60b, respectively. The amplitude and phase adjustment circuit 72 is controlled so that the phases of the received signals S60a each measured by using the calibration receiving antenna 60a and the phase average value of the phases of the received signals S60b each measured by using the calibration receiving antenna 60b coincide with each other. In this case, according to the calibration process described above, by measuring the amplitudes and the phases of the received signals S60a and S60b relative to the transmitting signal S22a, the plane including the output terminal T20a-1 and the input terminal T20a-2 of the network analyzer 20a, and the input terminal T20b of the network analyzer 20b is defined as the calibration reference plane. Therefore, it is possible to remove the influences of the passing loss, which is caused in the entire path between the signal generator 22a and the receiver 21a including the connecting cables between the receiving antenna 60a and the receiver 21a and the connecting cables between the signal generator 22a and each of the scatterer antennas 50a-1 to 50a-5, on the amplitude and the phase of the received signal S60a. Further, it is possible to remove the influences of the passing loss, which is caused in the entire path between the signal generator 22a and the receiver 21a including the connecting cables between the receiving antenna 60b and the receiver 21b and the connecting cables between the signal generator 22a and each of the scatterer antenna 50a-1 to 50a-5, on the amplitude and the phase of the received signal S60b.

According to the present preferred embodiment, as compared with the first preferred embodiment, the calibration can be executed more easily with accuracy higher than that of the prior art in the antenna evaluation apparatus for evaluates the performance of the two-element array antenna including the first and second receiving antennas under evaluation, and the evaluation accuracy of the array antenna can be improved.

In the present preferred embodiment, each of the scatterer antennas 50a-1 to 50a-5 radiates the vertically polarized radio wave, and each of the calibration receiving antennas 60a and 60b receives the vertically polarized radio wave, however, the present invention is not limited to this. Each of the scatterer antennas 50a-1 to 50a-5 may radiate the horizontally polarized radio wave, and each of the calibration receiving antennas 60a and 60b may receive the horizontally polarized radio wave.

Third Preferred Embodiment

Figure 10:
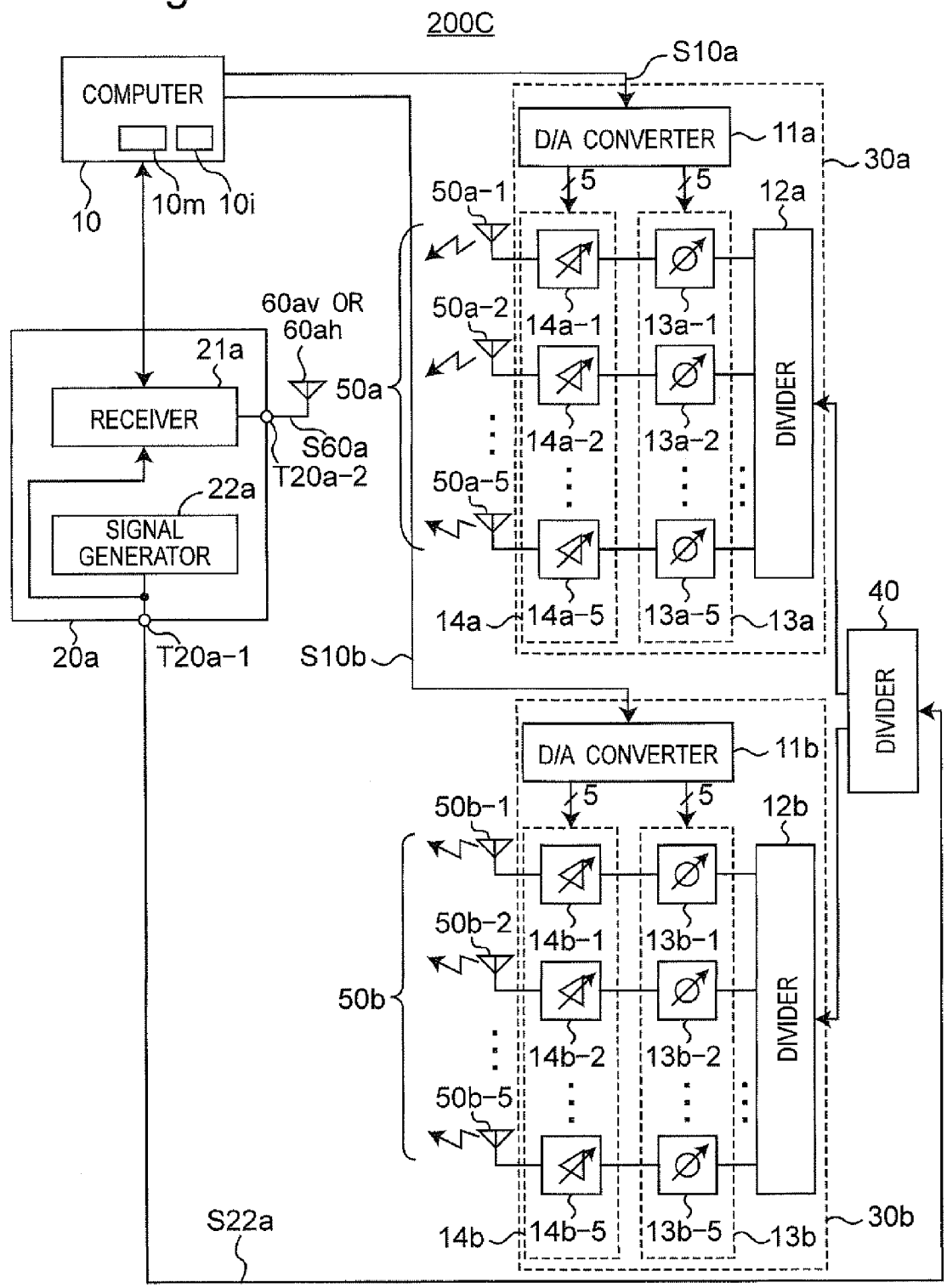
FIG. 10 is a block diagram showing a configuration of a multiple wave controlling and measuring apparatus 200C according to a third preferred embodiment of the present invention.

FIG. 10 is a block diagram showing a configuration of a multiple wave controlling and measuring apparatus 200C according to the third preferred embodiment of the present invention. FIG. 11(a) is an explanatory view showing an arrangement of the scatterer antennas 50a-1 to 50a-5 and a receiving antenna 60av when calibration using vertically polarized waves is executed by the computer 10 of FIG. 10, and FIG. 11(b) is an explanatory view showing an arrangement of scatterer antennas 50b-1 to 50b-5 and a receiving antenna 60ah when calibration using horizontally polarized waves is executed by the computer 10 of FIG. 10. The multiple wave controlling and measuring apparatus 200C of the present preferred embodiment is characterized by further including a scatterer antenna group 50b including scatterer antennas 50b-1 to 50b-5 each of which is a half-wave dipole antenna for radiating the horizontally polarized radio wave, a divider 40, and a transmitter circuit 30b, as compared with the multiple wave controlling and measuring apparatus 200A of the first preferred embodiment. In this case, the transmitter circuit 30b is configured by including a D/A converter 11b, a divider 12b, a phase shifter circuit 13b including phase shifters 13b-1 to 13b-5 provided for the scatterer antennas 50b-1 to 50b-5, respectively, and an attenuator circuit 14b including attenuators 14b-1 to 14b-5 provided for the scatterer antennas 50b-1 to 50b-5, respectively. Further, the multiple wave controlling and measuring apparatus 200C of the present preferred embodiment is characterized in that the calibration receiving antenna 60av of a dipole antenna is used during the calibration using the vertically polarized waves, and the calibration receiving antenna 60*ah* of a slot dipole antenna is used during the calibration using the horizontally polarized waves in the calibration process.

The scatterer antenna 50*b-n* is horizontally installed to the scatterer antenna support base 101 so that the feeding point of the scatterer antenna 50*b-n* is positioned away from the feeding point of the scatterer antenna 50*a-n* by a distance $\lambda/2$ in a direction from the origin toward the feeding point of the scatterer antenna 50*a-n*, and so that the scatterer antenna 50*b-n* radiate a horizontally polarized radio wave. For example, the coordinate positions in the XYZ coordinate system of the feeding points of the scatterer antennas 50*a-1* and 50*b-1* are (0, R, 0) and (0, R+$\lambda/2$, 0), respectively. It is noted that the longitudinal direction of the scatterer antenna 50*b-n* is provided parallel to the tangential line of a circle centered at the origin.

The computer 10 generates the multiple wave control signal S10*a* during the calibration of the antenna evaluation apparatus and during the evaluation of the receiving antenna under evaluation, and outputs the same signal to the D/A converter 11*a* in a manner similar to that of the first preferred embodiment. Further, as described in detail later, the computer 10 sets phase shift amounts Pb-1 to Pb-5 for the respective phase shifters 13*b-1* to 13*b-5* and attenuation amounts Ab-1 to Ab-5 for the respective attenuators 14*b-1* to 14*b-5* to predetermined values, respectively, during the calibration of the antenna evaluation apparatus and during the evaluation of the receiving antenna under evaluation. The computer 10 stores phase shifter characteristic tables for the respective phase shifter 13*b-n* into the memory 10*m*, and stores attenuator characteristic tables for the respective attenuators 14*b-n* into the memory 10*m*. Each of the phase shifter characteristic tables represents a relation between an applied phase shift amount control voltage and the phase shift amount Pb-n, and each of the attenuator characteristic table represents a relation between an applied attenuation amount control voltage and the attenuation amount Ab-n. Referring to the respective phase shifter characteristic tables and the respective attenuator characteristic tables, the computer 10 generate the digital multiple wave control signal S10*b* including the phase shift amount control voltages corresponding set phase shift amounts Pb-1 to Pb-5 and the attenuation amount control voltages corresponding to set attenuation amounts Ab-1 to Ab-5, and outputs the same signal to the D/A converter 11*b*. Further, the D/A converter 11*b* converts inputted multiple wave control signal S10*b* into analog phase shift amount control voltages corresponding to the respective phase shift amounts Pb-1 to Pb-5 for the phase shifters 13*b-1* to 13*b-5* and analog attenuation amount control voltages corresponding to the attenuation amounts Ab-1 to Ab-5 for the respective attenuators 14*b-1* to 14*b-5*, applies the analog phase shift amount control voltages to the phase shifters 13*b-1* to 13*ba-5*, and applies analog attenuation amount control voltages to the attenuators 14*b-1* to 14*b-5*.

On the other hand, the transmitting signal S22*a* generated by the signal generator 22*a* is divided into two transmitting signals by the divider 40, and divided transmitting signals are outputted to the dividers 12*a* and 12*b*, respectively. The transmitter circuit 30*a* radiates vertically polarized radio waves from the scatterer antennas 50*a-1* to 50*a-5* by using the transmitting signal from the divider 40 in a manner similar to that of the first preferred embodiment. In addition, the transmitting signal from the divider 40 is divided into five transmitting signals by the divider 12*b*, and outputted to the phase shifters 13*b-1* to 13*b-5*, respectively. The phase shifters 13*b-1* to 13*b-5* shift the phase of inputted transmitting signal by predetermined phase shift amounts Pb-1 to Pb-5 corresponding to the phase shift amount control voltages from the D/A converter 11*b* and outputs the phase-shifted transmitting signals to the corresponding attenuators 14*b-1* to 14*b-5*. The phase shifters 13*b-1* to 13*b-5* shift the phases of inputted transmitting signals by predetermined phase shift amounts Pb-1 to Pb-5, respectively, and output phase-shifted transmitting signals to corresponding attenuators 14*b-1* to 14*b-5*, respectively. In this case, the phase shift amounts Pb-1 to Pb-5 correspond to phase shift amount control voltages from the D/A converter 11*b*. The attenuators 14*b-1* to 14*b-5* attenuate inputted phase-shifted transmitting signals by predetermined attenuation amounts Ab-1 to Ab-5, respectively, and radiate resulting signals from corresponding scatterer antennas 50*b-1* to 50*b-5* as the horizontally polarized radio waves. In this case, the attenuation amounts Ab-1 to Ab-5 correspond to attenuation amount control voltages from the D/A converter 11*b*.

As described in detail later, the receiver 21*b* receives the radio waves radiated solely by the respective scatterer antennas 50*a-1* to 50*a-5* as the received signal S60*a* by using the receiving antenna 60*av* during the calibration using the vertically polarized waves, and receives the radio waves radiated solely by the respective scatterer antennas 50*b-1* to 50*b-5* as the received signal S60*a* by using the receiving antenna 60*ah* during the calibration using the horizontally polarized waves. Further, during the evaluation of the receiving antenna under evaluation (not shown), the receiver 21*a* receives a multiple wave of the radio waves radiated by the scatterer antennas 50*a-1* to 50*a-5* and the radio waves radiated by the scatterer antennas 50*b-1* to 50*b-5* as the received signal S60*a* by using the receiving antenna under evaluation. Then, the receiver 21*a* measures the amplitude and the phase of the received signal S60*a* relative to the transmitting signal S22*a*, and outputs received data including data of a measured amplitude and a measured phase to the computer 10. The computer 10 executes the calibration of the antenna evaluation apparatus by the calibration process described in detail later by using the received data from the receiver 21*a*, or evaluates the performance of the receiving antenna under evaluation.

Figure 11:
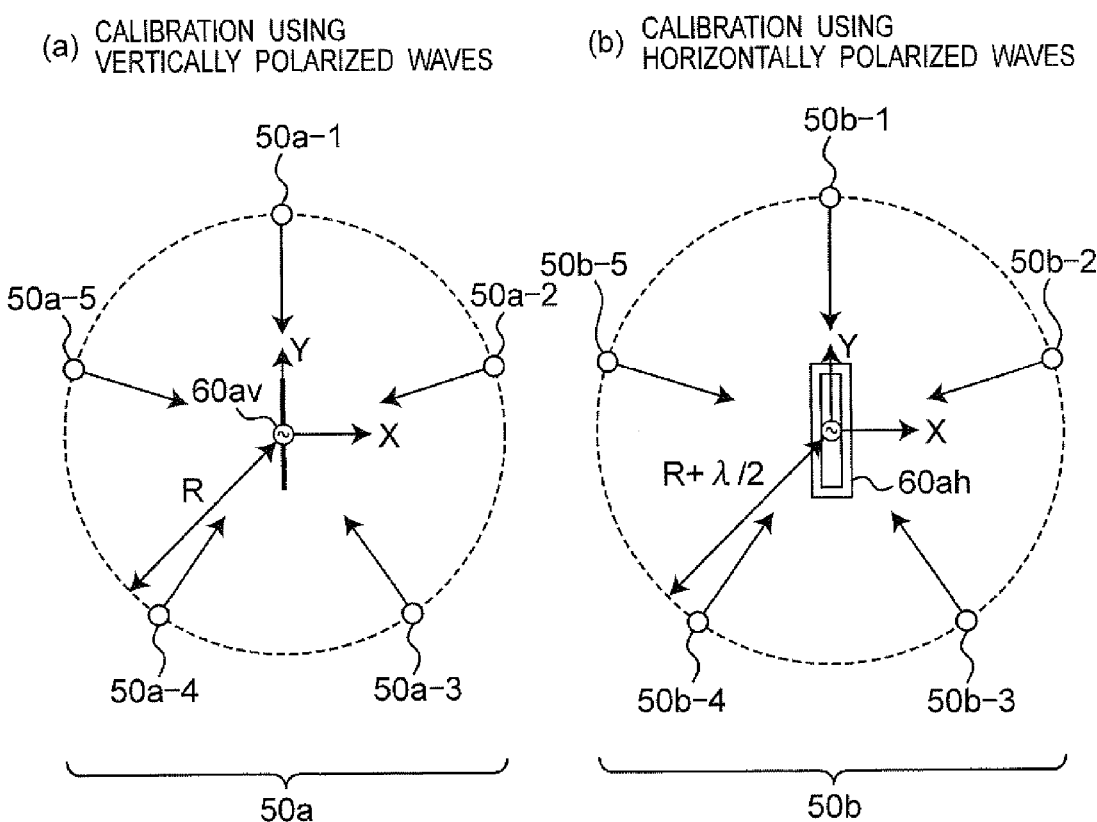
FIG. 11(a) is an explanatory view showing an arrangement of scatterer antennas 50a-1 to 50a-5 and a receiving antenna 60av when calibration using vertically polarized waves is executed by the computer 10 of FIG. 10.
FIG. 11(b) is an explanatory view showing an arrangement of scatterer antennas 50b-1 to 50b-5 and a receiving antenna 60ah when calibration using horizontally polarized waves is executed by the computer 10 of FIG. 10.

Next, the calibration process which is executed by the computer 10 is described. First of all, the computer 10 executes the calibration using the vertically polarized waves, and subsequently executes the calibration using the horizontally polarized waves. As shown in FIG. 11(*a*), during the calibration using the vertically polarized waves, the receiving antenna 60*av* configured in a manner similar to that of the receiving antenna 60*a* of the first preferred embodiment is installed to the receiving antenna support base 102 in a manner similar to that of the first preferred embodiment. Then, the computer 10 generates the multiple wave control signal S10*b* by setting the respective attenuation amounts Ab-1 to Ab-5 for the attenuators 14*b-1* to 14*b-5* to the maximum values thereof and setting the respective phase shift amounts Pb-1 to Pb-5 for the phase shifters 13*b-1* to 13*b-5* to zero, and outputs the same signal to the D/A converter 11*b*. By this operation, no radio waves are radiated from the scatterer antennas 50*b-1* to 50*b-5*. Subsequently, the computer 10 executes the calibration process of FIG. 3 by using the transmitter circuit 30*a* and the receiving antenna 60*av*, and stores a target amplitude for the vertically polarized waves, a target phase for the vertically polarized waves, the reference attenuation amount control voltages VAa-n for the respective attenuator 14*a-n*, and the reference phase shift amount control voltages VPa-n for the respective phase shifters 13*a-n* into the memory 10*m*.

Next, during the calibration using the horizontally polarized radio waves, the receiving antenna 60*ah* of the slot dipole antenna is horizontally installed to the receiving antenna support base 102 so that horizontally polarized radio waves are received as shown in FIG. 11(*b*). It is noted that the receiving antenna 60*ah* is installed so that the longitudinal direction of the receiving antenna 60*ah* is parallel to the Y axis. Then, the computer 10 generates the multiple wave control signal S10*a* by setting the respective attenuation amounts Aa-1 to Aa-5 for the attenuators 14*a*-1 to 14*a*-5 to the maximum values thereof and setting the respective phase shift amounts Pa-1 to Pa-5 for the phase shifter circuits 13*a*-1 to 13*a*-5 to zero, and outputs the same signal to the D/A converter 11*a*. By this operation, no radio waves are radiated from the scatterer antennas 50*a*-1 to 50*a*-5. Subsequently, the computer 10 executes the calibration process similar to that of FIG. 3 by using the transmitter circuit 30*b* and the receiving antenna 60*ah*, and stores a target amplitude for the horizontally polarized waves, a target phase for the horizontally polarized waves, reference attenuation amount control voltages VAb-n for the respective attenuator 14*b-n*, and reference phase shift amount control voltages VPb-n for the respective phase shifter 13*b-n* into the memory 10*m*.

After executing the calibration using the vertically polarized waves and the calibration using the horizontally polarized waves described above, the computer 10 evaluates the performance of the receiving antenna under evaluation installed to the receiving antenna support base 102 instead of the calibration receiving antennas 60*ah* and 60*av*. Concretely speaking, first of all, the computer 10 executes the processes of steps S61 to S63 in the evaluation process of the first preferred embodiment for each of the transmitter circuits 30*a* and 30*b*. Then, by receiving and measuring the amplitude and the phase of the received signal S60*a* relative to the transmitting signal S22*a* by using the receiving antenna under evaluation, the performance of the receiving antenna under evaluation is evaluated.

According to the present preferred embodiment, in the antenna evaluation apparatus that radiates the vertically polarized radio waves and the horizontally polarized waves by using the scatterer antennas 50*a*-1 to 50*a*-5 and the scatterer antennas 50*b*-1 to 50*b*-5, respectively, the calibration can be executed more easily with accuracy higher than that of the prior art in a manner similar to that of the first preferred embodiment, and the evaluation accuracy of the receiving antenna under evaluation can be improved.

According to the present preferred embodiment, the receiving antenna 60*av* having the omni-directional directional pattern for the vertically polarized waves on the XY plane is used during the calibration using the vertically polarized waves, and the receiving antenna 60*ah* having the omni-directional directional pattern for the horizontally polarized waves on the XY plane is used during the calibration using the horizontally polarized waves. Therefore, it is not required to correct the amplitude of the received signal S60*a* received by the receiver 21*a*.

Fourth Preferred Embodiment

Figure 12:
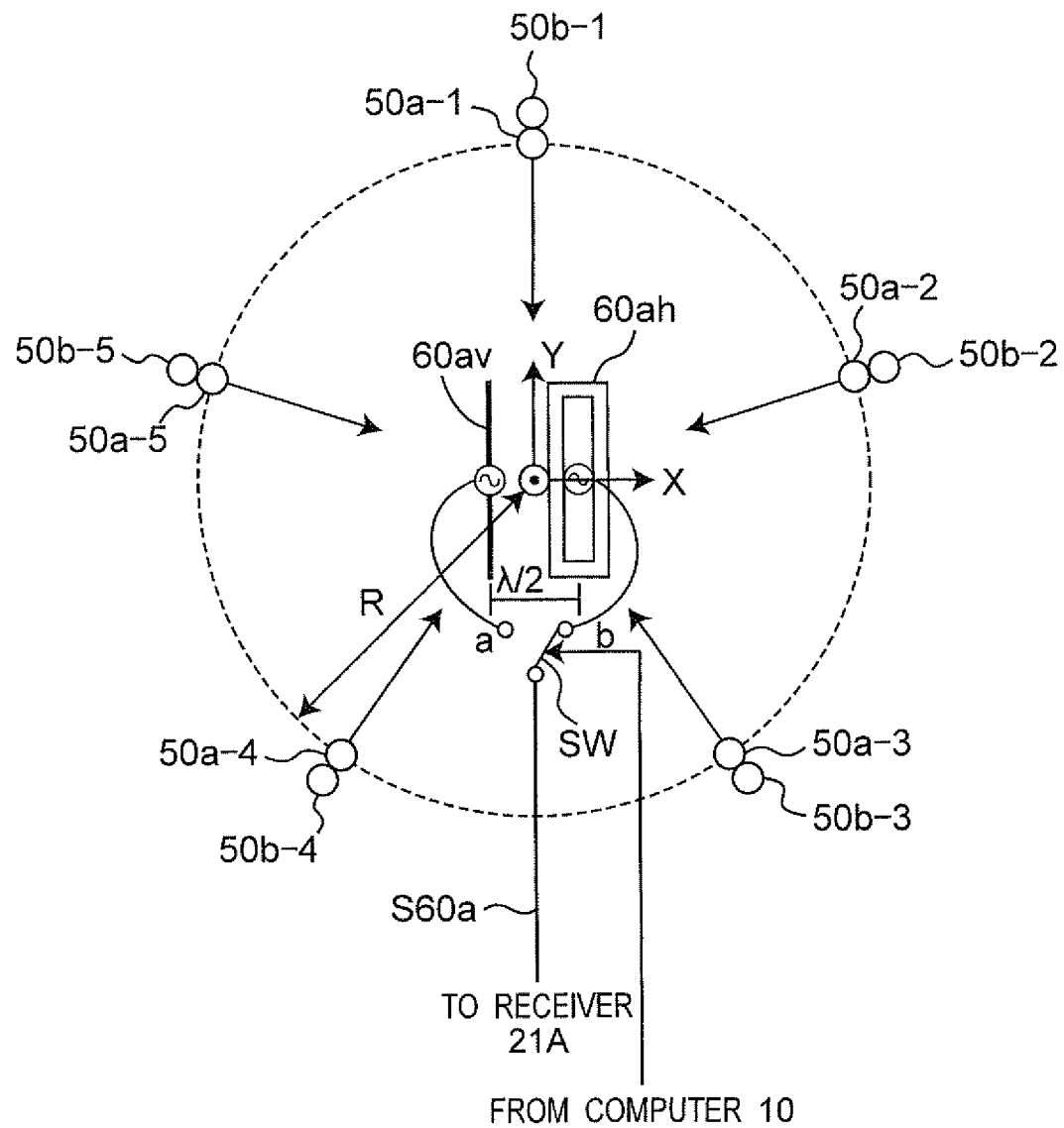
FIG. 12 is an explanatory view showing an arrangement of the scatterer antennas 50a-1 to 50a-5, the scatterer antennas 50b-1 to 50b-5, and the receiving antennas 60av and 60ah of an antenna evaluation apparatus according to a fourth preferred embodiment of the present invention.

FIG. 12 is an explanatory view showing an arrangement of the scatterer antennas 50*a*-1 to 50*a*-5, the scatterer antennas 50*b*-1 to 50*b*-5 and the receiving antennas 60*av* and 60*ah* of the antenna evaluation apparatus according to the fourth preferred embodiment of the present invention. The present preferred embodiment is characterized by providing the calibration receiving antenna 60*av* for receiving the vertically polarized radio waves, the calibration receiving antenna 60*ah* for receiving the horizontally polarized radio waves, and a switch SW at the vertex portion of the receiving antenna support base 102, as compared with the third preferred embodiment. The switch SW selectively connects one of the receiving antennas 60*av* and 60*ah* to the receiver 21*a*

Referring to FIG. 12, the receiving antenna 60*av* is vertically installed to the vertex portion of the receiving antenna support base 102 so that the feeding point of the receiving antenna 60*av* is positioned at a coordinate position $(-\lambda/4, 0, 0)$ in the XYZ coordinate system and the vertically polarized radio waves are received. In addition, the receiving antenna 60*ah* is horizontally installed to the vertex portion of the receiving antenna support base 102 so that the feeding point of the receiving antenna 60*ah* is positioned at a coordinate position $(\lambda/4, 0, 0)$ in the XYZ coordinate system and the horizontally polarized radio waves are received. The receiving antenna 60*ah* is provided so that the longitudinal direction of the receiving antenna 60*ah* is parallel to the Y axis. The receiving antennas 60*av* and 60*ah* constitute an array antenna.

The computer 10 executes calibration of the antenna evaluation apparatus in a manner similar to that of the third preferred embodiment by switching the switch SW to a contact "a" thereof during the calibration using the vertically polarized waves and switching the switch SW to a contact "b" thereof during the calibration using the vertically polarized waves.

According to the present preferred embodiment, it is not required to replace the receiving antenna 60*av* with the receiving antenna 60*ah* at the receiving antenna support base 102 after executing the calibration using the vertically polarized waves, and therefore, the calibration of the antenna evaluation apparatus can be executed more simply with accuracy higher than that of the third preferred embodiment.

In the present preferred embodiment, a divider may be provided instead of the switch SW. In addition, the switch SW may be provided in the receiver 21*a*.

Further, in the third and fourth preferred embodiments, the receiving antenna 60*ah* of the slot dipole antenna is provided so that the longitudinal direction of the receiving antenna 60*ah* is parallel to the Y axis, however, the present invention is not limited to this. The receiving antenna 60*ah* may be provided so that the longitudinal direction of the receiving antenna 60*ah* is parallel to the XY plane since the directional pattern on the XY plane of the slot dipole antenna is omnidirectional to the horizontally polarized waves of the principal polarized waves to be received.

Fifth Preferred Embodiment

Figure 13:
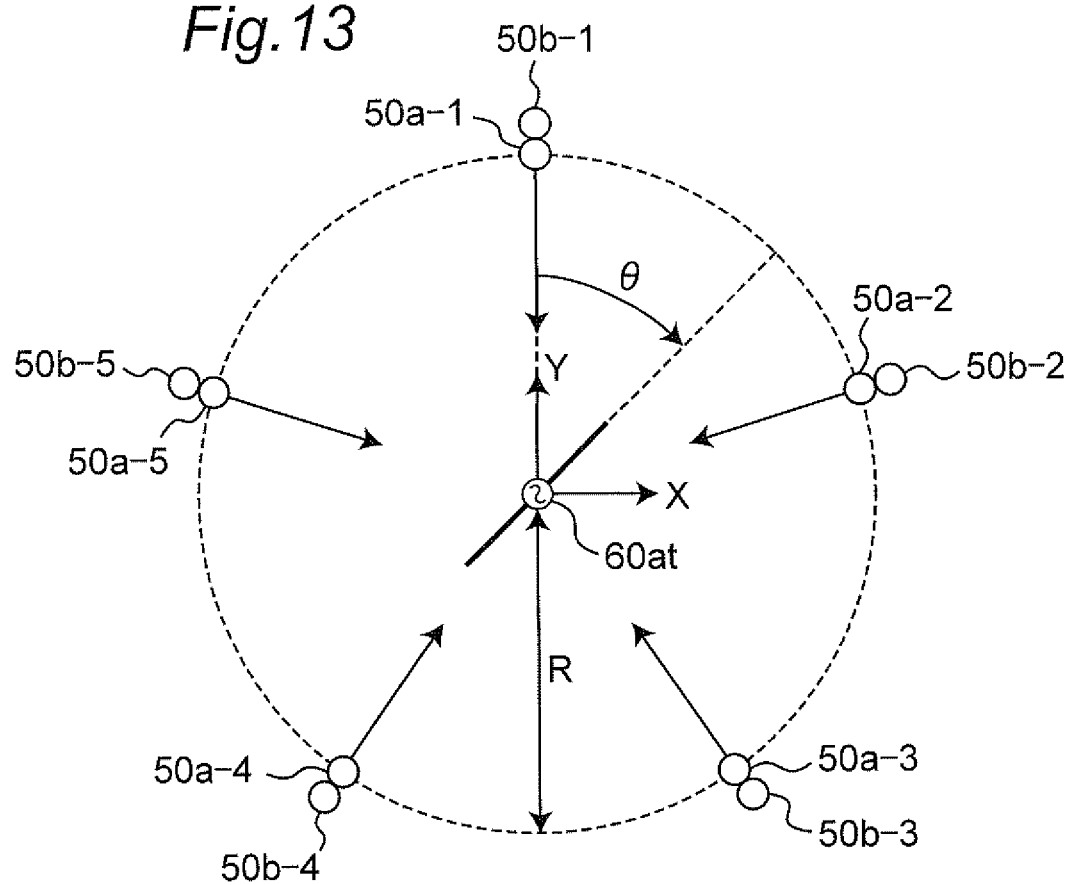
FIG. 13 is an explanatory view showing an arrangement of the scatterer antennas 50a-1 to 50a-5, the scatterer antennas 50b-1 to 50b-5, and a receiving antennas 60at of an antenna evaluation apparatus according to a fifth preferred embodiment of the present invention.

FIG. 13 is an explanatory view showing the arrangement of scatterer antennas 50*a*-1 to 50*a*-5, the scatterer antennas 50*b*-1 to 50*b*-5 and a receiving antenna 60*at* of an antenna evaluation apparatus according to the fifth preferred embodiment of the present invention. The present preferred embodiment is characterized in that the common calibration receiving antenna 60*at* is used during calibration using vertically polarized waves and during calibration using horizontally polarized waves instead of the calibration receiving antennas 60*av* and 60*ah*, as compared with the third preferred embodiment.

Referring to FIG. 13, the receiving antenna 60*at* is an inclined dipole antenna, and the feeding point of the receiving antenna 60*at* is positioned at the origin of the XYZ coordinate system. Further, the receiving antenna 60*at* is inclined so as to make an angle of inclination of 53 degrees with respect to the Z axis in an azimuth turned clockwise by θ from a direction in which the scatterer antenna 50*a*-1 is seen from the origin. Generally speaking, radio waves of horizontally polarized waves and vertically polarized waves are received the dipole antenna by setting the angle of inclination of the dipole antenna to 53 degrees.

The computer 10 executes calibration of the antenna evaluation apparatus by using the common receiving antenna 60*at* for calibration using the vertically polarized waves and calibration using the horizontally polarized waves in a manner similar to that of the third preferred embodiment. Therefore, according to the present preferred embodiment, the common receiving antenna 60*at* is used for calibration of the vertically polarized waves and calibration of the horizontally polarized waves. Therefore, it is not required to perform replacement or switchover of the receiving antennas during the calibration using the vertically polarized waves and during the calibration using the horizontally polarized waves, and the calibration of the antenna evaluation apparatus can be executed more simply with accuracy higher than that the third and fourth preferred embodiments.

It is noted that only the horizontally polarized waves are received when the angle of inclination of the receiving antenna 60*at* is set to a value greater than 53 degrees, and only the vertically polarized waves are received when the angle of inclination is set to a value smaller than 53 degrees. In addition, generally speaking, in such a case where the angle of inclination of the receiving antenna 60*at* is set to 53 degrees, an average received power becomes constant not depending on a cross-polarization power ratio (ratio of the power of the horizontally polarized waves and the power of the vertically polarized waves) when the total arrival powers of the horizontally polarized waves and the vertically polarized waves are constants, respectively. Therefore, when the angle of inclination of the receiving antenna 60*at* is set to 53 degrees, the power of the received signal S60*a* is measured by changing a ratio of the total power of the vertically polarized waves radiated from the transmitter circuit 30*a* and the total power of the horizontally polarized waves radiated from the transmitter circuit 30*b* after the calibration using the vertically polarized waves and the calibration using the horizontally polarized waves are executed, and it can be confirmed that the power becomes constant.

The azimuth θ of inclination of the receiving antenna 60*at* may be an arbitrary azimuth.

In addition, although the computer 10 executes the calibration using the horizontally polarized waves after executing the calibration using the vertically polarized waves in the third to fifth preferred embodiments, however, the present invention is not limited to this. The calibration using the vertically polarized waves may be executed after executing the calibration using the horizontally polarized waves.

Sixth Preferred Embodiment

Figure 14:
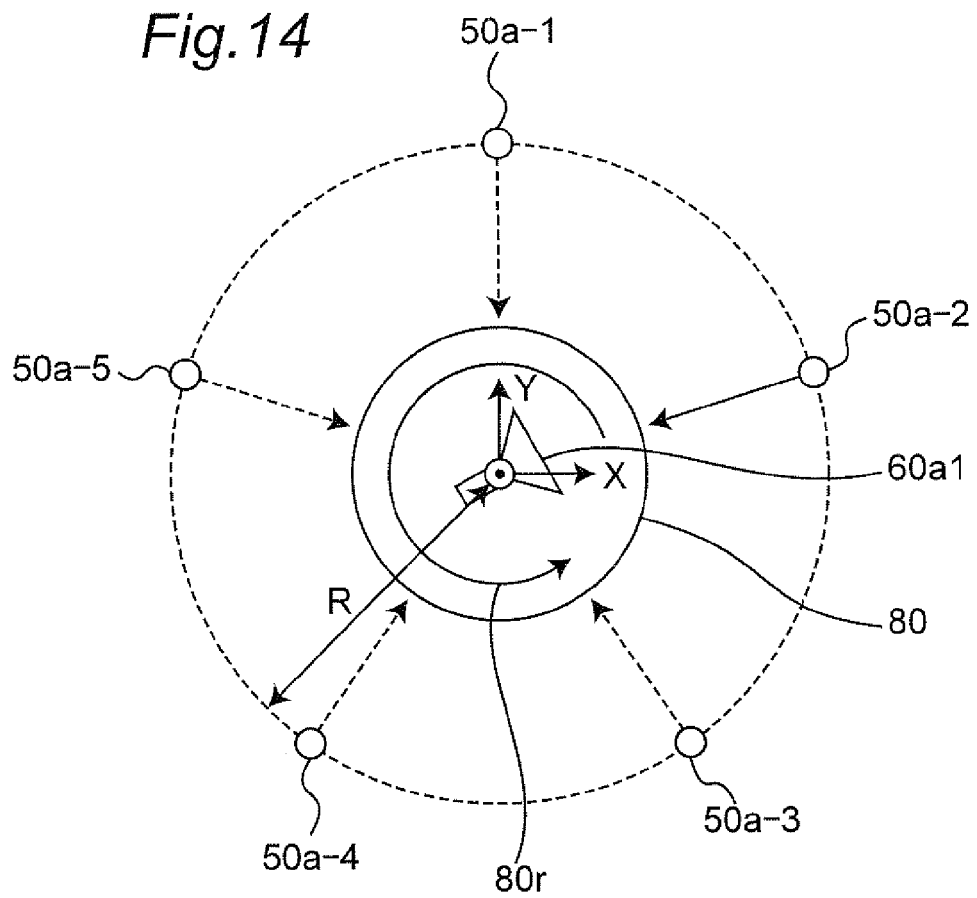
FIG. 14 is an explanatory view showing an arrangement of the scatterer antennas 50a-1 to 50a-5 and a receiving antenna 60a1 of an antenna evaluation apparatus according to a sixth preferred embodiment of the present invention.
Figure 15:
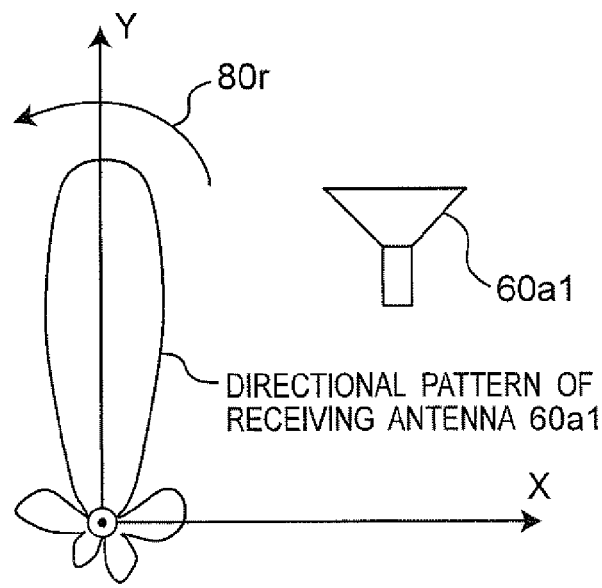
FIG. 15 is a characteristic graph showing a directional pattern of the receiving antenna 60a1 of FIG. 14.

FIG. 14 is an explanatory view showing an arrangement of the scatterer antennas 50*a*-1 to 50*a*-5 and a receiving antenna 60*a*1 of an antenna evaluation apparatus according to the sixth preferred embodiment of the present invention, and FIG. 15 is a characteristic graph showing the directional pattern of the receiving antenna 60*a*1 of FIG. 14. The present preferred embodiment is characterized in that a rotating table 80 is provided at the vertex portion of the receiving antenna support base 102, and the directional calibration receiving antenna 60*a*1 placed on the rotating table 80 is used instead of the omni-directional calibration receiving antenna 60*a* during calibration of the antenna evaluation apparatus, as compared with the first preferred embodiment.

Referring to FIG. 14, the rotating table 80 is installed to the vertex portion of the receiving antenna support base 102 so that the rotating table 80 can be rotated in a rotation direction 80*r* around the origin of the XYZ coordinate system. The receiving antenna 60*a*1 is a horn antenna placed on the rotating table 80. As shown in FIG. 15, the receiving antenna 60*a*1 has a main beam in the direction of the aperture plane on the XY plane. The computer 10 executes a calibration process (See FIG. 3) similar to that of the first preferred embodiment.

It is noted that, when the radio waves are radiated substantially solely only from the scatterer antenna 50*a*-*n* at step S4 of the calibration process of FIG. 3, step S34 of the amplitude adjustment process of FIG. 5 and step S54 of the phase adjustment process of FIG. 6, the rotating table 80 is rotated so that the main beam of the receiving antenna 60*a*1 is directed substantially toward the scatterer antenna 50*a*-*n*, as compared with the first preferred embodiment.

According to the present preferred embodiment, the calibration of the antenna evaluation apparatus can be executed by using the directional receiving antenna 60*a*1 more simply with high accuracy in a manner similar to that of the first preferred embodiment.

In the present preferred embodiment, when the width of the main beam of the receiving antenna 60*a*1 is sufficiently narrower than the interval (72 degrees in the present preferred embodiment) of the scatterer antennas 50*a*-1 to 50*a*-5, it is acceptable to radiate radio waves from the scatterer antennas other than the scatterer antenna 50*a*-*n* at step S4 of the calibration process of FIG. 3, step S34 of the amplitude adjustment process of FIG. 5 and step S54 of the phase adjustment process of FIG. 6.

Seventh Preferred Embodiment

Figure 16:
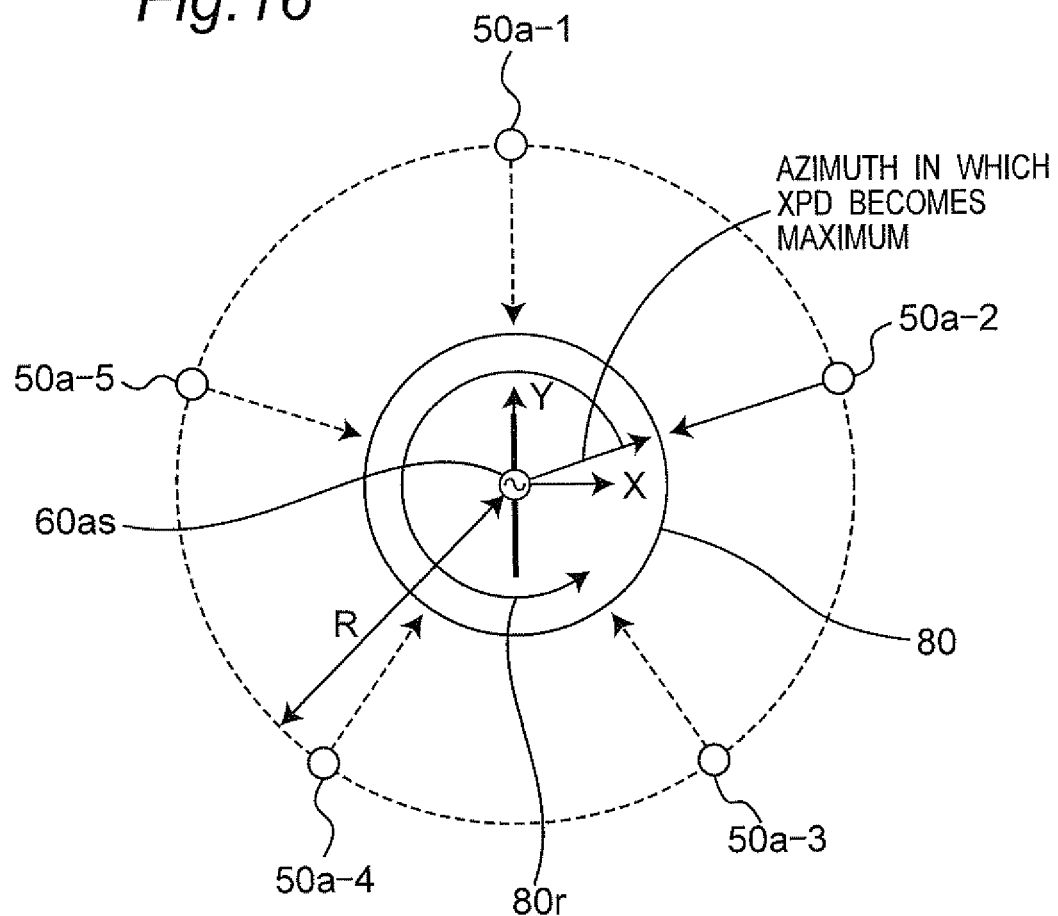
FIG. 16 is an explanatory view showing an arrangement of the scatterer antennas 50a-1 to 50a-5 and a receiving antenna 60as of an antenna evaluation apparatus according to a seventh preferred embodiment of the present invention.
Figure 17:
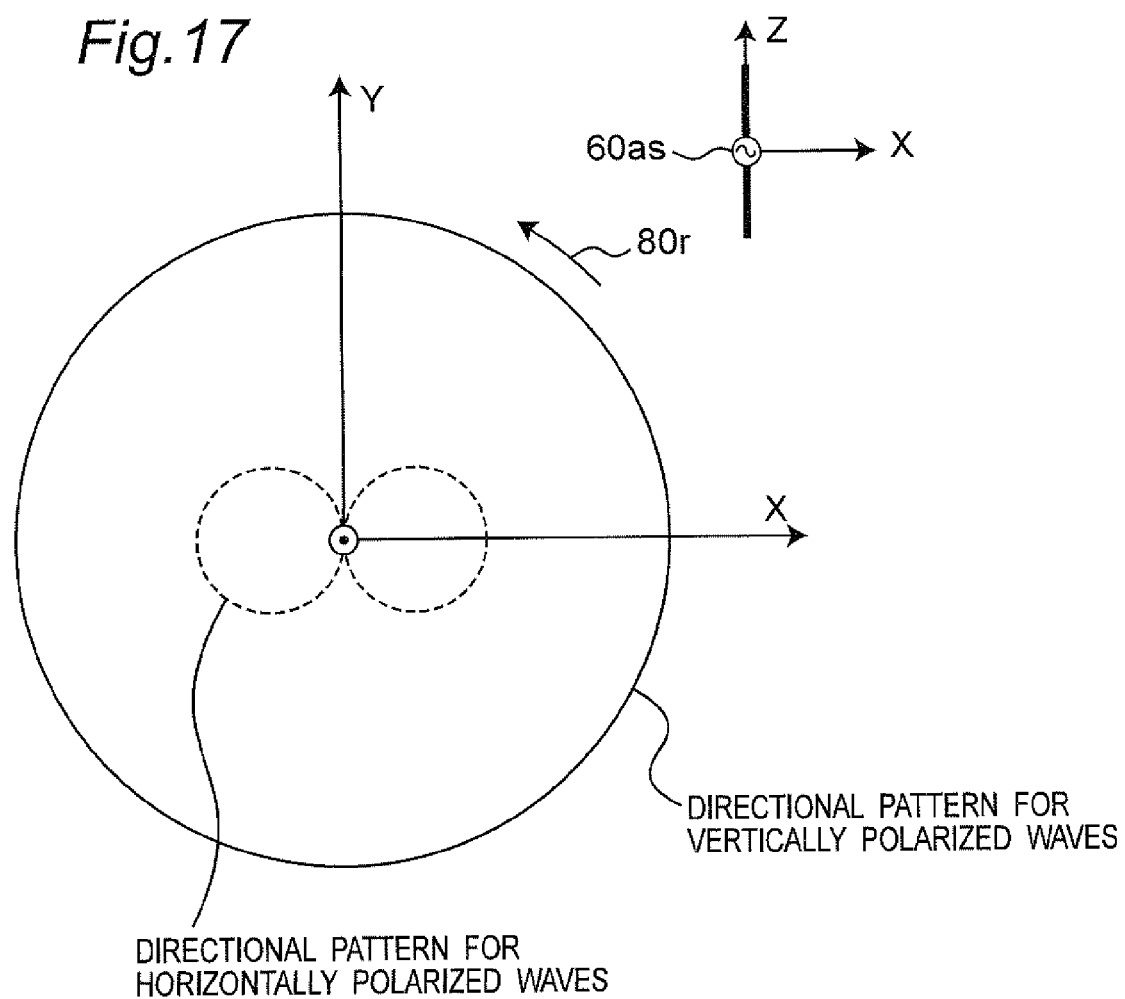
FIG. 17 is a characteristic graph showing directional patterns of the receiving antenna 60as of FIG. 16 including a directional pattern for the horizontally polarized waves and a directional pattern for the vertically polarized waves.

FIG. 16 is an explanatory view showing an arrangement of scatterer antennas 50*a*-1 to 50*a*-5 and a receiving antenna 60*as* of an antenna evaluation apparatus according to the seventh preferred embodiment of the present invention, and FIG. 17 is a characteristic graph showing directional patterns of the receiving antenna 60*as* of FIG. 16 including a directional pattern for the horizontally polarized waves and a directional pattern for the vertically polarized waves. The present preferred embodiment is characterized in that the calibration receiving antenna 60*as* of a Sperrtopf dipole antenna placed on the rotating table 80 is used instead of the calibration receiving antenna 60*a* during calibration of the antenna evaluation apparatus, as compared with the first preferred embodiment. Further, the present preferred embodiment is characterized in that the rotating table 80 is rotated so that a cross-polarization discrimination (XPD) of the receiving antenna 60*as* becomes substantially maximum when the radio waves are radiated substantially solely only from the respective scatterer antennas 50*a*-*n* during calibration of the antenna evaluation apparatus.

Referring to FIG. 17, although the receiving antenna 60*as* is omni-directional on the XY plane with respect to the vertically polarized waves of the main polarized waves, the receiving antenna 60*a* has a directional pattern including nulls in the positive direction and the negative direction of the Y axis with respect to the horizontally polarized waves of the cross-polarized waves thereto. Therefore, the cross-polarization discrimination becomes maximum in the positive direction and the negative direction of the Y axis. In the present preferred embodiment, the computer 10 executes a calibration process (See FIG. 3) similar to that of the first preferred embodiment. It is noted that the rotating table 80 is rotated so that the cross-polarization discrimination of the receiving antenna 60*a* becomes substantially maximum when the radio waves are radiated solely only from the scatter antenna 50*a*-*n* at step S4 of the calibration process of FIG. 3, step S34 of the amplitude adjustment process of FIG. 5 and step S54 of the phase adjustment process of FIG. 6. For example, as shown in FIG. 16, the rotating table 80 is rotated so that the cross-polarization discrimination of the receiving antenna 60*as* becomes substantially the maximum when the radio waves are radiated substantially solely only from the scatterer antenna 50*a*-2.

Generally speaking, when the receiving antenna 60a of the first preferred embodiment is an ideal half-wave dipole, the receiving antenna 60a does not receive the horizontally polarized radio waves. However, in practice, the horizontally polarized radio waves are received by the receiving antenna 60a due to the influences of a balun and cables (not shown) attached to the receiving antenna 60a. According to the present preferred embodiment, the rotating table 80 is rotated so that the azimuth in which the degree of cross-polarization discrimination of the receiving antenna 60as is larger is directed toward the scatterer antenna 50a-n when the radio waves are radiated substantially solely only from the scatterer antenna 50a-n. Therefore, the amplitude of the received signal S60a can be measured with accuracy higher than that of the first preferred embodiment, and the antenna evaluation apparatus can be calibrated with accuracy higher than that of the first preferred embodiment.

Eighth Preferred Embodiment

Figure 18:
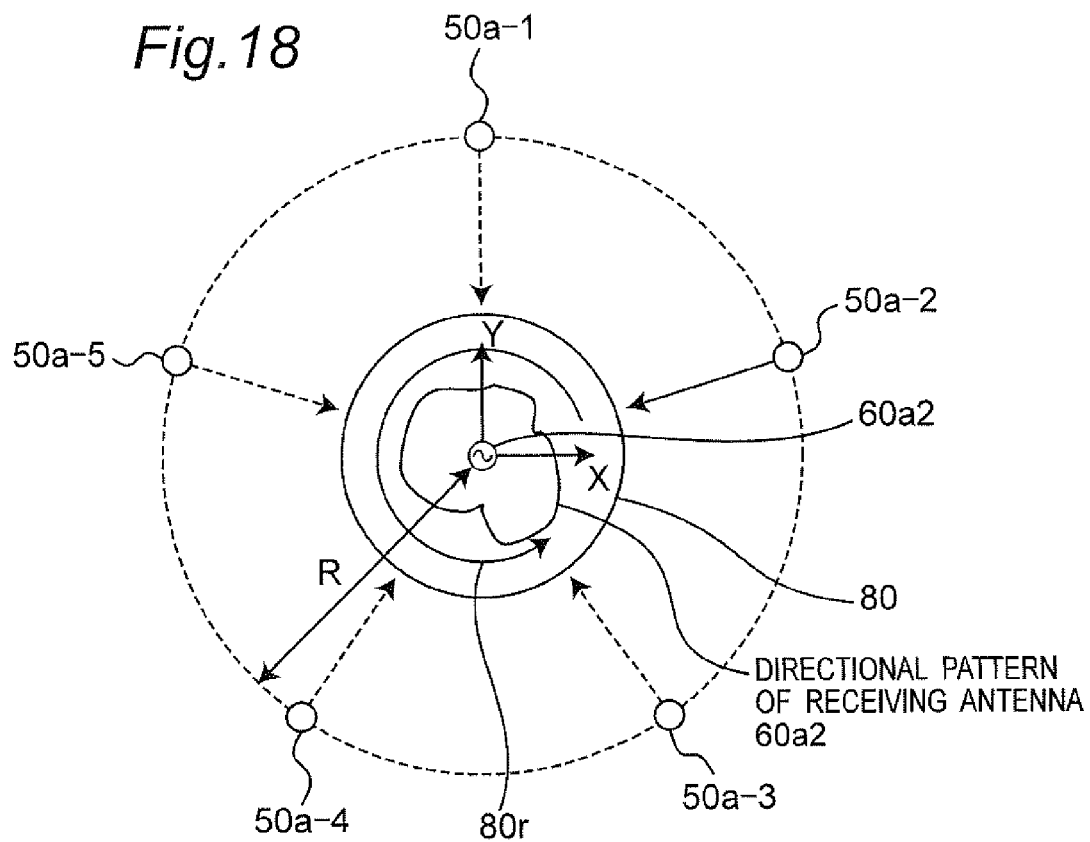
FIG. 18 is an explanatory view showing an arrangement of the scatterer antennas 50a-1 to 50a-5 and a receiving antenna 60a2 of an antenna evaluation apparatus according to an eighth preferred embodiment of the present invention.
Figure 19:
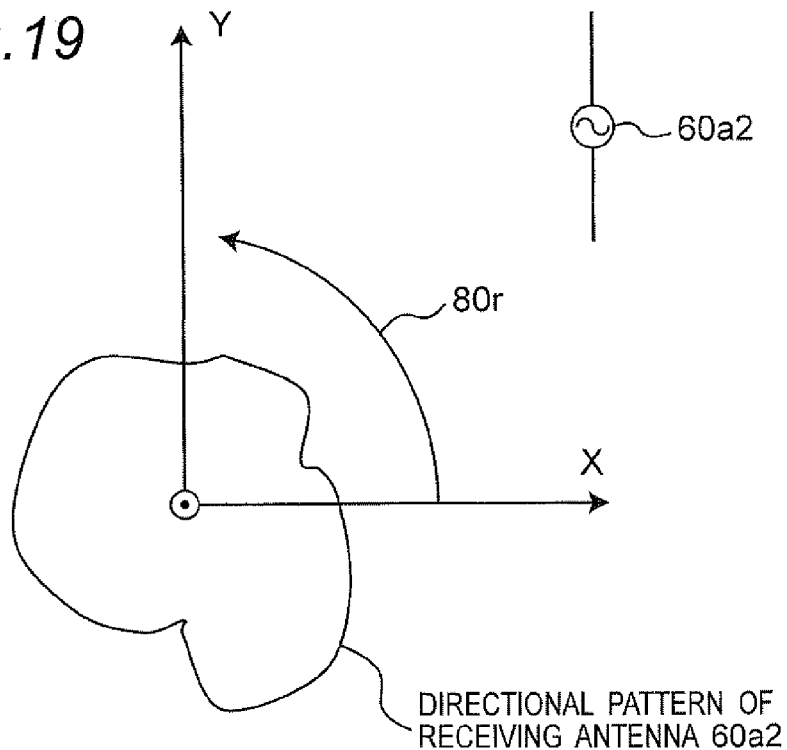
FIG. 19 is a characteristic graph showing a directional pattern of the receiving antenna 60a2 of FIG. 18.

FIG. 18 is an explanatory view showing an arrangement of the scatterer antennas 50a-1 to 50a-5 and a receiving antenna 60a2 of an antenna evaluation apparatus according to the eighth preferred embodiment of the present invention, and FIG. 19 is a characteristic graph showing a directional pattern of the receiving antenna 60a2 of FIG. 18. The present preferred embodiment is characterized in that a rotating table 80 is provided at the vertex portion of the receiving antenna support base 102, and the directional calibration receiving antenna 60a2 placed on the rotating table 80 is used instead of the omni-directional calibration receiving antenna 60a during calibration of the antenna evaluation apparatus, as compared with the first preferred embodiment.

As shown in FIG. 19, the receiving antenna 60a2 has directivity on the XY plane. The computer 10 executes a calibration process (See FIG. 3) similar to that of the first preferred embodiment. As compared with the first preferred embodiment, it is noted that, subsequently to step S3 of the calibration process of FIG. 3, the processes of steps S4 and S5 are executed every time the rotating table 80 is rotated by 360/K degrees. Then, based on an average value of K amplitudes and an average value of K phases obtained by rotating by one turn the receiving antenna 60a2 by repetitively rotating the rotating table 80 K times by 360/K degrees, the processes of step S6 and subsequent steps are executed. In a manner similar to above, subsequently to step S33 of the amplitude adjustment process of FIG. 5, the processes of step S34 and S35 are executed every time the rotating table 80 is rotated K times by 360/K degrees. Then, based on the average value of obtained K amplitudes, the processes of step S36 and subsequent steps are executed. Further, in a manner similar to above, subsequently to step S54 of the phase adjustment process of FIG. 6, the processes of step S55 and S56 are executed every time the rotating table 80 is rotated K times by 360/K degrees. Then, based on an average value of obtained K amplitudes, the processes of step S57 and subsequent steps are executed. It is noted that the parameter K is set to a value of equal to or larger than the total number of five of the scatterer antennas 50a-1 to 50a-5.

According to the present preferred embodiment, when the radio waves are radiated solely only from the scatterer antenna 50a-n, the amplitude average value and the phase average value of the received signal S60a are calculated by rotating the receiving antenna 60a2 K times by 360/K degrees, and the calibration is executed by using the amplitude average value and the phase average value. Therefore, the calibration of the antenna evaluation apparatus can be executed more simply with high accuracy by using the directional receiving antenna 60a2 in a manner similar to that of the first preferred embodiment.

First Modified Preferred Embodiment of First Preferred Embodiment

Figure 20:
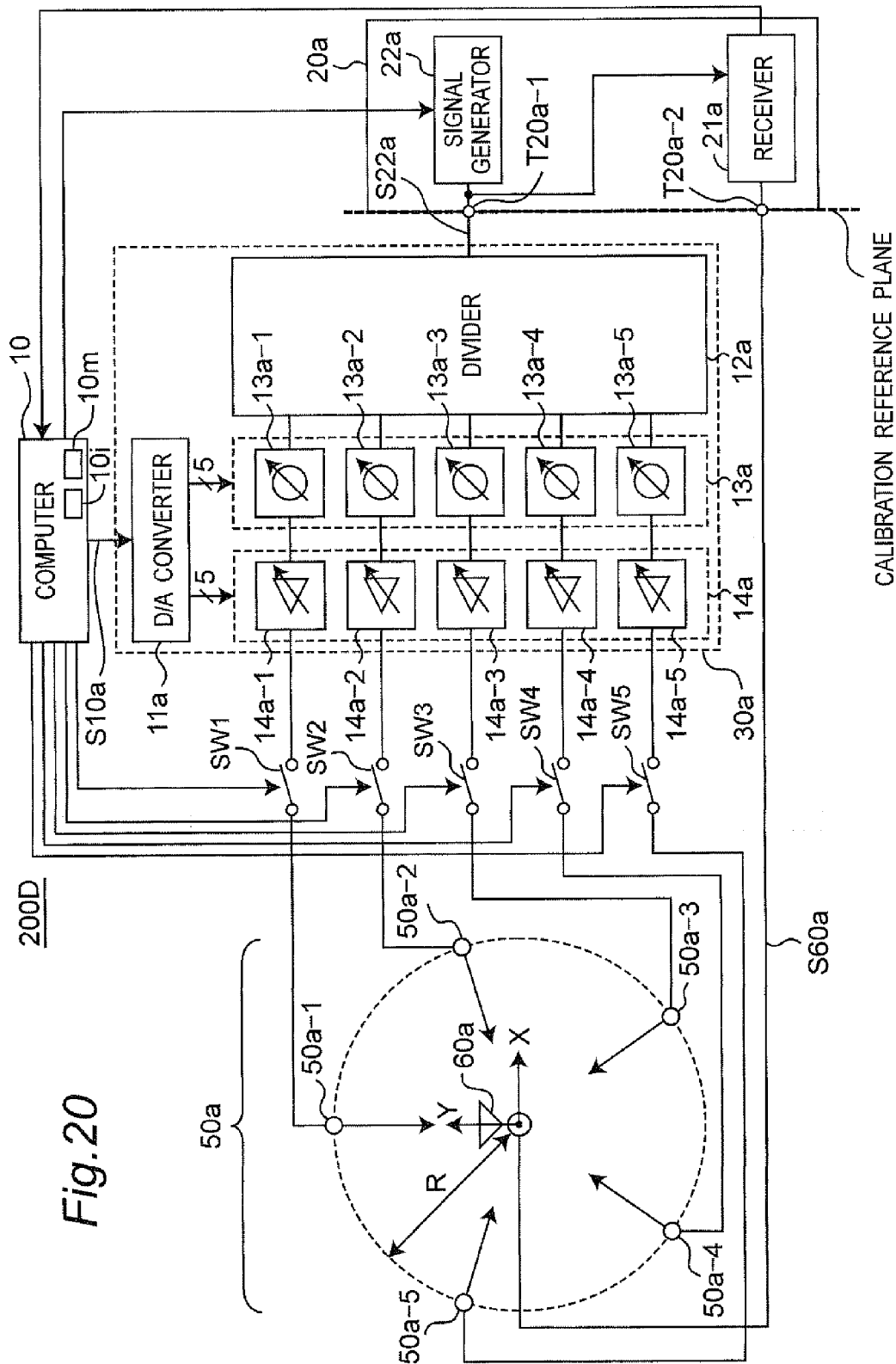
FIG. 20 is a block diagram showing a configuration of a multiple wave controlling and measuring apparatus 200D according to a first modified preferred embodiment of the first preferred embodiment of the present invention.
Figure 21:
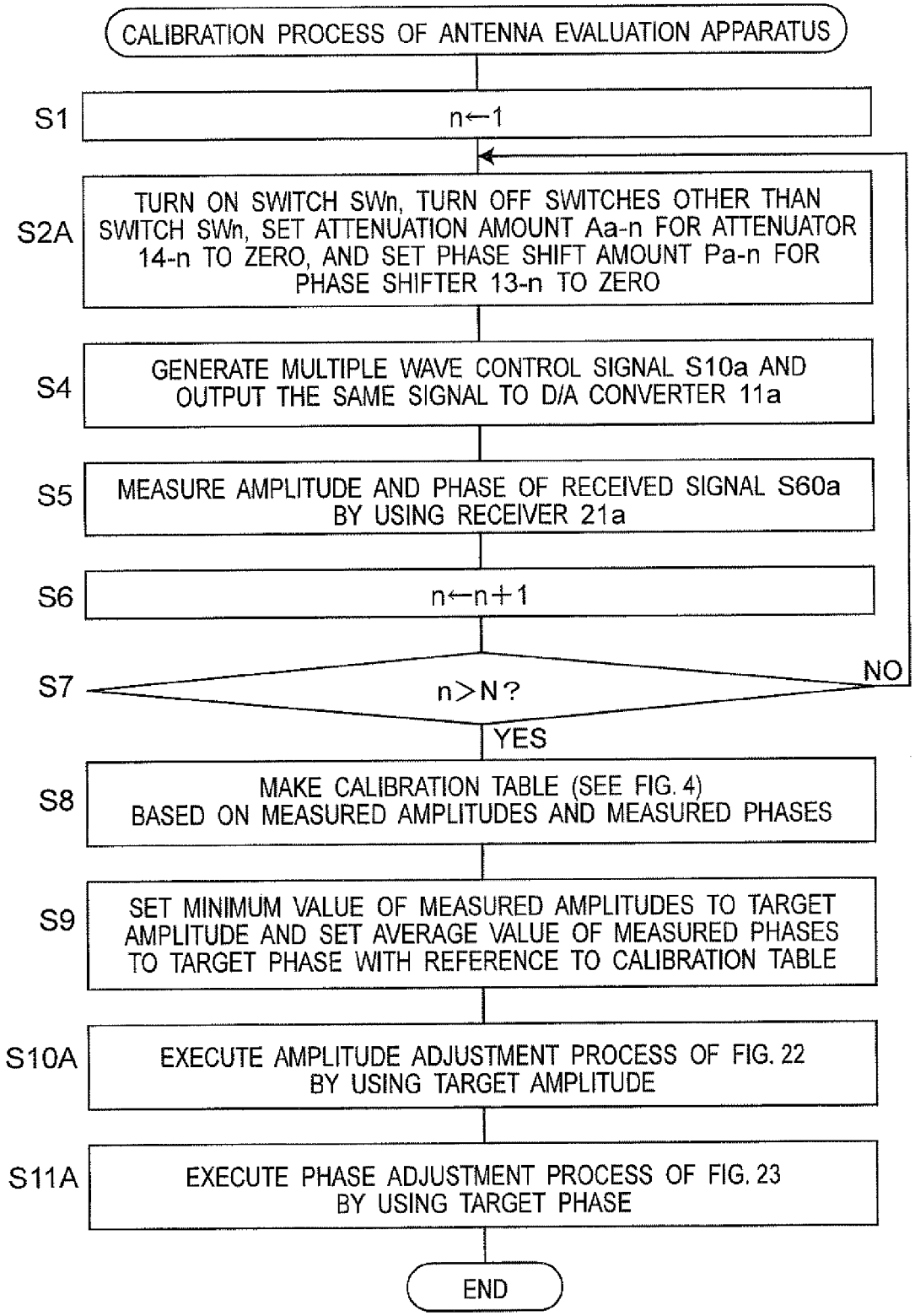
FIG. 21 is a flow chart showing an antenna evaluation apparatus calibration process which is executed by the computer 10 of FIG. 20.
Figure 22:
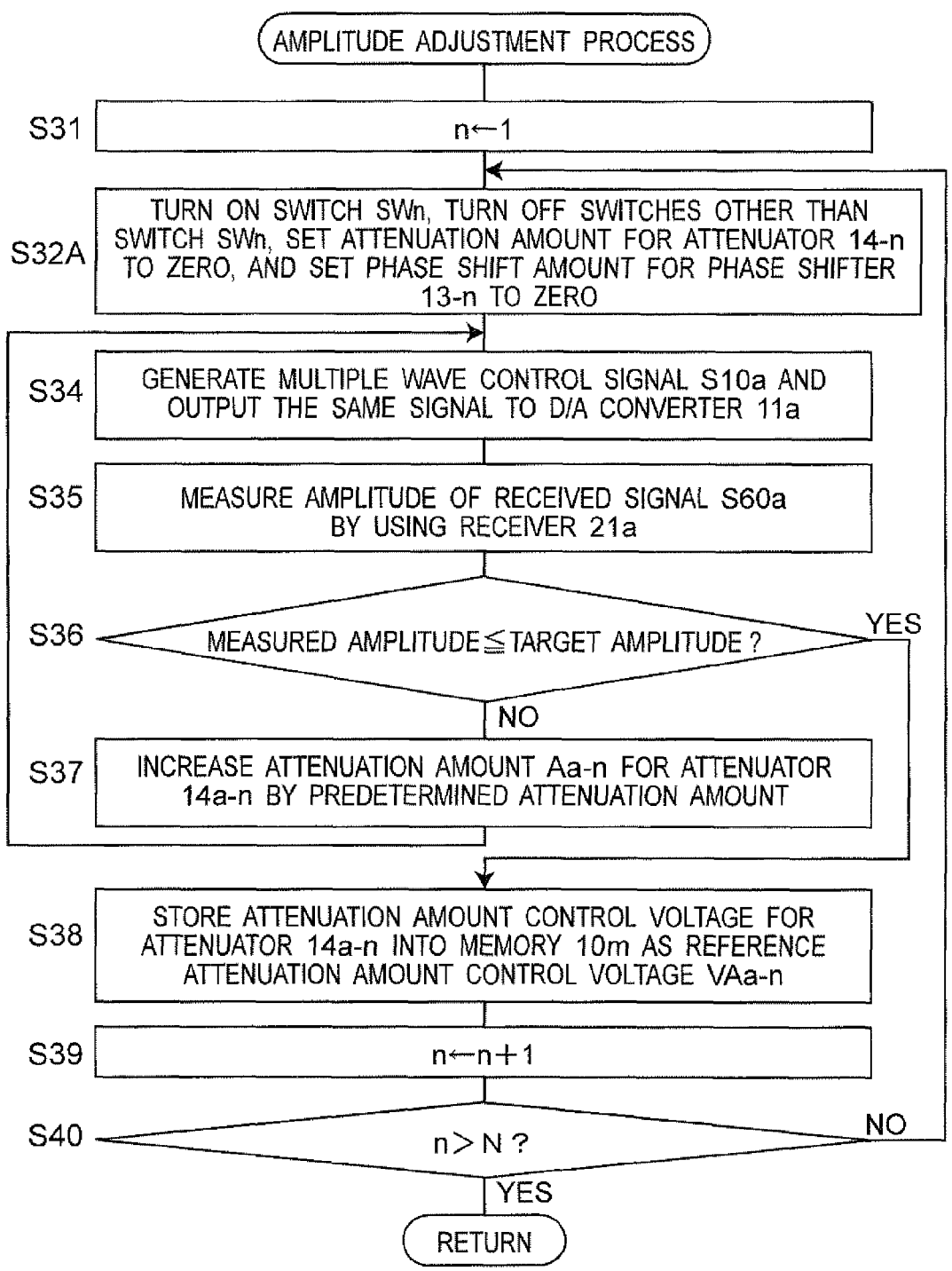
FIG. 22 is a flow chart showing an amplitude adjustment process which is executed at step S10A of FIG. 21.
Figure 23:
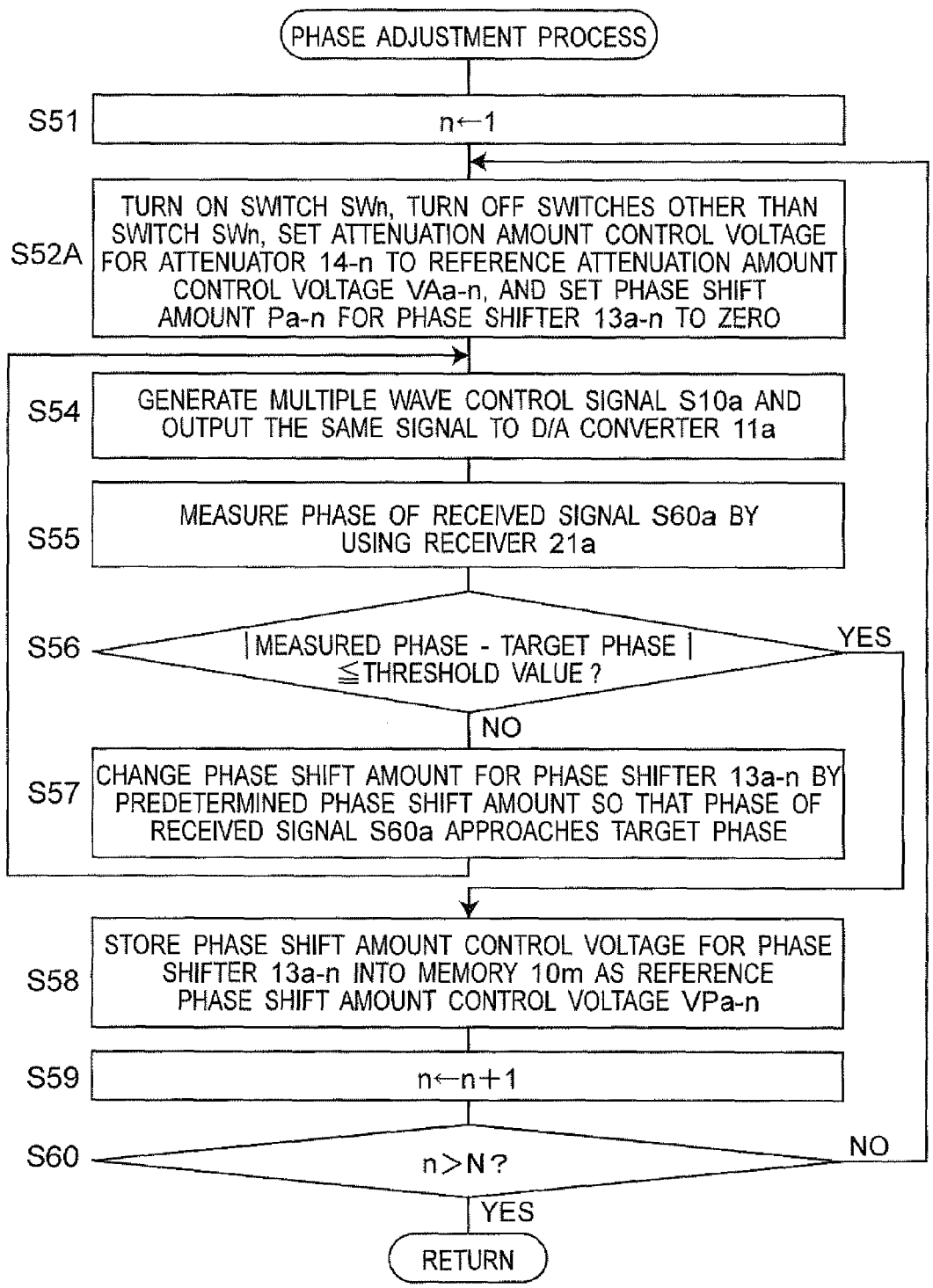
FIG. 23 is a flow chart showing a phase adjustment process which is executed at step S11A of FIG. 22.

FIG. 20 is a block diagram showing a configuration of a multiple wave controlling and measuring apparatus 200D according to the first modified preferred embodiment of the first preferred embodiment of the present invention. FIG. 21 is a flow chart showing a calibration process of the antenna evaluation apparatus executed by the computer 10 of FIG. 20, FIG. 22 is a flow chart showing an amplitude adjustment process which is executed at step S10A of FIG. 21, and FIG. 23 is a flow chart showing a phase adjustment process which is executed at step S11A of FIG. 22. The present modified preferred embodiment is characterized by further including switches SW1 to SW5, as compared with the first preferred embodiment.

Referring to FIG. 20, the switch SW1 is inserted between the scatterer antenna 50a-1 and the attenuator 14a-1, and the switch SW2 is inserted between the scatterer antenna 50a-2 and the attenuator 14a-2, and the switch SW3 is inserted between the scatterer antenna 50a-3 and the attenuator 14a-3. The switch SW4 is inserted between the scatterer antenna 50a-4 and the attenuator 14a-4, and the switch SW5 is inserted between the scatterer antenna 50a-5 and the attenuator 14a-5. The computer 10 controls on/off operations of the respective switches SW1 to SW5.

As compared with the calibration process (See FIG. 3) of the antenna evaluation apparatus of the first preferred embodiment, the calibration process of the antenna evaluation apparatus of FIG. 21 is obtained by replacing the processes at steps S2 and S3 with process at step S2A, and replacing the processes at steps S10 and S11 with the processes at steps S10A and S11A. At step S2A of FIG. 21, the computer 10 turns on the switch SWn, turns off the switches other than the switch SWn, sets the attenuation amount for the attenuator 14-n to zero, and sets the phase shift amount for the phase shifter 13-n to zero. In addition, the amplitude adjustment process of FIG. 22 is executed by using the target amplitude at step S10A, and the phase adjustment process of FIG. 23 is executed by using the target phase at step S11A.

As compared with the amplitude adjustment process (See FIG. 5) of the first preferred embodiment, the amplitude adjustment process of FIG. 22 is obtained by replacing the processes at steps S32 and S33 with step S32A. At step S32A, the computer 10 turns on the switch SWn, turns off the switches other than the switch SWn, sets the attenuation amount for the attenuator 14-n to zero, and sets the phase shift amount for the phase shifter 13-n to zero. In addition, as compared with the phase adjustment process (See FIG. 6) of the first preferred embodiment, the phase adjustment process of FIG. 23 is obtained by replacing the processes at steps S52 and step S53 with the process at step S52A. At step S52A, the computer 10 turns on the switch SWn, turns off the switches other than the switch SWn, sets the attenuation amount control voltage for the attenuator 14-n to the reference attenuation amount control voltage VAa-n, and sets the phase shift amount Pa-n for the phase shifter 13a-n to zero.

In addition, the computer 10 executes the evaluation process of FIG. 7 after turning on all of the switches SW1 to SW5.

According to the present modified preferred embodiment, connections between the scatterer antennas other than the scatterer antenna that transmits the radio wave and the transmitter circuit 30a are broken when the radio waves are transmitted solely from the respective scatterer antennas 50a-1 to 50a-5. Therefore, the antenna evaluation apparatus can be calibrated with accuracy higher than that of the first preferred embodiment.

It is acceptable to insert the switch SW1 between the divider 12a and the phase shifter 13a-1, insert the switch SW2 between the divider 12a and the phase shifter 13a-2, insert the switch SW3 between the divider 12a and the phase shifter 13a-3, insert the switch SW4 between the divider 12a and the phase shifter 13a-4 and insert the switch SW5 between the divider 12a and the phase shifter 13a-5. In this case, the attenuation amounts for the attenuators other than the attenuator 14a-n are set to the maximum values thereof at steps S2A, S32A and S52A.

Second Modified Preferred Embodiment of First Preferred Embodiment

Figure 24:
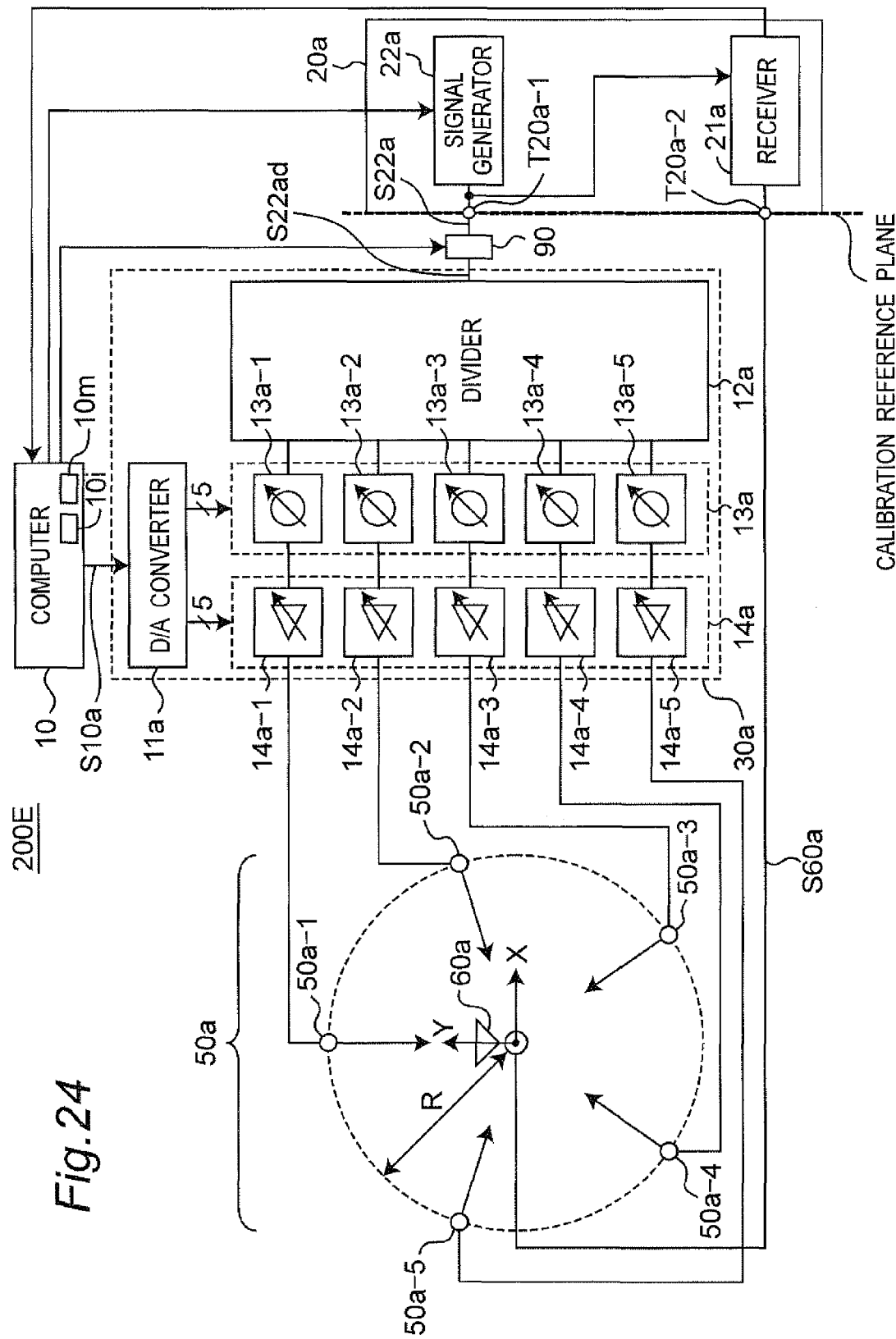
FIG. 24 is a block diagram showing a configuration of a multiple wave controlling and measuring apparatus 200E according to a second modified preferred embodiment of the first preferred embodiment of the present invention.
Figure 25:
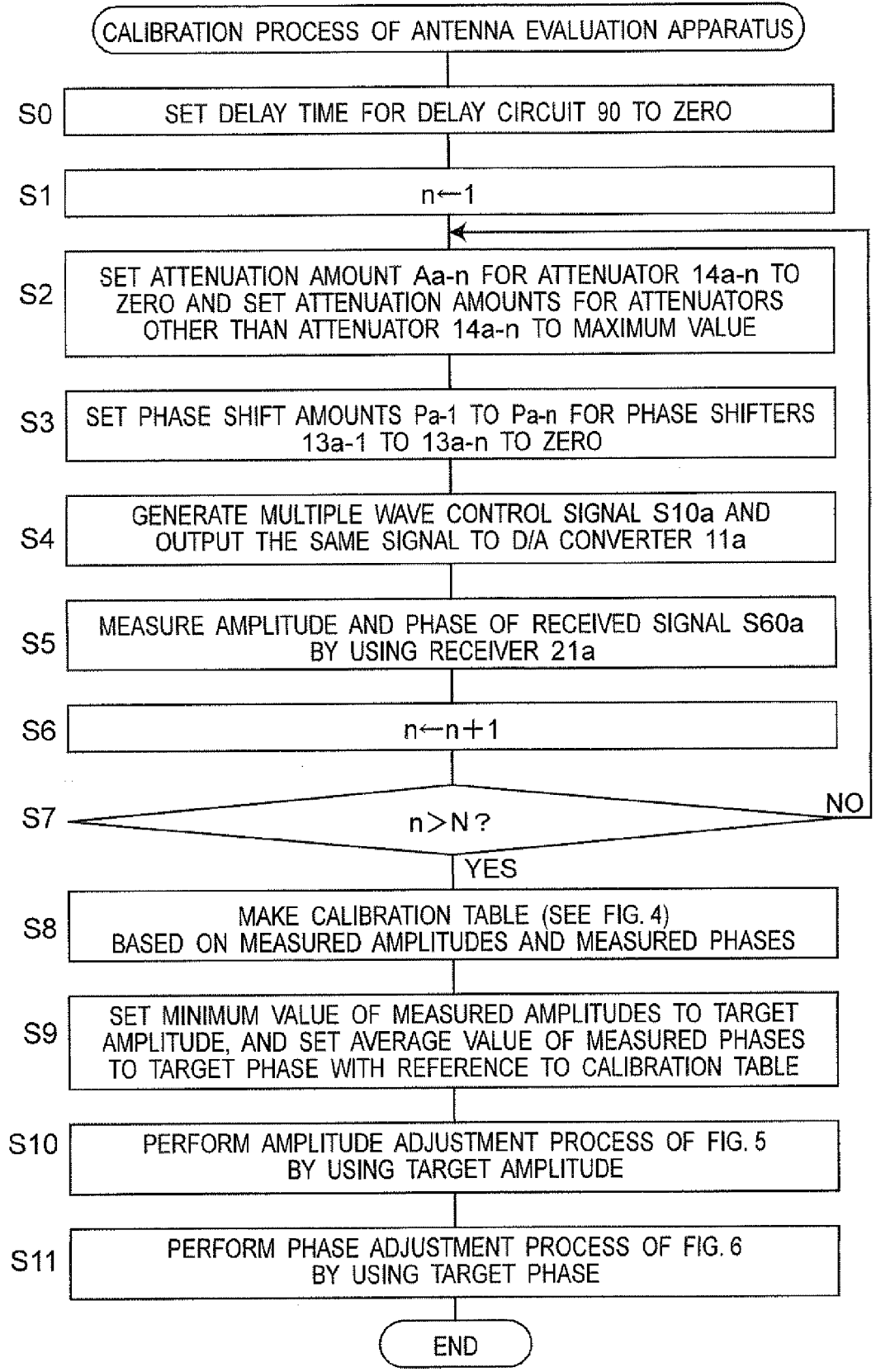
FIG. 25 is a flow chart showing an antenna evaluation apparatus calibration process which is executed by the computer 10 of FIG. 24.

FIG. 24 is a block diagram showing a configuration of a multiple wave controlling and measuring apparatus 200E according to the second modified preferred embodiment of the first preferred embodiment of the present invention. FIG. 25 is a flow chart showing a calibration process of the antenna evaluation apparatus executed by the computer 10 of FIG. 24. The present preferred embodiment is characterized by further including a delay circuit 90 for generating a transmitting signal S22ad by delaying the transmitting signal S22a from the signal generator 22a by a predetermined delay time and outputting the same signal to the divider 12a, as compared with the first preferred embodiment. The computer 10 controls the delay circuit 90 so as to delay the transmitting signal S22a by the predetermined delay amount. In addition, the divider 12a divides the transmitting signal S22ad in five transmitting signals, and outputs resulting signals to the phase shifters 13a-1 to 13a-5, respectively.

The calibration process of the antenna evaluation apparatus of FIG. 25 is different from the calibration process (See FIG. 3) of the antenna evaluation apparatus of the first preferred embodiment in the point that the process at step S0 is first executed before the process at step S1. At step S0, the computer 10 sets the delay time for the delay circuit 90 to zero. The computer 10 sets the delay time to zero during the calibration process of FIG. 25, and sets the delay time to a predetermined value (including zero) during the evaluation process of FIG. 7.

The present modified preferred embodiment exhibits advantageous effects similar to those of the first preferred embodiment. Although the delay time in the delay circuit 90 is set to zero at step S0 in the present modified preferred embodiment, however, the present invention is not limited to this, and the delay time may be to a predetermined value other than zero.

Third Modified Preferred Embodiment of First Preferred Embodiment

Figure 26:
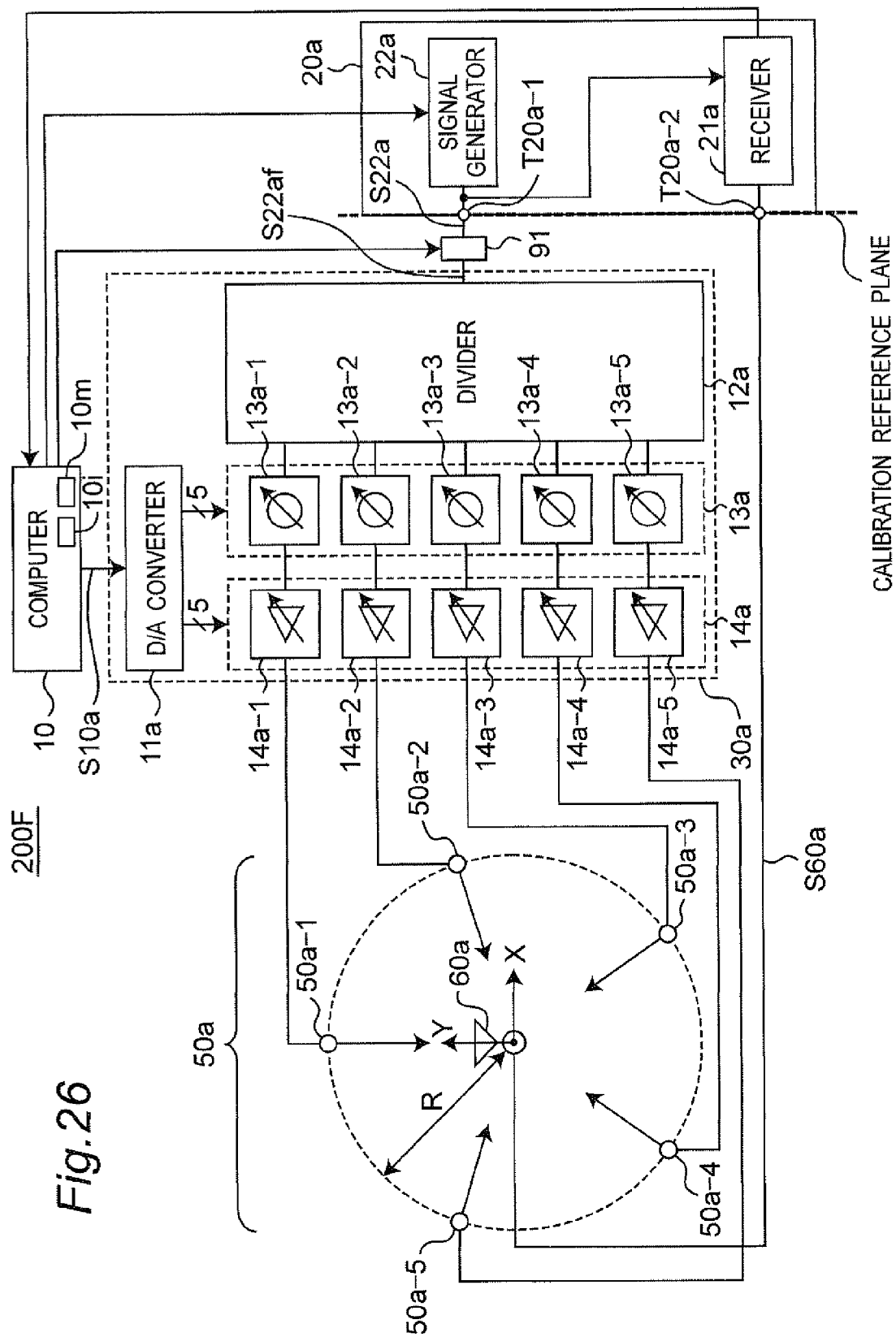
FIG. 26 is a block diagram showing a configuration of a multiple wave controlling and measuring apparatus 200F according to a third modified preferred embodiment of the first preferred embodiment of the present invention.
Figure 27:
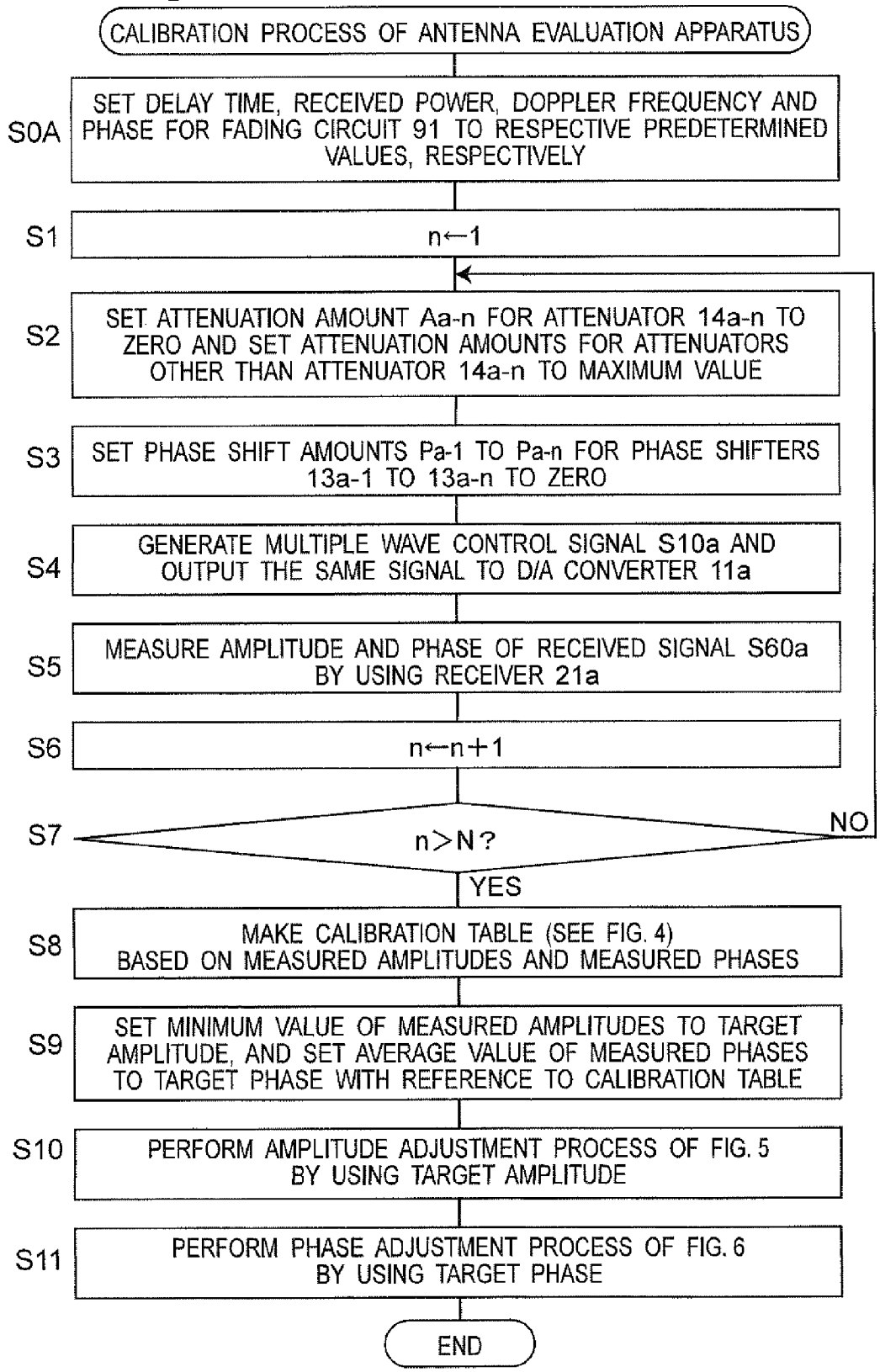
FIG. 27 is a flow chart showing an antenna evaluation apparatus calibration process which is executed by the computer 10 of FIG. 26.

FIG. 26 is a block diagram showing a configuration of a multiple wave controlling and measuring apparatus 200F according to the third modified preferred embodiment of the first preferred embodiment of the present invention. FIG. 27 is a flow chart showing a calibration process of the antenna evaluation apparatus executed by the computer 10 of FIG. 26. The present modified preferred embodiment is characterized by further including a fading circuit 91 that generates a transmitting signal S22af by executing a predetermined fading generation process on the transmitting signal S22a from the signal generator 22a, and outputs the transmitting signal S22af to the divider 12a, as compared with the first preferred embodiment. The fading circuit 91 adds predetermined delay time and phase adjustment amount to the transmitting signal S22a, and outputs a resulting signal. The fading circuit 91 virtually sets conditions such as the directivity of the receiving antenna 60a, information of incoming waves and mobile velocity under the control of the computer 10, and outputs a signal that would be received when the receiving antenna 60a is moved. The output signal includes temporal variations corresponding to fading. Thus, the fading circuit 91 can virtually generate fading caused by the movement of the receiving antenna 60a. Concretely speaking, the fading circuit 91 is constituted, based on a fading simulator as disclosed in the Patent Document 2, to add the predetermined delay time and phase adjustment amount to the transmitting signal S22a based on a fading control signal including respective parameters of the delay time, the received power, the Doppler frequency and the phase from the computer 10, and to output a resulting signal to the divider 12a as the transmitting signal S22af. The divider 12a divides the transmitting signal S22af into five transmitting signals, and outputs resulting signals to the phase shifters 13a-1 to 13a-5, respectively.

The calibration process of the antenna evaluation apparatus of FIG. 27 is different from the calibration process (See FIG. 3) of the antenna evaluation apparatus of the first preferred embodiment in the point that the process at step S0A is first executed before the process at step S1. At step S0A, the computer 10 sets the delay time, the received power, the Doppler frequency and the phase in the fading circuit 91 to the respective predetermined values. Concretely speaking, the delay time is set to zero, and the received power is set to the maximum value. The Doppler frequency is set to 0 Hz, and the phase is set to a constant value. On the other hand, during the evaluation process of FIG. 7, the computer 10 sets the delay time, the received power, the Doppler frequency and the phase so that a predetermined fading environment is generated.

The present modified preferred embodiment exhibits advantageous effects similar to those of the first preferred embodiment. It is acceptable to set the delay time, the received power, the Doppler frequency and the phase to respective values other than the respective predetermined values described above at step S0A.

First Modified Preferred Embodiment of Second Preferred Embodiment

Figure 28:
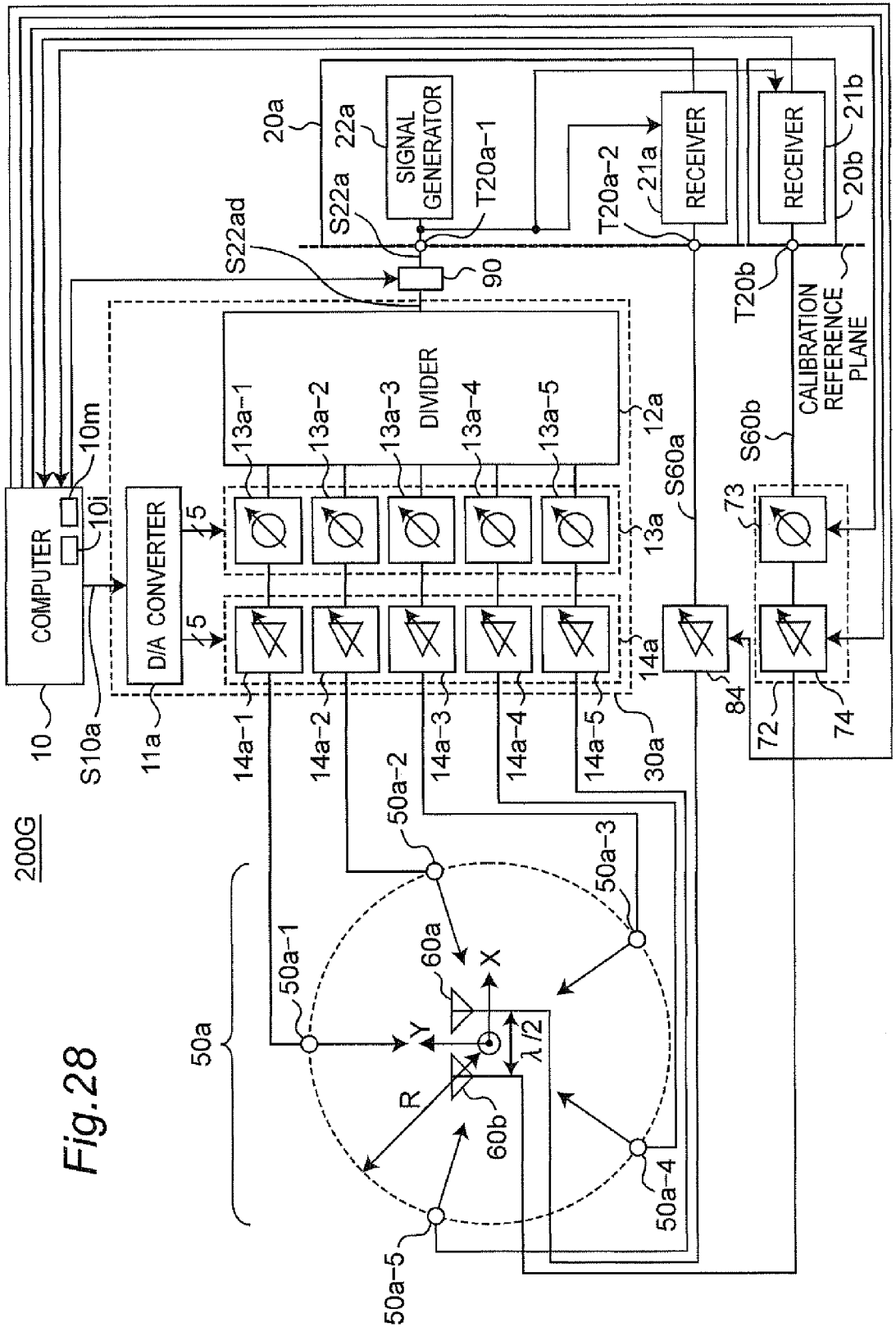
FIG. 28 is a block diagram showing a configuration of a multiple wave controlling and measuring apparatus 200G according to a first modified preferred embodiment of the second preferred embodiment of the present invention.

FIG. 28 is a block diagram showing a configuration of a multiple wave controlling and measuring apparatus 200G according to the first modified preferred embodiment of the second preferred embodiment of the present invention. The present modified preferred embodiment is characterized by further including the delay circuit 90 for generating the transmitting signal S22ad by delaying the transmitting signal S22a from the signal generator 22a by a predetermined delay time, and outputting the same signal to the divider 12a in a manner similar to that of the second modified preferred embodiment of the first preferred embodiment, as compared with the second preferred embodiment. The computer 10 controls the delay circuit 90 so as to delay the transmitting signal S22a by the predetermined delay amount described above. In addition, the divider 12a divides the transmitting signal S22ad into five transmitting signals, and outputs resulting signals to the phase shifters 13a-1 to 13a-5, respectively.

Referring to FIG. 28, the computer 10 first sets the delay time in the delay circuit 90 to zero when the computer 10 executes the calibration process of the antenna evaluation apparatus of FIG. 9. The computer 10 sets the delay time to zero during the calibration process, and sets the delay time to a predetermined value (including zero) during the evaluation process.

The present modified preferred embodiment exhibits advantageous effects similar to those of the second preferred embodiment. The delay time is set to zero during the calibration process in the present modified preferred embodiment, however, the present invention is not limited to this, and the delay time may be set to a predetermined value other than zero.

Second Modified Preferred Embodiment of Second Preferred Embodiment

Figure 29:
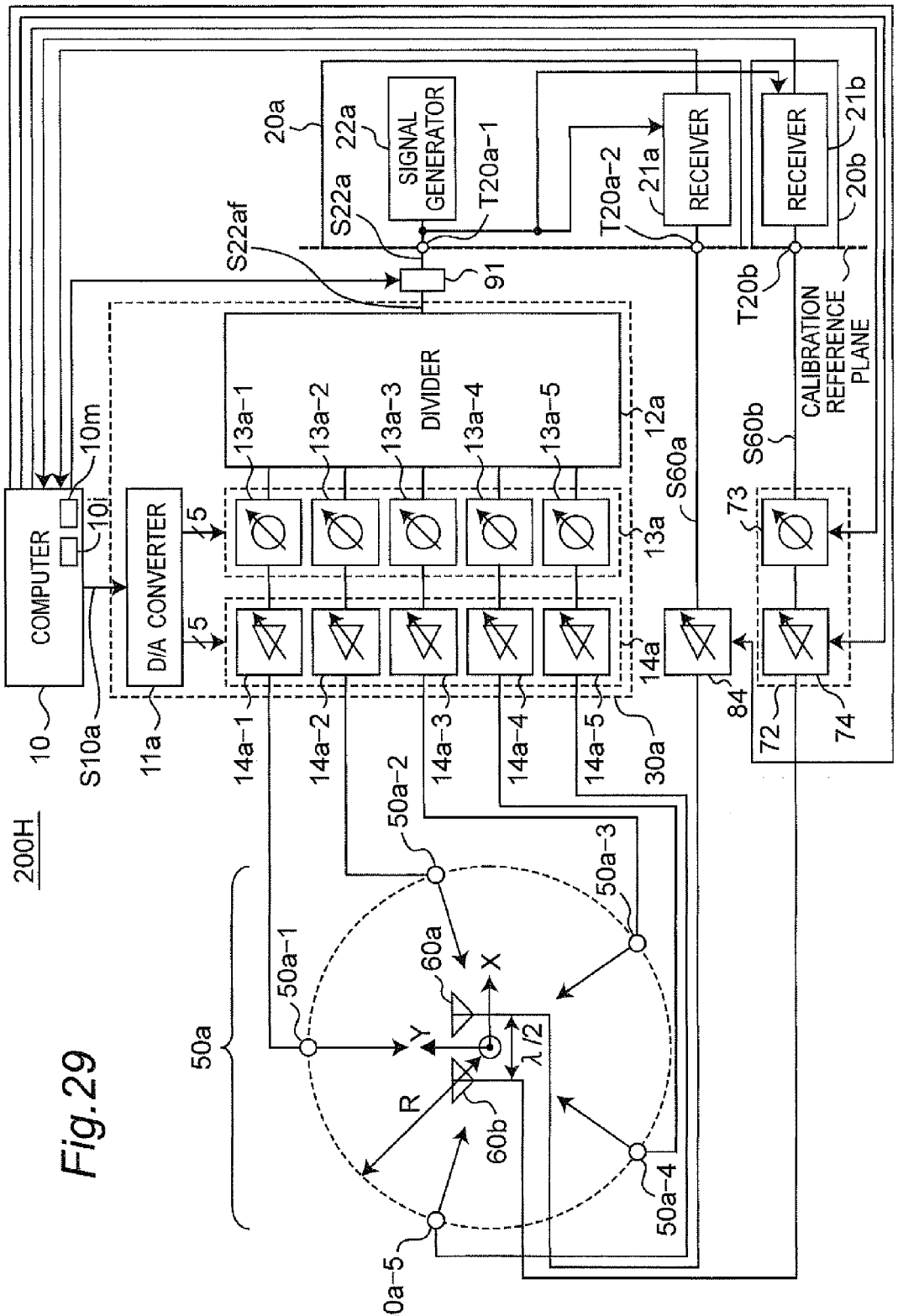
FIG. 29 is a block diagram showing a configuration of a multiple wave controlling and measuring apparatus 200H according to a second modified preferred embodiment of the second preferred embodiment of the present invention.

FIG. 29 is a block diagram showing a configuration of a multiple wave controlling and measuring apparatus 200H according to the second modified preferred embodiment of the second preferred embodiment of the present invention. The present modified preferred embodiment is characterized by further including the fading circuit 91 for generating the transmitting signal S22af by executing a predetermined fading generation process on the transmitting signal S22a from the signal generator 22a, and for outputting a resulting signal to the divider 12a in a manner similar to that of the third modified preferred embodiment of the first preferred embodiment, as compared with the second preferred embodiment. In addition, the divider 12a divides the transmitting signal S22af into five transmitting signals, and outputs resulting signals to the phase shifters 13a-1 to 13a-5, respectively.

Referring to FIG. 29, the computer 10 first sets the delay time, the received power, the Doppler frequency and the phase in the fading circuit 91 to respective predetermined values when the computer 10 executes the calibration process of the antenna evaluation process. Concretely speaking, the delay time is set to zero, and the received power is set to the maximum value. The Doppler frequency is set to 0 Hz, and the phase is set to a constant value. On the other hand, during the evaluation process, the computer 10 sets the delay time, the received power, the Doppler frequency and the phase so that a predetermined fading environment is generated.

The present modified preferred embodiment exhibits advantageous effects similar to those of the second preferred embodiment. It is acceptable to set the delay time, the received power, the Doppler frequency and the phase to respective values other than the respective predetermined values described above during the calibration process of the antenna evaluation apparatus.

First Modified Preferred Embodiment of Third Preferred Embodiment

Figure 30:
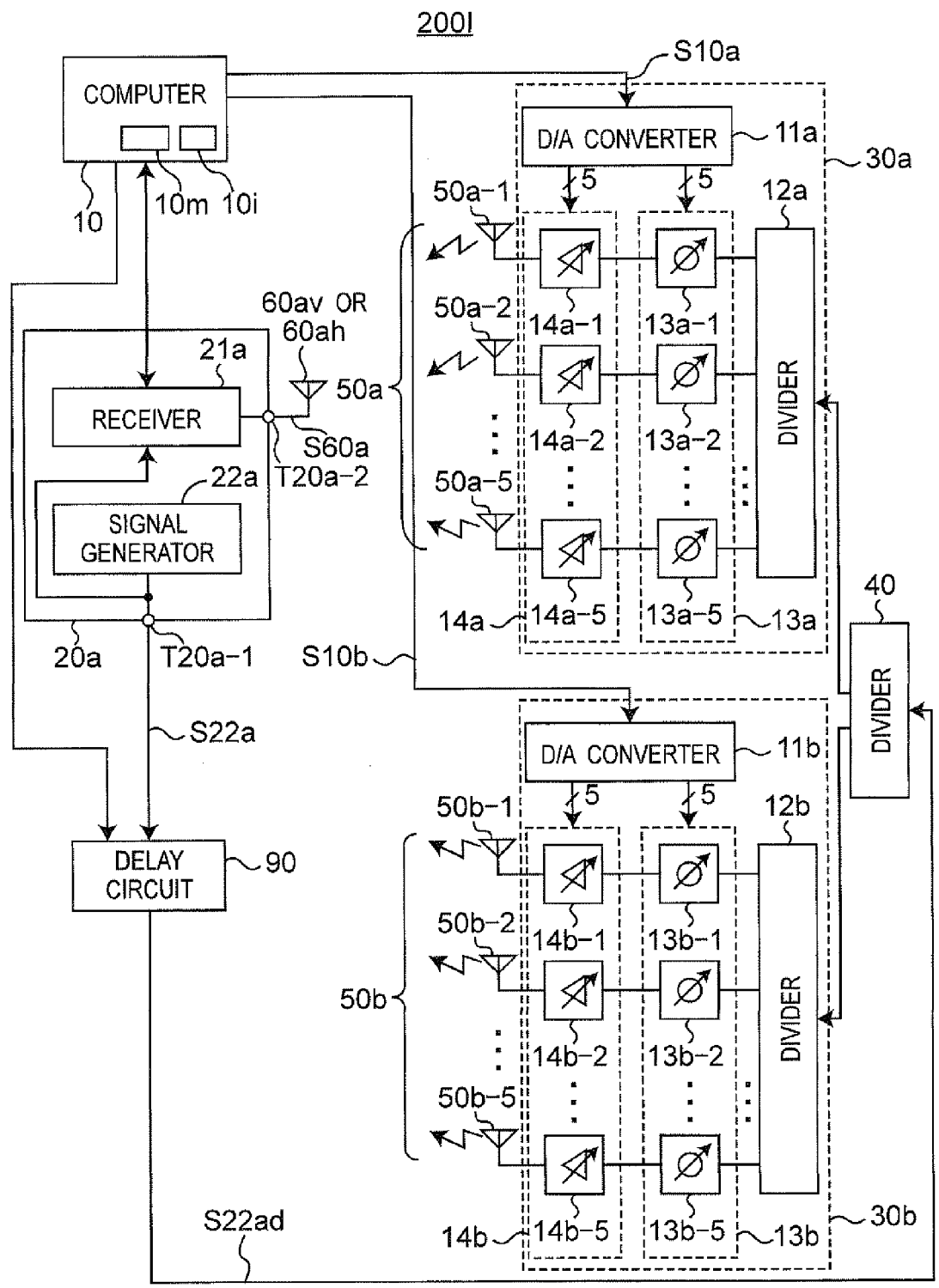
FIG. 30 is a block diagram showing a configuration of a multiple wave controlling and measuring apparatus 200I according to a first modified preferred embodiment of the third preferred embodiment of the present invention.

FIG. 30 is a block diagram showing a configuration of a multiple wave controlling and measuring apparatus 200I according to the first modified preferred embodiment of the third preferred embodiment of the present invention. The present modified preferred embodiment is characterized by further including the delay circuit 90 for generating the transmitting signal S22ad by delaying the transmitting signal S22a from the signal generator 22a by a predetermined delay time, and outputting the same signal to the divider 40 in a manner similar to that of the second modified preferred embodiment of the first preferred embodiment, as compared with the third preferred embodiment. The computer 10 controls the delay circuit 90 so as to delay the transmitting signal S22a by the predetermined delay amount. In addition, the divider 40 divides the transmitting signal S22ad into two transmitting signals, and outputs resulting signals to the dividers 12a and 12b, respectively.

Referring to FIG. 30, the computer 10 first sets the delay time in the delay circuit 90 to zero when executing the calibration process of the antenna evaluation apparatus of FIG. 9. The computer 10 sets the delay time to zero during the calibration process, and sets the delay time to a predetermined value (including zero) during the evaluation process.

The present modified preferred embodiment exhibits advantageous effects similar to those of the third preferred embodiment. The delay time in the delay circuit 90 is set to zero during the calibration process in the present modified preferred embodiment, however, the present invention is not limited to this, and the delay time may be set to a predetermined value other than zero.

Second Modified Preferred Embodiment of Third Preferred Embodiment

Figure 31:
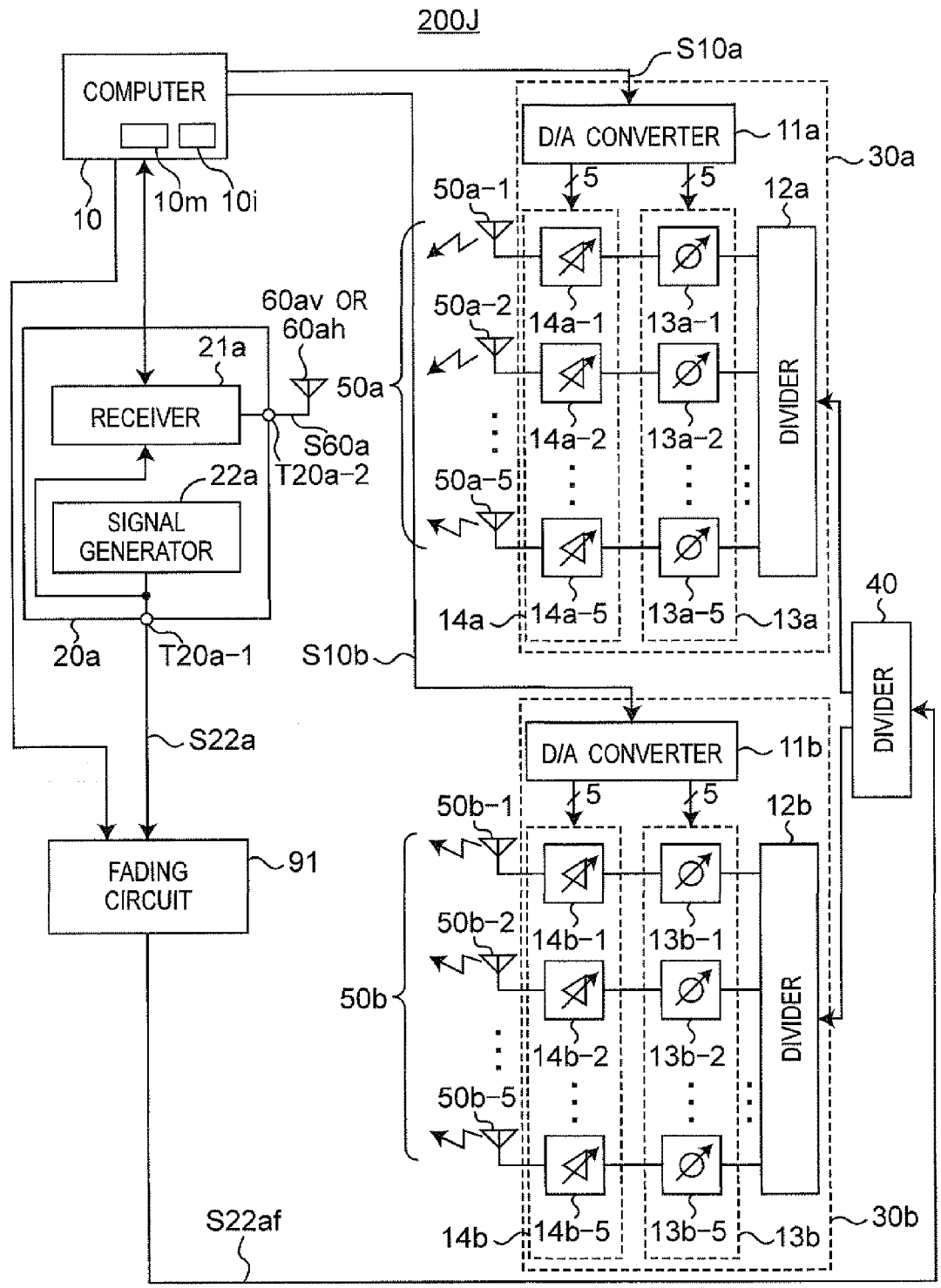
FIG. 31 is a block diagram showing a configuration of a multiple wave controlling and measuring apparatus 200J according to a second modified preferred embodiment of the third preferred embodiment of the present invention.
Figure 32:
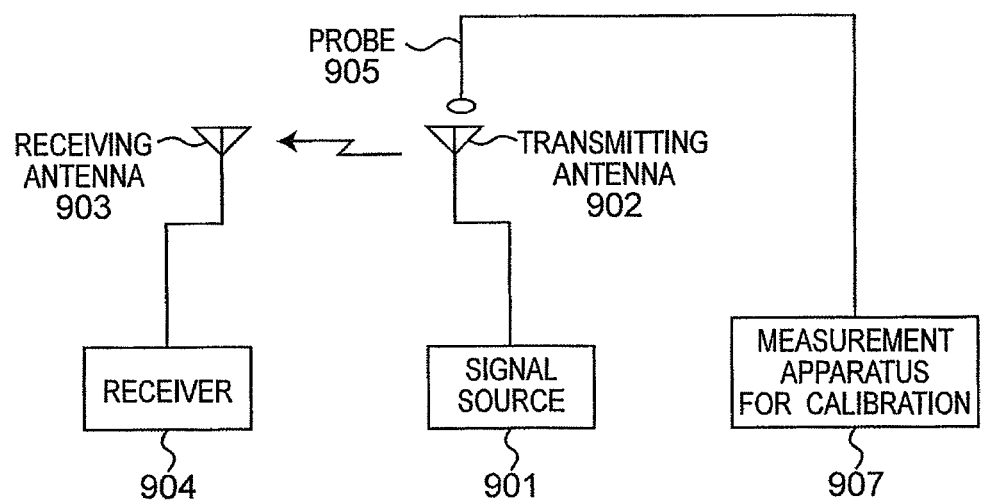
FIG. 32 is a block diagram for explaining a near field calibration method according to a prior art.

FIG. 31 is a block diagram showing the configuration of a multiple wave controlling and measuring apparatus 200J according to the second modified preferred embodiment of the third preferred embodiment of the present invention. The present modified preferred embodiment is characterized by further including the fading circuit 91 for generating the transmitting signal S22af by executing a predetermined fading generation process for the transmitting signal S22a from the signal generator 22a, and outputting the same signal to the divider 40 in a manner similar to that of the third modified preferred embodiment of the first preferred embodiment, as compared with the third preferred embodiment. In addition, the divider 40 divides the transmitting signal S22af into two transmitting signals, and outputs resulting signals to the dividers 12a and 12b, respectively.

Referring to FIG. 29, the computer 10 first sets the delay time, the received power, the Doppler frequency and the phase in the fading circuit 91 to respective predetermined values when the computer 10 executes the calibration process of the antenna evaluation process. Concretely speaking, the delay time is set to zero, and the received power is set to the maximum value. The Doppler frequency is set to 0 Hz, and the phase is set to a constant value. On the other hand, during the evaluation process, the computer 10 sets the delay time, the received power, the Doppler frequency and the phase so that a predetermined fading environment is generated.

The present modified preferred embodiment exhibits advantageous effects similar to those of the third preferred embodiment. It is acceptable to set the delay time, the received power, the Doppler frequency and the phase to respective values other than the respective predetermined values described above during the calibration process of the antenna evaluation apparatus.

Although each of the transmitter circuits 30a and 30b divides the inputted transmitting signal into five transmitting signals, and change the phases and the amplitudes of the respective divided transmitting signals in each of the preferred embodiments and the modified preferred embodiments, however, the present invention is not limited to this. The inputted transmitting signal may be divided into a plurality of two or more transmitting signals, and the phases and the amplitudes of the respective divided transmitting signals may be changes.

In addition, the scatterer antennas 50a-1 to 50a-5 and 50b-1 to 50b-5 are arranged at equal intervals on the circumference of a circle in each of the preferred embodiments and the modified preferred embodiments, however, the present invention is not limited to this. It is proper to place a plurality of two or more scatterer antennas at the periphery of the receiving antenna to be evaluated.

Further, the transmitter circuit 30a attenuates the phase-shifted transmitting signals in the attenuator circuit 14a in each of the preferred embodiments and the modified preferred embodiments, however, the present invention is not limited to this. An amplifier to amplify the phase-shifted transmitting signals may be provided instead of the attenuator circuit 14a. In this case, the target amplitude is set to the maximum value of the received signals S60a of the radio waves radiated solely from the respective scatterer antenna 50a-n. The attenuator circuit 14b may also be replaced with an amplifier circuit in a manner similar to that of the attenuator circuit 14a. In addition, it is acceptable to provide an amplifier instead of the attenuators 72 and 84 in the second preferred embodiment.

INDUSTRIAL APPLICABILITY

As described above in detail, according to the antenna evaluation apparatus and the antenna evaluation method of the present invention, the transmitter means is controlled to radiate the radio waves solely from the respective scatterer antennas. Then, based on the radio waves radiated solely from the respective scatterer antennas, calibration is executed to control the transmitter means so that the amplitudes of the received signals each measured by using a calibration receiving antenna instead of the receiving antenna under evaluation coincides with an identical target amplitude and the phases of the received signals each measured coincides with an identical target phase, and to store amplitude change amounts and phase shift amounts for use in the transmitter means for the respective scatterer antennas into a storage unit. Therefore, it is possible to remove the influences of the passing loss, which is caused in the entire path between the transmitter means and the receiver means, on the amplitude and the phase of the received signal, and it is possible to execute the calibration more easily with accuracy higher than that of the prior art. This leads to improved evaluation accuracy of the receiving antenna under evaluation.

REFERENCE SIGNS LIST

10 . . . computer;
10m . . . memory;
10i . . . input device;
11a and 11b . . . D/A converter;
12a and 12b . . . divider;
13a and 13b . . . phase shifter circuit;
13a-1 to 13a-5 and 13b-1 to 13b-5 . . . phase shifter;
14a and 14b . . . attenuator circuit;
14a-1 to 14a-5 and 14b-1 to 14b-5 . . . attenuator;
20a and 20b . . . network analyzer;
21a and 21b . . . receiver;
22a . . . signal generator;
40 . . . divider;
50a and 50b . . . scatterer antenna group;
50a-1 to 50a-5 and 50b-1 to 50b-5 . . . scatterer antenna;
60a, 60b, 60av, 60ah, 60as, 60at, 60a1 and 60a2 . . . calibration receiving antenna;
72 . . . amplitude and phase adjustment circuit;
73 . . . phase shifter;
74 and 84 . . . attenuator;
80 . . . rotating table;
90 . . . delay circuit;
91 . . . fading circuit;
101 . . . scatterer antenna support base;
102 . . . receiving antenna support base;
200A, 200B, 200C, 200D, 200E, 200F, 200G, 200H, 200I and 200J . . . multiple wave controlling and measuring apparatus; and
SW and SW1 to SW5 . . . switch.

The invention claimed is:
1. An antenna evaluation apparatus, comprising:
a first scatterer antenna group including a plurality of N scatterer antennas provided at predetermined positions different from each other, respectively;
a signal generator for generating a predetermined transmitting signal;
a first transmitter for dividing the transmitting signal into a plurality of N transmitting signals, changing a phase and an amplitude of each of divided transmitting signals by a predetermined amplitude change amount and a predetermined phase shift amount, respectively, and radiating changed transmitting signals as radio waves from the scatterer antennas corresponding to the changed transmitting signals, respectively;
a receiver for receiving a multiple wave of radiated radio waves as a received signal by using a receiving antenna under evaluation and placed substantially at a center of the respective positions, and measuring an amplitude and a phase of the received signal relative to the transmitting signal; and
a controller for evaluating a performance of the receiving antenna under evaluation based on measured amplitude and measured phase of the received signal,
wherein the controller controls the first transmitter to radiate the radio waves solely from the respective scatterer antennas,
based on the radio waves radiated solely from the respective scatterer antennas, the controller executes calibration to control the first transmitter so that (i) the amplitudes of received signals, which are each measured by using a calibration receiving antenna instead of the receiving antenna under evaluation, coincide with an identical target amplitude and (ii) the phases of the received signals, which are each measured by using the calibration receiving antenna instead of the receiving antenna under evaluation, coincide with an identical target phase, and stores amplitude change amounts and phase shift amounts for use in the first transmitter for the respective scatterer antennas into a storage unit,
based on inputted amplitude difference values from the target amplitude and inputted phase difference values from the target phase, the controller calculates amplitude change amounts and phase shift amounts for the respective scatterer antennas that are to be set in the first transmitter, by adding the amplitude difference values and the phase difference values to stored amplitude change amounts and stored phase shift amounts for use in the first transmitter for the respective scatterer antennas, the inputted amplitude difference values and the inputted phase difference values corresponding to amplitudes and phases of the transmitting signals from the respective scatterer antennas for achieving a predetermined multiple wave propagation state,
the controller sets calculated amplitude change amounts and calculated phase shift amounts for the respective scatterer antennas in the first transmitter, and
the controller evaluates the performance of the receiving antenna under evaluation by receiving and measuring the amplitude and the phase of the received signal received by the receiver using the receiving antenna under evaluation, when the transmitting signals are simultaneously transmitted from the scatterer antennas,
wherein the antenna evaluation apparatus further comprises a delay circuit connected to the signal generator, the delay circuit being configured to delay the transmitting signal generated by the signal generator by a predetermined delay time, and
wherein the controller sets the delay time to a predetermined value when the controller executes the calibration.

2. The antenna evaluation apparatus as claimed in claim 1,
wherein the controller evaluates a performance of first and second receiving antennas under evaluation using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration,
wherein the antenna evaluation apparatus further comprises:
an amplitude adjustment circuit inserted between one of the first receiving antenna under evaluation and the first calibration receiving antenna, and the receiver, the amplitude adjustment circuit changing the amplitude of the received signal and outputting a resulting signal to the receiver;
an amplitude and phase adjustment circuit for receiving another received signal by using one of the second receiving antenna under evaluation and the second calibration receiving antenna, changing an amplitude and a phase of the other received signal, and outputting a resulting signal; and
another receiver for receiving the other received signal from the amplitude and phase adjustment circuit, and measuring the amplitude and the phase of the other received signal relative to the transmitting signal, and
wherein the controller controls the first transmitter to radiate the radio waves solely from the respective scatterer antennas,
based on the radio waves radiated solely from the respective scatterer antennas, the controller controls the receiver and the other receiver to measure (i) the amplitudes of received signals, which are each measured by using the first calibration receiving antenna, and (ii) an amplitude average value of the amplitudes of other received signals, which are each measured by using the second calibration receiving antenna, respectively,
the controller controls the amplitude adjustment circuit and the amplitude and phase adjustment circuit so that (i) the amplitudes of the received signals, which are each measured by using the first calibration receiving antenna, and (ii) the amplitude average value of the other received signals, which are each measured by using the second calibration receiving antenna, coincide with each other,
thereafter, the controller controls the receiver and the other receiver to measure (i) the phases of the received signals, which are each measured by using the first calibration receiving antenna and (ii) a phase average value of the phases of the other received signals, which are each measured by using the second calibration receiving antenna, respectively, and
the controller controls the amplitude and phase adjustment circuit so that the phases of the received signals, which are each measured by using the first calibration receiving antenna, and (ii) the phase average value of the phases of the further received signals, which are each measured by using the second calibration receiving antenna, coincide with each other.

3. The antenna evaluation apparatus as claimed in claim 1, wherein the calibration receiving antenna has a omni-directional directional pattern.

4. The antenna evaluation apparatus as claimed in claim 1, further comprising a rotating table on which the calibration receiving antenna is placed,
wherein the controller rotates the rotating table so as to direct a main beam of the calibration receiving antenna substantially toward each of the scatterer antennas when the controller receives the radio waves, which are radiated solely from the respective scatterer antennas, by using the calibration receiving antenna.

5. The antenna evaluation apparatus as claimed in claim 1, further comprising a rotating table on which the calibration receiving antenna is placed,
wherein the controller rotates the rotating table so that an cross-polarization discrimination of the calibration receiving antenna becomes maximum when the controller receives the radio waves, which are radiated solely from the respective scatterer antennas, by using the calibration receiving antenna.

6. The antenna evaluation apparatus as claimed in claim 1, further comprising a rotating table on which the calibration receiving antenna is placed,
wherein, when the controller receives the radio waves, which are radiated solely from the respective scatterer antennas, by using the calibration receiving antenna, the controller rotates the calibration receiving antenna by one turn by repetitively rotating the rotating table by a predetermined angle, measures an amplitude average value and a phase average value of received signals for the respective angles, and uses the amplitude average value and the phase average value as the measured amplitude and the measured phase.

7. The antenna evaluation apparatus as claimed in claim 1,
wherein the first scatterer antenna group radiates vertically polarized radio waves,
wherein the first transmitter is provided for the first scatterer antenna group,
wherein the antenna evaluation apparatus further comprises:
a second scatterer antenna group having a configuration the same as a configuration of the first scatterer antenna group, the second scatterer antenna group radiating horizontally polarized radio waves; and
a second transmitter provided for the second scatterer antenna group, and having a configuration the same as a configuration of the first transmitter,
wherein the calibration receiving antenna, which is used by the controller to execute the calibration to control the first transmitter, is a calibration receiving antenna for receiving the vertically polarized radio waves, and
wherein the controller executes calibration to control the second transmitter using a calibration receiving antenna for receiving the horizontally polarized radio waves, the calibration to control the second transmitter being the same as the calibration to control the first transmitter.

8. The antenna evaluation apparatus as claimed in claim 7, further comprising a switch for selectively connecting one of the calibration receiving antenna for receiving the vertically polarized radio waves and the calibration receiving antenna for receiving the horizontally polarized radio waves to the receiver.

9. The antenna evaluation apparatus as claimed in claim 8,
wherein the receiver uses a calibration receiving antenna for receiving the radio waves of the vertically polarized waves and horizontally polarized waves as the calibration receiving antenna for receiving the vertically polarized radio waves and the calibration receiving antenna for receiving the horizontally polarized radio waves.

10. An antenna evaluation apparatus, comprising:
a first scatterer antenna group including a plurality of N scatterer antennas provided at predetermined positions different from each other, respectively;
a signal generator for generating a predetermined transmitting signal;
a first transmitter for dividing the transmitting signal into a plurality of N transmitting signals, changing a phase and an amplitude of each of divided transmitting signals by a predetermined amplitude change amount and a predetermined phase shift amount, respectively, and radiating changed transmitting signals as radio waves from the scatterer antennas corresponding to the changed transmitting signals, respectively;
a receiver for receiving a multiple wave of radiated radio waves as a received signal by using a receiving antenna under evaluation and placed substantially at a center of the respective positions, and measuring an amplitude and a phase of the received signal relative to the transmitting signal; and
a controller for evaluating a performance of the receiving antenna under evaluation based on measured amplitude and measured phase of the received signal,
wherein the controller controls the first transmitter to radiate the radio waves solely from the respective scatterer antennas,
based on the radio waves radiated solely from the respective scatterer antennas, the controller executes calibration to control the first transmitter so that (i) the amplitudes of received signals, which are each measured by using a calibration receiving antenna instead of the receiving antenna under evaluation, coincide with an identical target amplitude and (ii) the phases of the received signals, which are each measured by using the calibration receiving antenna instead of the receiving antenna under evaluation, coincide with an identical target phase, and stores amplitude change amounts and phase shift amounts for use in the first transmitter for the respective scatterer antennas into a storage unit,
based on inputted amplitude difference values from the target amplitude and inputted phase difference values from the target phase, the controller calculates amplitude change amounts and phase shift amounts for the respective scatterer antennas that are to be set in the first transmitter, by adding the amplitude difference values and the phase difference values to stored amplitude change amounts and stored phase shift amounts for use in the first transmitter for the respective scatterer antennas, the inputted amplitude difference values and the inputted phase difference values corresponding to amplitudes and phases of the transmitting signals from the respective scatterer antennas for achieving a predetermined multiple wave propagation state,
the controller sets calculated amplitude change amounts and calculated phase shift amounts for the respective scatterer antennas in the first transmitter, and
the controller evaluates the performance of the receiving antenna under evaluation by receiving and measuring the amplitude and the phase of the received signal received by the receiver using the receiving antenna under evaluation, when the transmitting signals are simultaneously transmitted from the scatterer antennas,
wherein the antenna evaluation apparatus further comprises a fading circuit for adding a predetermined delay time and a phase adjustment amount to the transmitting signal generated by the signal generator by using a plurality of predetermined parameters, and
wherein the controller sets the parameters to predetermined values, respectively, when the controller executes the calibration.

11. The antenna evaluation apparatus as claimed in claim 10,
wherein the controller for evaluating a performance of first and second receiving antennas under evaluation using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration,
wherein the antenna evaluation apparatus further comprises:
an amplitude adjustment circuit inserted between one of the first receiving antenna under evaluation and the first calibration receiving antenna, and the receiver, the amplitude adjustment circuit changing the amplitude of the received signal and outputting a resulting signal to the receiver;
an amplitude and phase adjustment circuit for receiving another received signal by using one of the second receiving antenna under evaluation and the second calibration receiving antenna, changing an amplitude and a phase of the other received signal, and outputting a resulting signal; and
another receiver for receiving the other received signal from the amplitude and phase adjustment circuit, and measuring the amplitude and the phase of the other received signal relative to the transmitting signal, and
wherein the controller controls the first transmitter to radiate the radio waves solely from the respective scatterer antennas,
based on the radio waves radiated solely from the respective scatterer antennas, the controller controls the receiver and the other receiver to measure (i) the amplitudes of received signals, which are each measured by using the first calibration receiving antenna, and (ii) an amplitude average value of the amplitudes of other received signals, which are each measured by using the second calibration receiving antenna, respectively,
the controller controls the amplitude adjustment circuit and the amplitude and phase adjustment circuit so that (i) the amplitudes of the received signals, which are each measured by using the first calibration receiving antenna,. and the amplitude average value of the other received signals each measured by using the second calibration receiving antenna, coincide with each other,
thereafter, the controller controls the receiver and the other receiver to (i) measure the phases of the received signals, which are each measured by using the first calibration receiving antenna,. and a phase average value of the phases of the other received signals, which are each measured by using the second calibration receiving antenna, respectively, and
the controller controls the amplitude and phase adjustment circuit so that (i) the phases of the received signals, which are each measured by using the first calibration receiving antenna, and (ii) the phase average value of the phases of the other received signals, which are each measured by using the second calibration receiving antenna, coincide with each other.

12. The antenna evaluation apparatus as claimed in claim 10,
wherein the calibration receiving antenna has a omni-directional directional pattern.

13. The antenna evaluation apparatus as claimed in claim 10, further comprising a rotating table on which the calibration receiving antenna is placed,
wherein the controller rotates the rotating table so as to direct a main beam of the calibration receiving antenna substantially toward each of the scatterer antennas when the controller receives the radio waves, which are radiated solely from the respective scatterer antennas, by using the calibration receiving antenna.

14. The antenna evaluation apparatus as claimed in claim 10, further comprising a rotating table on which the calibration receiving antenna is placed,
wherein the controller rotates the rotating table so that an cross-polarization discrimination of the calibration receiving antenna becomes maximum when the controller receives the radio waves, which are radiated solely from the respective scatterer antennas, by using the calibration receiving antenna.

15. The antenna evaluation apparatus as claimed in claim 10, further comprising a rotating table on which the calibration receiving antenna is placed,
wherein, when the controller receives the radio waves, which are radiated solely from the respective scatterer antennas, by using the calibration receiving antenna, the controller rotates the calibration receiving antenna by one turn by repetitively rotating the rotating table by a predetermined angle, measures an amplitude average value and a phase average value of received signals for the respective angles, and uses the amplitude average value and the phase average value as the measured amplitude and the measured phase.

16. The antenna evaluation apparatus as claimed in claim 10,
wherein the first scatterer antenna group radiates vertically polarized radio waves,
wherein the first transmitter is provided for the first scatterer antenna group,
wherein the antenna evaluation apparatus further comprises:
a second scatterer antenna group having a configuration the same as a configuration of the first scatterer antenna group, the second scatterer antenna group radiating horizontally polarized radio waves; and
a second transmitter provided for the second scatterer antenna group, and having a configuration the same as a configuration of the first transmitter,
wherein the calibration receiving antenna, which is used by the controller to execute the calibration to control the first transmitter, is a calibration receiving antenna for receiving the vertically polarized radio waves, and
wherein the controller executes calibration to control the second transmitter using a calibration receiving antenna for receiving the horizontally polarized radio waves, the calibration to control the second transmitter being the same as the calibration to control the first transmitter.

17. The antenna evaluation apparatus as claimed in claim 16, further comprising a switch for selectively connecting one of the calibration receiving antenna for receiving the vertically polarized radio waves and the calibration receiving antenna for receiving the horizontally polarized radio waves to the receiver.

18. The antenna evaluation apparatus as claimed in claim 17,
wherein the receiver uses a calibration receiving antenna for receiving the radio waves of the vertically polarized waves and horizontally polarized waves as the calibration receiving antenna for receiving the vertically polarized radio waves and the calibration receiving antenna for receiving the horizontally polarized radio waves.

19. An antenna evaluation method using an antenna evaluation apparatus,
wherein the antenna evaluation apparatus comprises:
a first scatterer antenna group including a plurality of N scatterer antennas provided at predetermined positions different from each other, respectively;
a signal generator for generating a predetermined transmitting signal;
a first transmitter for dividing the transmitting signal into a plurality of N transmitting signals, changing a phase and an amplitude of each of divided transmitting signals by a predetermined amplitude change amount and a predetermined phase shift amount, respectively, and radiating changed transmitting signals as radio waves from the scatterer antennas corresponding to the changed transmitting signals, respectively;
a receiver for receiving a multiple wave of radiated radio waves as a received signal by using a receiving antenna under evaluation and placed substantially at a center of the respective positions, and measuring an amplitude and a phase of the received signal relative to the transmitting signal; and
a controller for evaluating a performance of the receiving antenna under evaluation based on measured amplitude and measured phase of the received signal,
wherein the antenna evaluation method includes a control step which is executed by the controller, the control step including the following steps of:
controlling the first transmitter to radiate the radio waves solely from the respective scatterer antennas,
based on the radio waves radiated solely from the respective scatterer antennas, executing calibration to control the first transmitter so that (i) the amplitudes of received signals, which are each measured by using a calibration receiving antenna instead of the receiving antenna under evaluation, coincide with an identical target amplitude and (ii) the phases of the received signals, which are each measured by using the calibration receiving antenna instead of the receiving antenna under evaluation, coincide with an identical target phase, and storing amplitude change amounts and phase shift amounts for use in the first transmitter for the respective scatterer antennas into a storage unit,
based on inputted amplitude difference values from the target amplitude and inputted phase difference values from the target phase, calculating amplitude change amounts and phase shift amounts for the respective scatterer antennas that are to be set in the first transmitter, by adding the amplitude difference values and the phase difference values to stored amplitude change amounts and stored phase shift amounts for use in the first transmitter for the respective scatterer antennas, the inputted amplitude difference values and the inputted phase difference values corresponding to amplitudes and phases of the transmitting signals from the respective scatterer antennas for achieving a predetermined multiple wave propagation state, setting calculated amplitude change amounts and calculated phase shift amounts for the respective scatterer antennas in the first transmitter, and evaluating the performance of the receiving antenna under evaluation by receiving and measuring the amplitude and the phase of the received signal received by the receiver using the receiving antenna under evaluation, when the transmitting signals are simultaneously transmitted from the scatterer antennas, wherein the antenna evaluation apparatus further comprises a delay circuit connected to the signal generator, the delay circuit being configured to delay the transmitting signal generated by the signal generator by a predetermined delay time, and wherein the control step includes a step of setting the delay time to a predetermined value when executing the calibration.

20. The antenna evaluation method as claimed in claim 19,
wherein the control step further includes a step of evaluating a performance of first and second receiving antennas under evaluation using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration, wherein the antenna evaluation apparatus further comprises:

an amplitude adjustment circuit inserted between one of the first receiving antenna under evaluation and the first calibration receiving antenna, and the receiver, amplitude adjustment circuit changing the amplitude of the received signal and outputting a resulting signal to the receiver;

an amplitude and phase adjustment circuit for receiving another received signal by using one of the second receiving antenna under evaluation and the second calibration receiving antenna, changing an amplitude and a phase of the other received signal, and outputting a resulting signal; and another receiver for receiving the other received signal from the amplitude and phase adjustment circuit, and measuring the amplitude and the phase of the other received signal relative to the transmitting signal, and wherein the control step further includes the following steps of:

controlling the first transmitter to radiate the radio waves solely from the respective scatterer antennas, based on the radio waves radiated solely from the respective scatterer antennas, controlling the receiver and the other receiver to measure (i) the amplitudes of received signals, which are each measured by using the first calibration receiving antenna, and (ii) an amplitude average value of the amplitudes of other received signals, which are each measured by using the second calibration receiving antenna, respectively, controlling the amplitude adjustment circuit and the amplitude and phase adjustment circuit so that (i) the amplitudes of the received signals, which are each measured by using the first calibration receiving antenna, and (ii) the amplitude average value of the other received signals, which are each measured by using the second calibration receiving antenna, coincide with each other, thereafter, controlling the receiver and the other receiver to measure (i) the phases of the received signals, which are each measured by using the first calibration receiving antenna, and (ii) a phase average value of the phases of the other received signals, which are each measured by using the second calibration receiving antenna, respectively, and controlling the amplitude and phase adjustment circuit so that (i) the phases of the received signals, which are each measured by using the first calibration receiving antenna, and (ii) the phase average value of the phases of the other received signals, which are each measured by using the second calibration receiving antenna, coincide with each other.

21. The antenna evaluation method as claimed in claim 19,
wherein the first scatterer antenna group radiates vertically polarized radio waves, wherein the first transmitter is provided for the first scatterer antenna group, wherein the antenna evaluation apparatus further comprises:

a second scatterer antenna group having a configuration the same as a configuration of the first scatterer antenna group, the second scatterer antenna group radiating horizontally polarized radio waves; and a second transmitter provided for the second scatterer antenna group, and having a configuration the same as a configuration of the first transmitter, wherein the calibration receiving antenna, which is used by the controller to execute the calibration to control the first transmitter, is a calibration receiving antenna for receiving the vertically polarized radio waves, and wherein the control step further includes a step of executing calibration to control the second transmitter using a calibration receiving antenna for receiving the horizontally polarized radio waves, the calibration to control the second transmitter being the same as the calibration to control the first transmitter.

22. The antenna evaluation method as claimed in claim 19,
wherein the first scatterer antenna group radiates vertically polarized radio waves, wherein the first transmitter is provided for the first scatterer antenna group, wherein the antenna evaluation apparatus further comprises:

a second scatterer antenna group having a configuration the same as a configuration of the first scatterer antenna group, the second scatterer antenna group radiating horizontally polarized radio waves; and a second transmitter provided for the second scatterer antenna group, and having a configuration the same as a configuration of the first transmitter, wherein the calibration receiving antenna, which is used by the controller to execute the calibration to control the first transmitter, is a calibration receiving antenna for receiving the vertically polarized radio waves, and wherein the control step further includes executing calibration to control the second transmitter using a calibration receiving antenna for receiving the horizontally polarized radio waves, the calibration to control the second transmitter being the same as the calibration to control the first transmitter.

23. An antenna evaluation method using an antenna evaluation apparatus, wherein the antenna evaluation apparatus comprises:
a first scatterer antenna group including a plurality of N scatterer antennas provided at predetermined positions different from each other, respectively;
a signal generator for generating a predetermined transmitting signal;
a first transmitter for dividing the transmitting signal into a plurality of N transmitting signals, changing a phase and an amplitude of each of divided transmitting signals by a predetermined amplitude change amount and a predetermined phase shift amount, respectively, and radiating changed transmitting signals as radio waves from the scatterer antennas corresponding to the changed transmitting signals, respectively;
a receiver for receiving a multiple wave of radiated radio waves as a received signal by using a receiving antenna under evaluation and placed substantially at a center of the respective positions, and measuring an amplitude and a phase of the received signal relative to the transmitting signal; and
a controller for evaluating a performance of the receiving antenna under evaluation based on measured amplitude and measured phase of the received signal,
wherein the antenna evaluation method includes a control step which is executed by the controller, the control step including the following steps of:
controlling the first transmitter to radiate the radio waves solely from the respective scatterer antennas,
based on the radio waves radiated solely from the respective scatterer antennas, executing calibration to control the first transmitter so that (i) the amplitudes of received signals, which are each measured by using a calibration receiving antenna instead of the receiving antenna under evaluation, coincide with an identical target amplitude and (ii) the phases of the received signals, which are each measured by using the calibration receiving antenna instead of the receiving antenna under evaluation, coincide with an identical target phase, and storing amplitude change amounts and phase shift amounts for use in the first transmitter for the respective scatterer antennas into a storage unit,
based on inputted amplitude difference values from the target amplitude and inputted phase difference values from the target phase, calculating amplitude change amounts and phase shift amounts for the respective scatterer antennas that are to be set in the first transmitter, by adding the amplitude difference values and the phase difference values to stored amplitude change amounts and stored phase shift amounts for use in the first transmitter for the respective scatterer antennas, the inputted amplitude difference values and the inputted phase difference values corresponding to amplitudes and phases of the transmitting signals from the respective scatterer antennas for achieving a predetermined multiple wave propagation state,
setting calculated amplitude change amounts and calculated phase shift amounts for the respective scatterer antennas in the first transmitter, and
evaluating the performance of the receiving antenna under evaluation by receiving and measuring the amplitude and the phase of the received signal received by the receiver using the receiving antenna under evaluation, when the transmitting signals are simultaneously transmitted from the scatterer antennas, wherein the antenna evaluation apparatus further comprises a fading circuit for adding a predetermined delay time and a phase adjustment amount to the transmitting signal generated by the signal generator by using a plurality of predetermined parameters, and
wherein the control step further includes a step of setting the parameters to predetermined values when executing the calibration.

24. The antenna evaluation method as claimed in claim 23,
wherein the control step further includes a step of evaluating a performance of first and second receiving antennas under evaluation, using first and second calibration receiving antennas, the first receiving antenna under evaluation, and the second receiving antenna under evaluation, the first and second calibration receiving antennas being provided substantially in proximity to the center of the respective positions so as to be away from each other by a quarter-wavelength during the calibration,
wherein the antenna evaluation apparatus further comprises:
an amplitude adjustment circuit inserted between one of the first receiving
antenna under evaluation and the first calibration receiving antenna, and the receiver, amplitude adjustment circuit changing the amplitude of the received signal and outputting a resulting signal to the receiver;
an amplitude and phase adjustment circuit for receiving another received signal by using one of the second receiving antenna under evaluation and the second calibration receiving antenna, changing an amplitude and a phase of the other received signal, and outputting a resulting signal; and
another receiver for receiving the other received signal from the amplitude and phase adjustment circuit, and measuring the amplitude and the phase of the other received signal relative to the transmitting signal, and
wherein the control step further includes the following steps of:
controlling the first transmitter to radiate the radio waves solely from the respective scatterer antennas,
based on the radio waves radiated solely from the respective scatterer antennas, controlling the receiver and the other receiver to measure (i) the amplitudes of received signals, which are each measured by using the first calibration receiving antenna, and (ii) an amplitude average value of the amplitudes of other received signals, which are each measured by using the second calibration receiving antenna, respectively,
controlling the amplitude adjustment circuit and the amplitude and phase adjustment circuit so that (i) the amplitudes of the received signals, which are each measured by using the first calibration receiving antenna, and (ii) the amplitude average value of the other received signals, which are each measured by using the second calibration receiving antenna, coincide with each other,
thereafter, controlling the receiver and the other receiver to measure (i) the phases of the received signals, which are each measured by using the first calibration receiving antenna and (ii) a phase average value of the phases of the other received signals, which are each measured by using the second calibration receiving antenna, respectively, and
controlling the amplitude and phase adjustment circuit so that (i) the phases of the received signals, which are each measured by using the first calibration receiving antenna,. and (ii) the phase average value of the phases of the other received signals, which are each measured by using the second calibration receiving antenna, coincide with each other.

* * * * *